(12) United States Patent
Endo et al.

(10) Patent No.: US 9,871,143 B2
(45) Date of Patent: Jan. 16, 2018

(54) SEMICONDUCTOR DEVICE AND MANUFACTURING METHOD THEREOF

(71) Applicant: Semiconductor Energy Laboratory Co., Ltd., Atsugi-shi, Kanagawa-ken (JP)

(72) Inventors: Yuta Endo, Kanagawa (JP); Kosei Noda, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/657,195

(22) Filed: Mar. 13, 2015

(65) Prior Publication Data
US 2015/0270402 A1 Sep. 24, 2015

(30) Foreign Application Priority Data
Mar. 18, 2014 (JP) .................................. 2014-054763

(51) Int. Cl.
*H01L 29/786* (2006.01)
*H01L 21/336* (2006.01)
(Continued)

(52) U.S. Cl.
CPC ...... *H01L 29/7869* (2013.01); *H01L 27/1218* (2013.01); *H01L 27/1225* (2013.01);
(Continued)

(58) Field of Classification Search
None
See application file for complete search history.

(56) References Cited

U.S. PATENT DOCUMENTS

| 5,731,856 A | 3/1998 | Kim et al. |
|---|---|---|
| 5,736,435 A | 4/1998 | Venkatesan et al. |

(Continued)

FOREIGN PATENT DOCUMENTS

| CN | 102714180 A | 10/2012 |
|---|---|---|
| EP | 1737044 A | 12/2006 |

(Continued)

OTHER PUBLICATIONS

International Search Report (Application No. PCT/IB2015/051533) dated Jun. 23, 2015.

(Continued)

*Primary Examiner* — Seahvosh Nikmanesh
*Assistant Examiner* — Xiaoming Liu
(74) *Attorney, Agent, or Firm* — Fish & Richardson P.C.

(57) ABSTRACT

A semiconductor device that is suitable for miniaturization. A method for manufacturing a semiconductor device includes the steps of forming a semiconductor, forming a first conductor over the semiconductor, performing a second process on the first conductor so as to form a conductor according to a first pattern, forming a first insulator over the conductor having the first pattern, forming an opening in the first insulator, performing a third process on the conductor having the first pattern in the opening so as to form a first electrode and a second electrode and to expose the semiconductor, forming a second insulator over the first insulator, an inner wall of the opening, and an exposed portion of the semiconductor, forming a second conductor over the second insulator, and performing a fourth process on the second conductor so as to form a third electrode.

30 Claims, 34 Drawing Sheets

(51) Int. Cl.
*H01L 29/41* (2006.01)
*H01L 27/12* (2006.01)
*H01L 29/66* (2006.01)

(52) U.S. Cl.
CPC ...... *H01L 27/1255* (2013.01); *H01L 27/1262* (2013.01); *H01L 29/66969* (2013.01)

(56) References Cited

U.S. PATENT DOCUMENTS

| | | | |
|---|---|---|---|
| 5,744,864 | A | 4/1998 | Cillessen et al. |
| 6,291,278 | B1 | 9/2001 | Xiang et al. |
| 6,294,274 | B1 | 9/2001 | Kawazoe et al. |
| 6,563,174 | B2 | 5/2003 | Kawasaki et al. |
| 6,673,683 | B1 | 1/2004 | Sheu et al. |
| 6,727,522 | B1 | 4/2004 | Kawasaki et al. |
| 6,841,831 | B2 | 1/2005 | Hanafi et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,101,762 | B2 | 9/2006 | Cohen et al. |
| 7,105,868 | B2 | 9/2006 | Nause et al. |
| 7,211,825 | B2 | 5/2007 | Shih et al |
| 7,282,782 | B2 | 10/2007 | Hoffman et al. |
| 7,297,977 | B2 | 11/2007 | Hoffman et al. |
| 7,323,356 | B2 | 1/2008 | Hosono et al. |
| 7,385,224 | B2 | 6/2008 | Ishii et al. |
| 7,402,506 | B2 | 7/2008 | Levy et al. |
| 7,411,209 | B2 | 8/2008 | Endo et al. |
| 7,453,065 | B2 | 11/2008 | Saito et al. |
| 7,453,087 | B2 | 11/2008 | Iwasaki |
| 7,462,862 | B2 | 12/2008 | Hoffman et al. |
| 7,468,304 | B2 | 12/2008 | Kaji et al. |
| 7,501,293 | B2 | 3/2009 | Ito et al. |
| 7,524,752 | B2 | 4/2009 | Tsutsue |
| 7,674,650 | B2 | 3/2010 | Akimoto et al. |
| 7,732,819 | B2 | 6/2010 | Akimoto et al. |
| 7,989,334 | B2 | 8/2011 | Tsutsue |
| 8,372,198 | B2 | 2/2013 | Seo et al. |
| 8,389,417 | B2 | 3/2013 | Yamazaki et al. |
| 8,432,187 | B2 | 4/2013 | Kato et al. |
| 8,779,479 | B2 | 7/2014 | Yamazaki et al. |
| 8,809,853 | B2 | 8/2014 | Saito et al. |
| 8,916,868 | B2 | 12/2014 | Isobe et al. |
| 8,994,400 | B2 | 3/2015 | Kato et al. |
| 2001/0046027 | A1 | 11/2001 | Tai et al. |
| 2002/0056838 | A1 | 5/2002 | Ogawa |
| 2002/0132454 | A1 | 9/2002 | Ohtsu et al. |
| 2003/0189401 | A1 | 10/2003 | Kido et al. |
| 2003/0218222 | A1 | 11/2003 | Wager, III et al. |
| 2004/0038446 | A1 | 2/2004 | Takeda et al. |
| 2004/0127038 | A1 | 7/2004 | Carcia et al. |
| 2005/0017302 | A1 | 1/2005 | Hoffman |
| 2005/0199959 | A1 | 9/2005 | Chiang et al. |
| 2006/0035452 | A1 | 2/2006 | Carcia et al. |
| 2006/0043377 | A1 | 3/2006 | Hoffman et al. |
| 2006/0091793 | A1 | 5/2006 | Baude et al. |
| 2006/0108529 | A1 | 5/2006 | Saito et al. |
| 2006/0108636 | A1 | 5/2006 | Sano et al. |
| 2006/0110867 | A1 | 5/2006 | Yabuta et al. |
| 2006/0113536 | A1 | 6/2006 | Kumomi et al. |
| 2006/0113539 | A1 | 6/2006 | Sano et al. |
| 2006/0113549 | A1 | 6/2006 | Den et al. |
| 2006/0113565 | A1 | 6/2006 | Abe et al. |
| 2006/0169973 | A1 | 8/2006 | Isa et al. |
| 2006/0170111 | A1 | 8/2006 | Isa et al. |
| 2006/0197092 | A1 | 9/2006 | Hoffman et al. |
| 2006/0208977 | A1 | 9/2006 | Kimura |
| 2006/0228974 | A1 | 10/2006 | Thelss et al. |
| 2006/0231882 | A1 | 10/2006 | Kim et al. |
| 2006/0238135 | A1 | 10/2006 | Kimura |
| 2006/0244107 | A1 | 11/2006 | Sugihara et al. |
| 2006/0284171 | A1 | 12/2006 | Levy et al. |
| 2006/0284172 | A1 | 12/2006 | Ishii |
| 2006/0292777 | A1 | 12/2006 | Dunbar |
| 2007/0024187 | A1 | 2/2007 | Shin et al. |
| 2007/0046191 | A1 | 3/2007 | Saito |
| 2007/0052025 | A1 | 3/2007 | Yabuta |
| 2007/0054507 | A1 | 3/2007 | Kaji et al. |
| 2007/0072439 | A1 | 3/2007 | Akimoto et al. |
| 2007/0090365 | A1 | 4/2007 | Hayashi et al. |
| 2007/0108446 | A1 | 5/2007 | Akimoto |
| 2007/0152217 | A1 | 7/2007 | Lai et al. |
| 2007/0172591 | A1 | 7/2007 | Seo et al. |
| 2007/0187678 | A1 | 8/2007 | Hirao et al. |
| 2007/0187760 | A1 | 8/2007 | Furuta et al. |
| 2007/0194379 | A1 | 8/2007 | Hosono et al. |
| 2007/0252928 | A1 | 11/2007 | Ito et al. |
| 2007/0272922 | A1 | 11/2007 | Kim et al. |
| 2007/0287296 | A1 | 12/2007 | Chang |
| 2008/0006877 | A1 | 1/2008 | Mardilovich et al. |
| 2008/0038882 | A1 | 2/2008 | Takechi et al. |
| 2008/0038929 | A1 | 2/2008 | Chang |
| 2008/0050595 | A1 | 2/2008 | Nakagawara et al. |
| 2008/0073653 | A1 | 3/2008 | Iwasaki |
| 2008/0083950 | A1 | 4/2008 | Pan et al. |
| 2008/0106191 | A1 | 5/2008 | Kawase |
| 2008/0128689 | A1 | 6/2008 | Lee et al. |
| 2008/0129195 | A1 | 6/2008 | Ishizaki et al. |
| 2008/0166834 | A1 | 7/2008 | Kim et al. |
| 2008/0182358 | A1 | 7/2008 | Cowdery-Corvan et al. |
| 2008/0224133 | A1 | 9/2008 | Park et al. |
| 2008/0254569 | A1 | 10/2008 | Hoffman et al. |
| 2008/0258139 | A1 | 10/2008 | Ito et al. |
| 2008/0258140 | A1 | 10/2008 | Lee et al. |
| 2008/0258141 | A1 | 10/2008 | Park et al. |
| 2008/0258143 | A1 | 10/2008 | Kim et al. |
| 2008/0296568 | A1 | 12/2008 | Ryu et al. |
| 2009/0068773 | A1 | 3/2009 | Lai et al. |
| 2009/0073325 | A1 | 3/2009 | Kuwabara et al. |
| 2009/0114910 | A1 | 5/2009 | Chang |
| 2009/0134399 | A1 | 5/2009 | Sakakura et al. |
| 2009/0152506 | A1 | 6/2009 | Umeda et al. |
| 2009/0152541 | A1 | 6/2009 | Maekawa et al. |
| 2009/0278122 | A1 | 11/2009 | Hosono et al. |
| 2009/0280600 | A1 | 11/2009 | Hosono et al. |
| 2010/0065844 | A1 | 3/2010 | Tokunaga |
| 2010/0092800 | A1 | 4/2010 | Itagaki et al. |
| 2010/0109002 | A1 | 5/2010 | Itagaki et al. |
| 2011/0101331 | A1* | 5/2011 | Yamazaki ............... H01L 21/84 257/43 |
| 2011/0114945 | A1 | 5/2011 | Yamazaki et al. |
| 2011/0133177 | A1* | 6/2011 | Suzawa ............... H01L 27/1225 257/43 |
| 2011/0187410 | A1 | 8/2011 | Kato et al. |
| 2012/0261734 | A1* | 10/2012 | Saito ...................... H01L 21/84 257/296 |
| 2014/0312346 | A1 | 10/2014 | Yamazaki et al. |
| 2015/0187898 | A1 | 7/2015 | Miyairi |
| 2015/0280013 | A1 | 10/2015 | Yamazaki et al. |

FOREIGN PATENT DOCUMENTS

| | | |
|---|---|---|
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-096055 | 4/2007 |
| JP | 2007-123861 | 5/2007 |

(56) References Cited

FOREIGN PATENT DOCUMENTS

| | | |
|---|---|---|
| JP | 2011-124557 A | 6/2011 |
| JP | 2011-142621 A | 7/2011 |
| KR | 2012-0091450 A | 8/2012 |
| TW | 201135913 | 10/2011 |
| TW | 201140581 | 11/2011 |
| WO | WO-2004/114391 | 12/2004 |
| WO | WO-2011/058913 | 5/2011 |
| WO | WO-2011/070905 | 6/2011 |

OTHER PUBLICATIONS

Written Opinion (Application No. PCT/IB2015/051533) dated Jun. 23, 2015.
Asakuma.N. et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.
Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.
Cho.D et al., "21.2:AL and SN-Doped Zinc Indium Oxide Thin Film Transistors for AMOLED Back-Plane", SID Digest '09 : SID International Symposium Digest of Technical Papers, May 31, 2009, pp. 280-283.
Clark.S et al., "First Principles Methods Using CASTEP", Zeitschrift fur Kristallographie, 2005, vol. 220, pp. 567-570.
Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.
Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.
Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.
Fortunato.E et al., "Wide-Bandgap High-Mobility ZNO Thin-Film Transistors Produced At Room Temperature", Appl. Phys. Lett. (Applied Physics Letters) , Sep. 27, 2004, vol. 85, No. 13, pp. 2541-2543.
Fung.T et al., "2-D Numerical Simulation of High Performance Amorphous In-Ga-Zn-O TFTs for Flat Panel Displays", AM-FPD '08 Digest of Technical Papers, Jul. 2, 2008, pp. 251-252, The Japan Society of Applied Physics.
Godo.H et al., "P-9:Numerical Analysis on Temperature Dependence of Characteristics of Amorphous In-Ga-Zn-Oxide TFT", SID Digest '09 : SID International Symposium Digest of Technical Papers, May 31, 2009, pp. 1110-1112.
Godo.H et al., "Temperature Dependence of Characteristics and Electronic Structure for Amorphous In-Ga-Zn-Oxide TFT", AM-FPD '09 Digest of Technical Papers, Jul. 1, 2009, pp. 41-44.
Hayashi.R et al., "42.1: Invited Paper: Improved Amorphous In-Ga-Zn-O TFTS", SID Digest '08 : SID International Symposium Digest of Technical Papers, May 20, 2008, vol. 39, pp. 621-624.
Hirao.T et al., "Novel Top-Gate Zinc Oxide Thin-Film Transistors (ZNO TFTS) for AMLCDS", J. Soc. Inf. Display (Journal of the Society for Information Display), 2007, vol. 15, No. 1, pp. 17. 22.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Ikeda.T et al., "Full-Functional System Liquid Crystal Display Using CG-Silicon Technology", SID Digest '04 : SID International Symposium Digest of Technical Papers, 2004, vol. 35, pp. 860-863.
Janotti.A et al., "Native Point Defects in ZnO", Phys. Rev. B (Physical Review. B), Oct. 4, 2007, vol. 76, No. 16, pp. 165202-1-165202-22.
Janotti.A et al., "Oxygen Vacancies in ZnO", Appl. Phys. Lett. (Applied Physics Letters) , 2005, vol. 87, pp. 122102-1-122102-3.
Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.
Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.
Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Kikuchi.H et al., "Polymer-Stabilized Liquid Crystal Blue Phases", Nature Materials, Sep. 2, 2002, vol. 1, pp. 64-68.
Kim.S et al., "High-Performance oxide thin film transistors passivated by various gas plasmas", 214th ECS Meeting, 2008, No. 2317, ECS.
Kimizuka.N. et al., "Spinel,YBFE2O4, and YB2FE3O7 Types of Structures for Compounds in the IN2O3 and SC2O3-A2O3-BO Systems [A; Fe, Ga, or Al; B: Mg, Mn, Fe, Ni, Cu,or Zn] at Temperatures over 1000°C", Journal of Solid State Chemistry, 1985, vol. 60, pp. 382-384.
Kimizuka.N. et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3-ZnGa2O4-ZnO System", Journal of Solid State Chemistry, Apr. 1, 1995, vol. 116, No. 1, pp. 170-178.
Kitzerow.H et al., "Observation of Blue Phases in Chiral Networks", Liquid Crystals, 1993, vol. 14, No. 3, pp. 911-916.
Kurokawa.Y et al., "UHF RFCPUS on Flexible and Glass Substrates for Secure RFID Systems", Journal of Solid-State Circuits, 2008, vol. 43, No. 1, pp. 292-299.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Lee.H et al., "Current Status of, Challenges to, and Perspective View of AM-OLED ", IDW '06 : Proceedings of the 13th International Display Workshops, Dec. 7, 2006, pp. 663-666.
Lee.J et al., "World'S Largest (15-Inch) XGA AMLCD Panel Using IGZO Oxide TFT", SID Digest '08 : SID International Symposium Digest of Technical Papers, May 20, 2008, vol. 39, pp. 625-628.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.

(56) References Cited

OTHER PUBLICATIONS

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "SUFTLA Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M et al., "The phase relations in the $In_2O_3$-$Ga_2ZnO_4$-ZnO system at 1350°C", Journal of Solid State Chemistry, Aug. 1, 1991, vol. 93, No. 2, pp. 298-315.

Nakamura.M, "Synthesis of Homologous Compound with New Long-Period Structure", NIRIM Newsletter, Mar. 1, 1995, vol. 150, pp. 1-4.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Nomura.K et al., "Carrier transport in transparent oxide semiconductor with intrinsic structural randomness probed using single-crystalline $InGaO_3(ZnO)_5$ films", Appl. Phys. Lett. (Applied Physics Letters), Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZNO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 IN. QVGA AMOLED Display Using In-Ga-Zn-Oxide TFTS With a Novel Passivation Layer", SID Digest '09 : SID International Symposium Digest of Technical Papers, May 31, 2009, pp. 284-287.

Ohara.H et al., "Amorphous In-Ga-Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide $InGaO_3(ZnO)_m$ (m<4):a Zn4s conductor", Philosophical Magazine, 2001, vol. 81, No. 5, pp. 501-515.

Orita.M et al., "Mechanism of Electrical Conductivity of Transparent $InGaZnO_4$", Phys. Rev. B (Physical Review. B), Jan. 15, 2000, vol. 61, No. 3, pp. 1811-1816.

Osada.T et al., "15.2: Development of Driver-Integrated Panel using Amorphous In-Ga-Zn-Oxide TFT", SID Digest '09 : SID International Symposium Digest of Technical Papers, May 31, 2009, pp. 184-187.

Osada.T et al., "Development of Driver-Integrated Panel Using Amorphous In-Ga-Zn-Oxide TFT", AM-FPD '09 Digest of Technical Papers, Jul. 1, 2009, pp. 33-36.

Park.J et al., "Amorphous Indium-Gallium-Zinc Oxide TFTS and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.S et al., "Challenge to Future Displays: Transparent AM-OLED Driven by Peald Grown ZNO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-In. AMOLED Display With Driver Circuit Using Amorphous In-Ga-Zn-Oxide TFTS", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO ($Ga_2O_3$-$In_2O_3$-ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Ueno.K et al., "Field-Effect Transistor on $SrTiO_3$ With Sputtered $Al_2O_3$ Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Munzenrieder et al., "Flexible Self-Aligned Double-Gate IGZO TFT", IEEE Electron Device Letters, vol. 35, No. 1, pp. 69-71, Jan. 2014.

\* cited by examiner

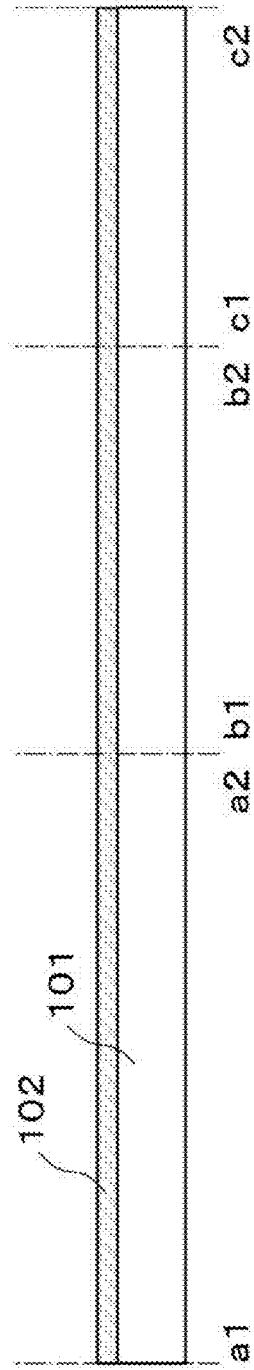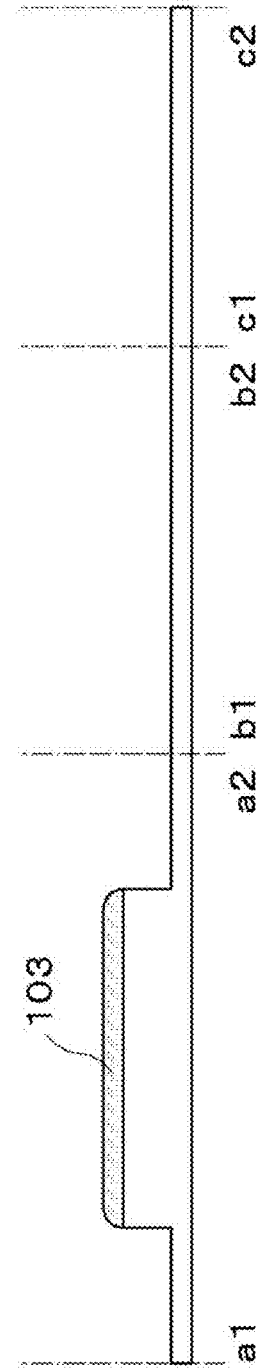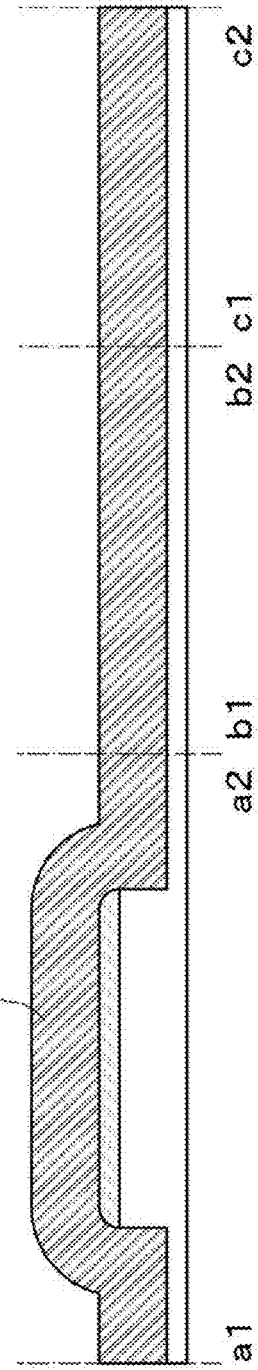

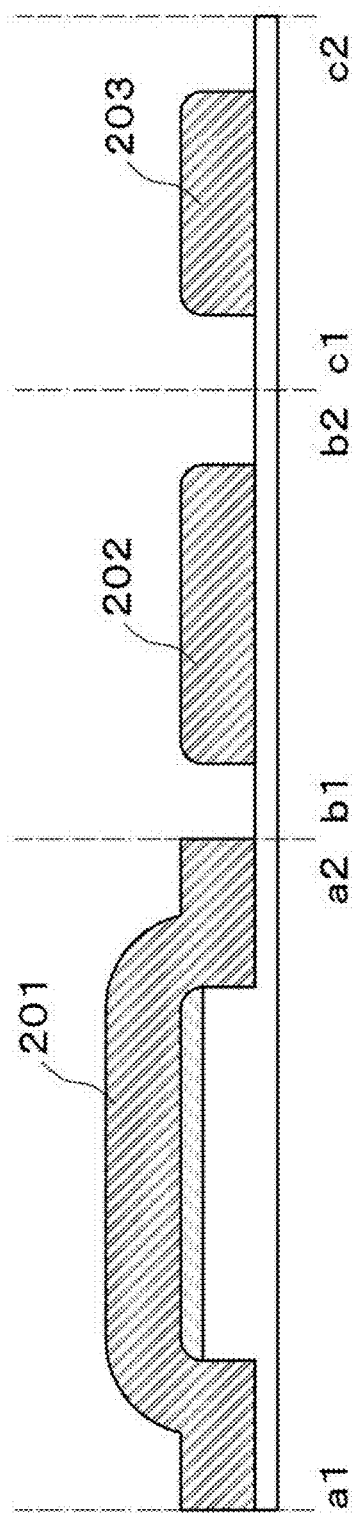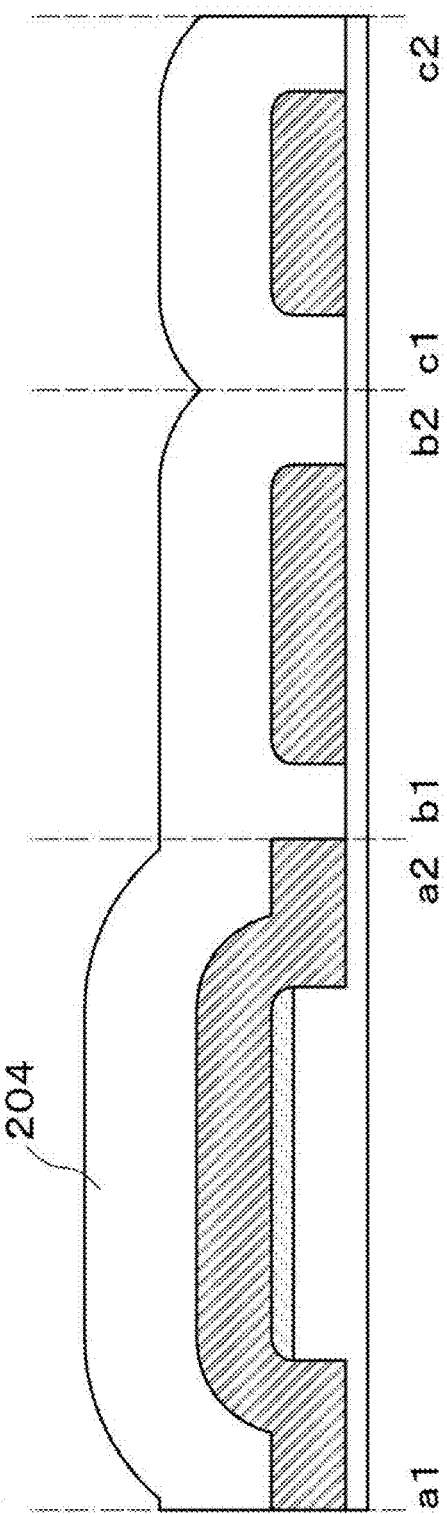
FIG. 2A
FIG. 2B

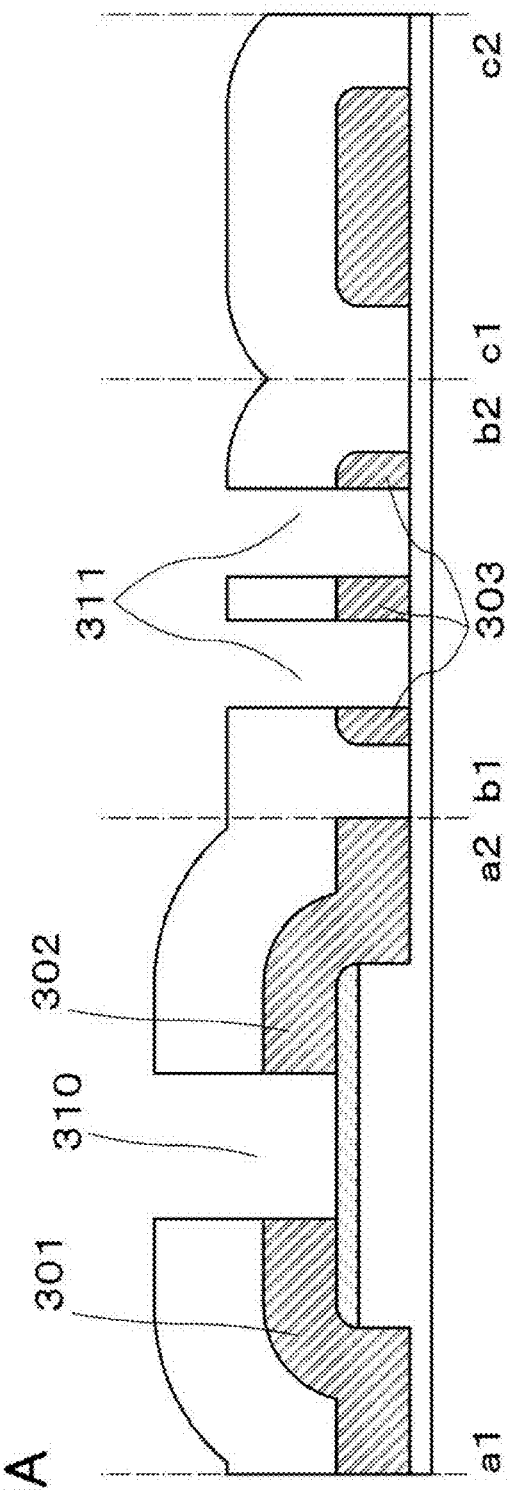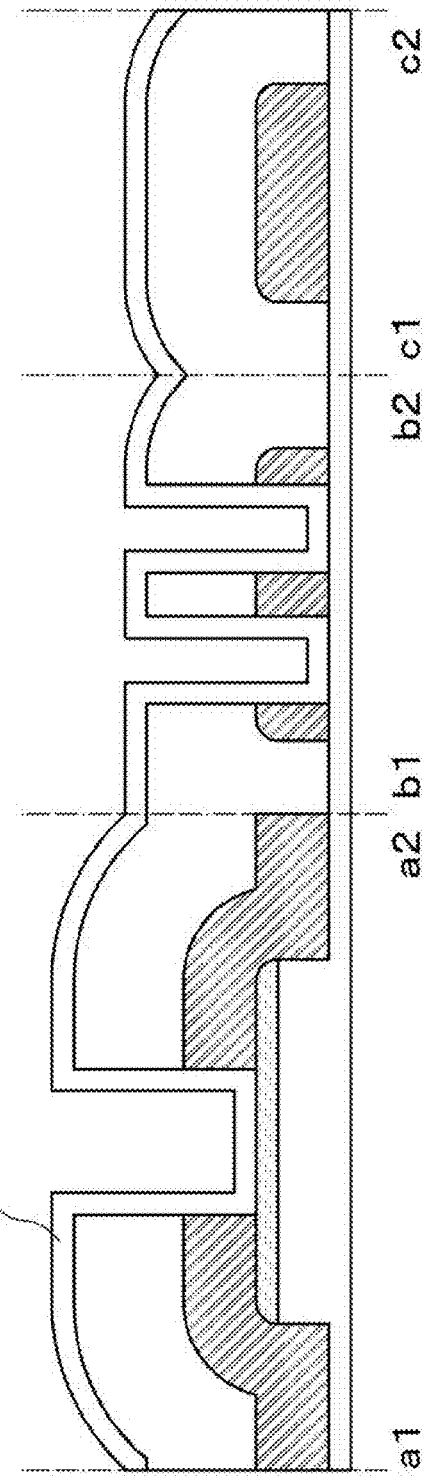

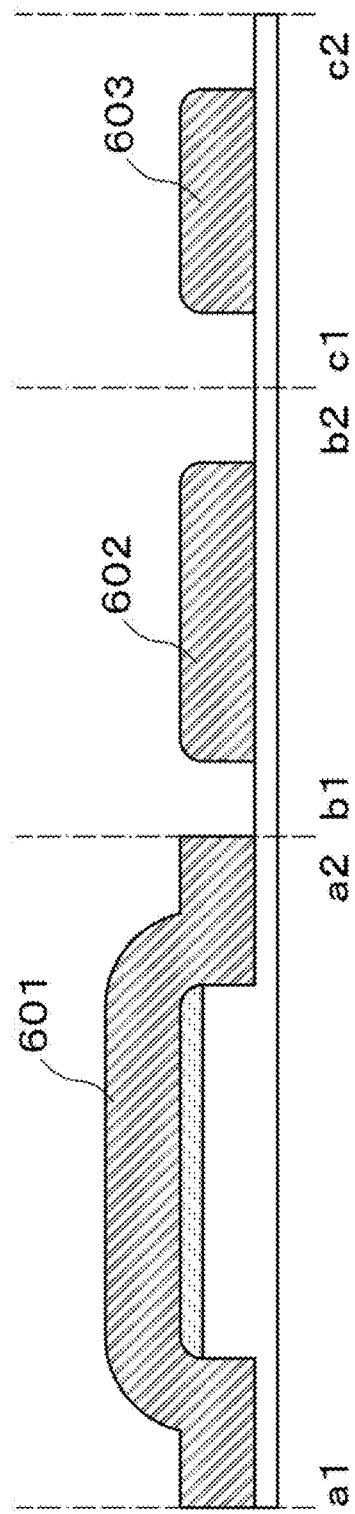
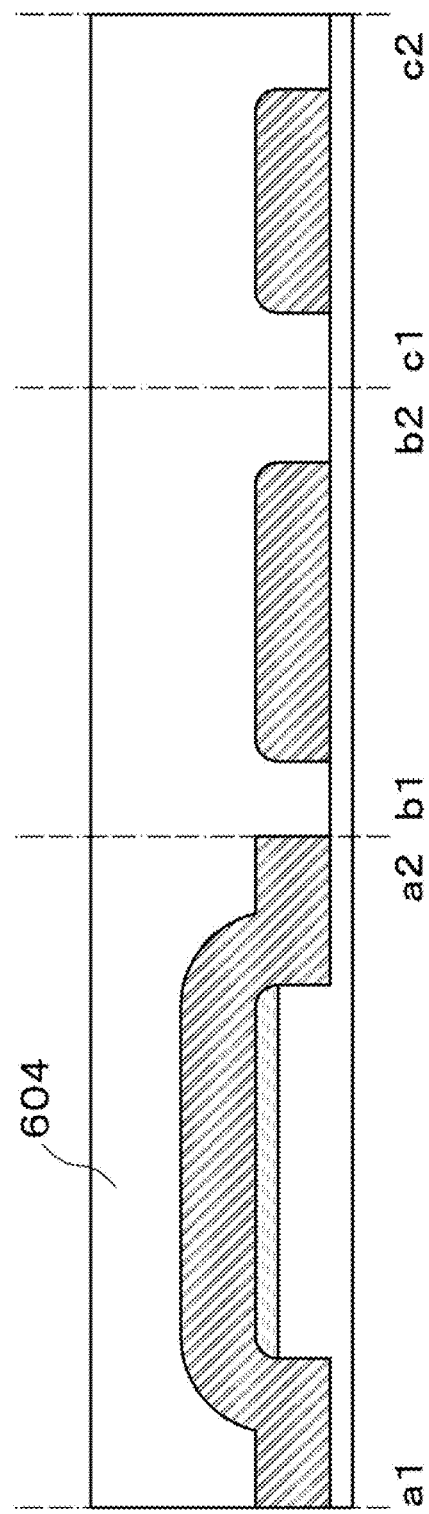
FIG. 6A
FIG. 6B

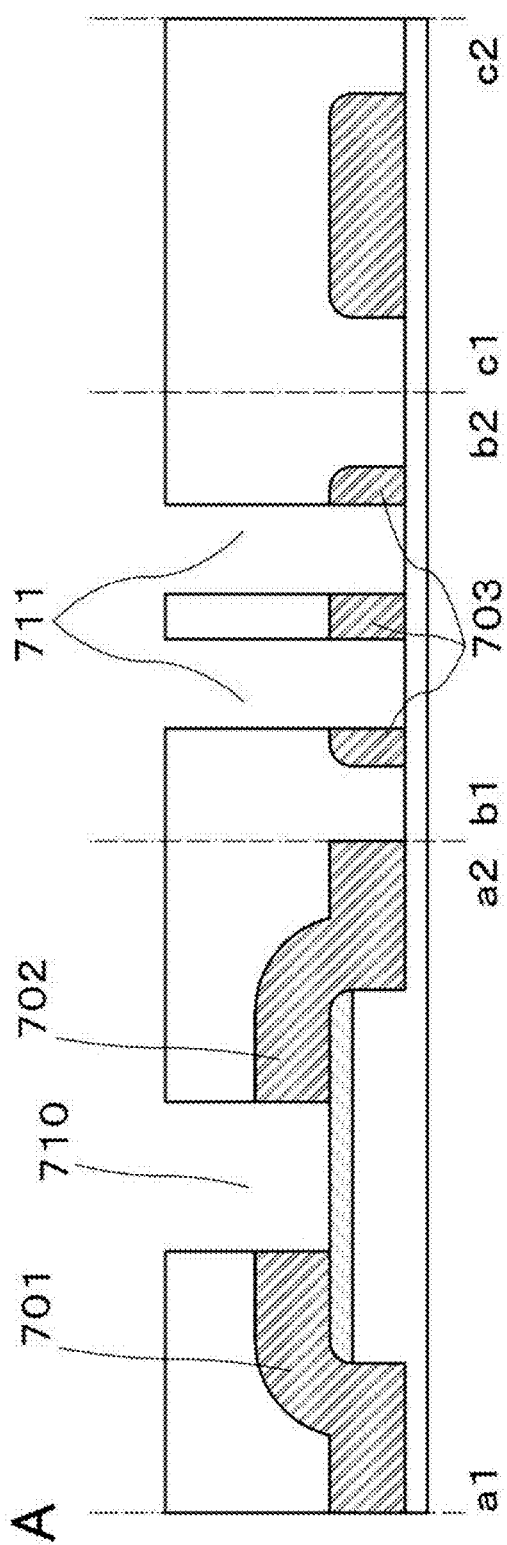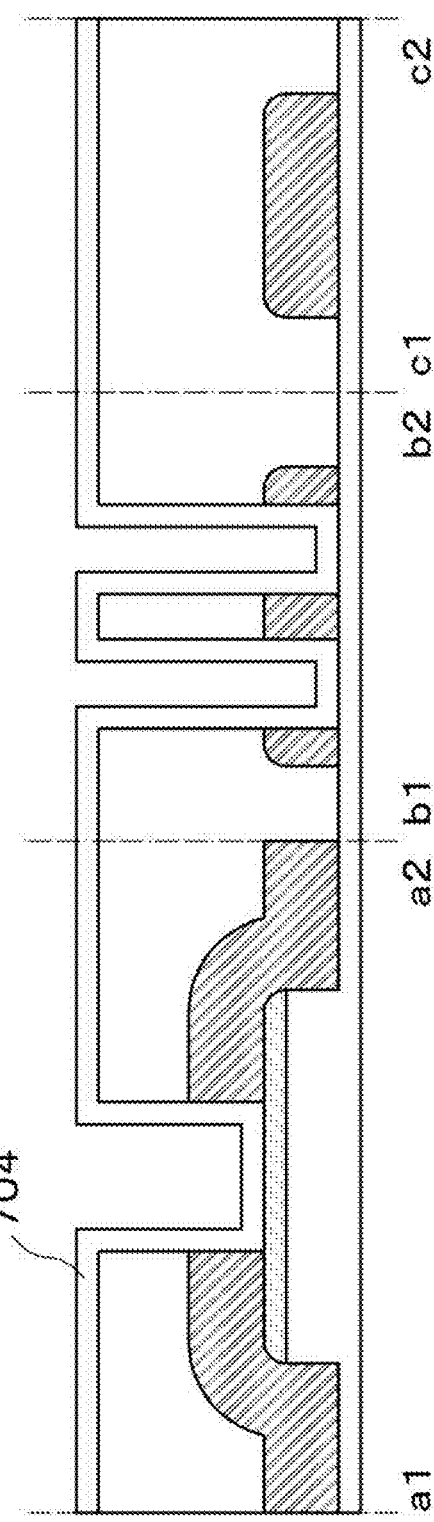

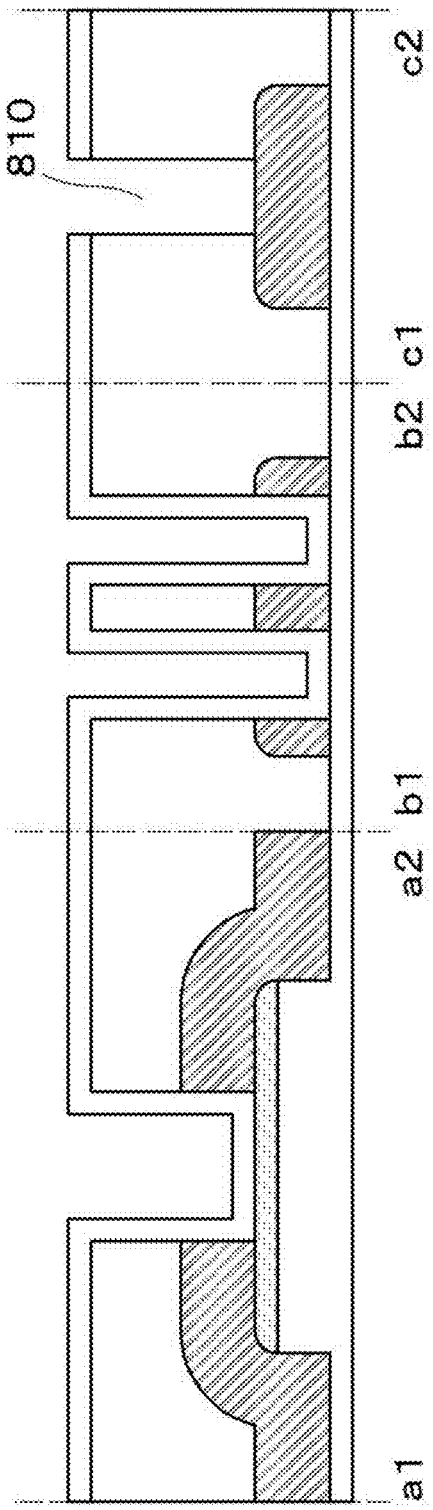
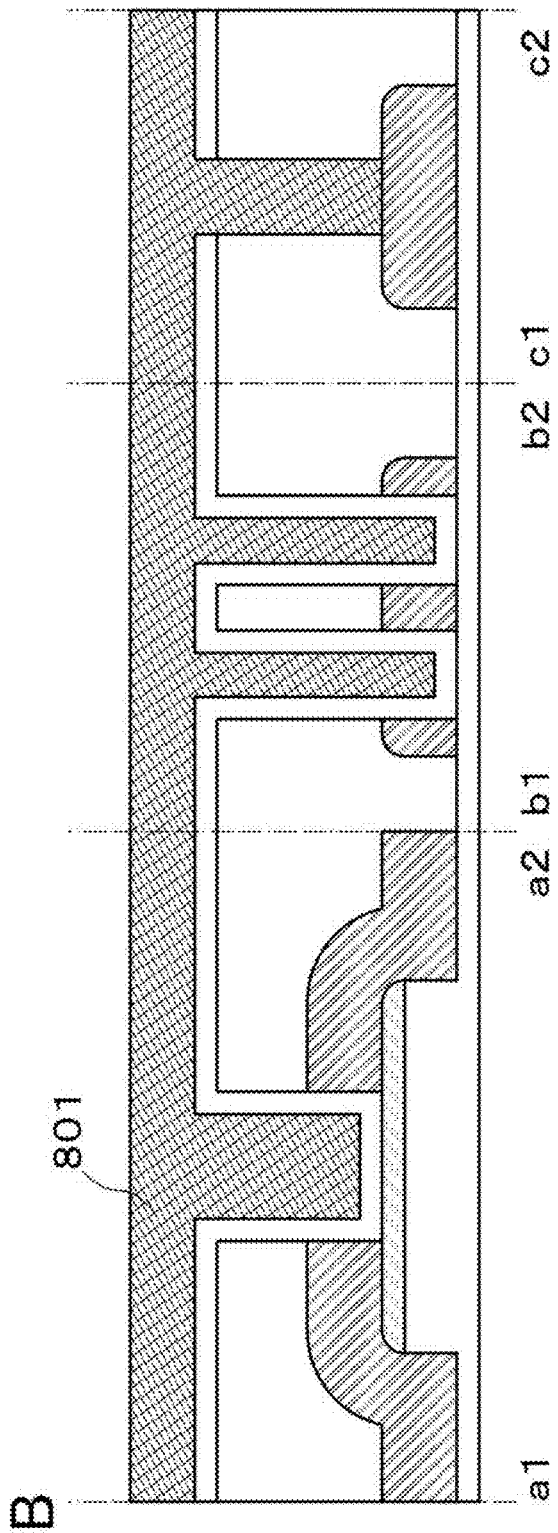

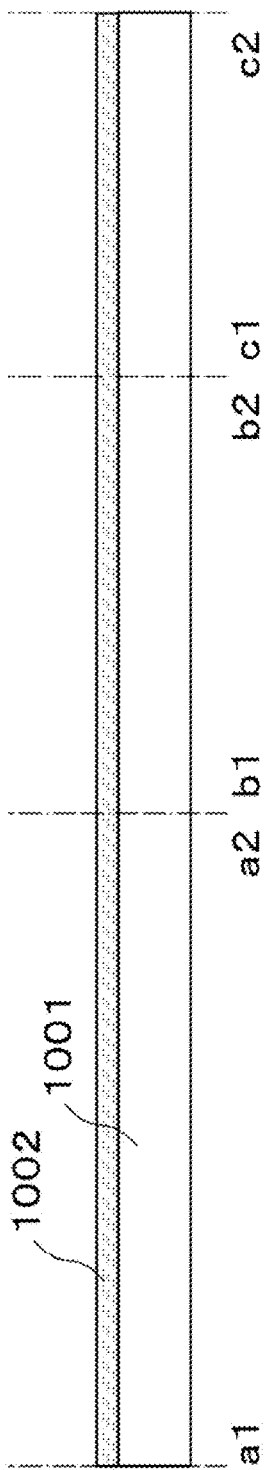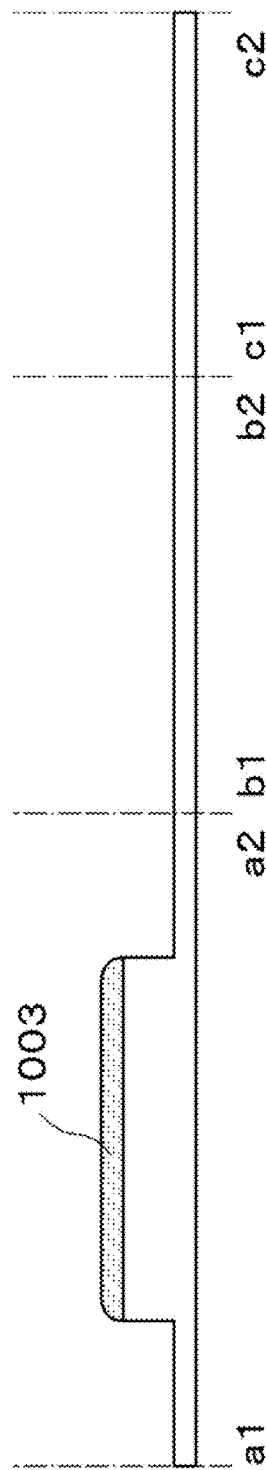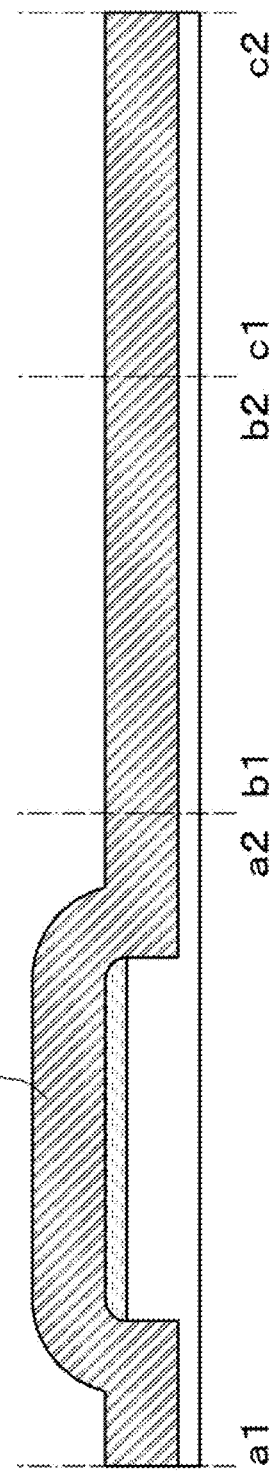

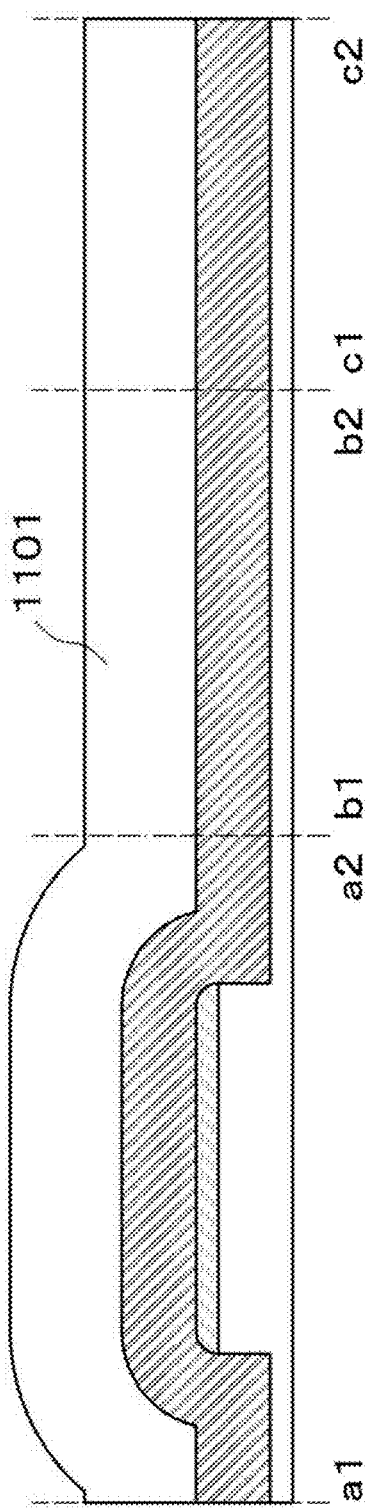
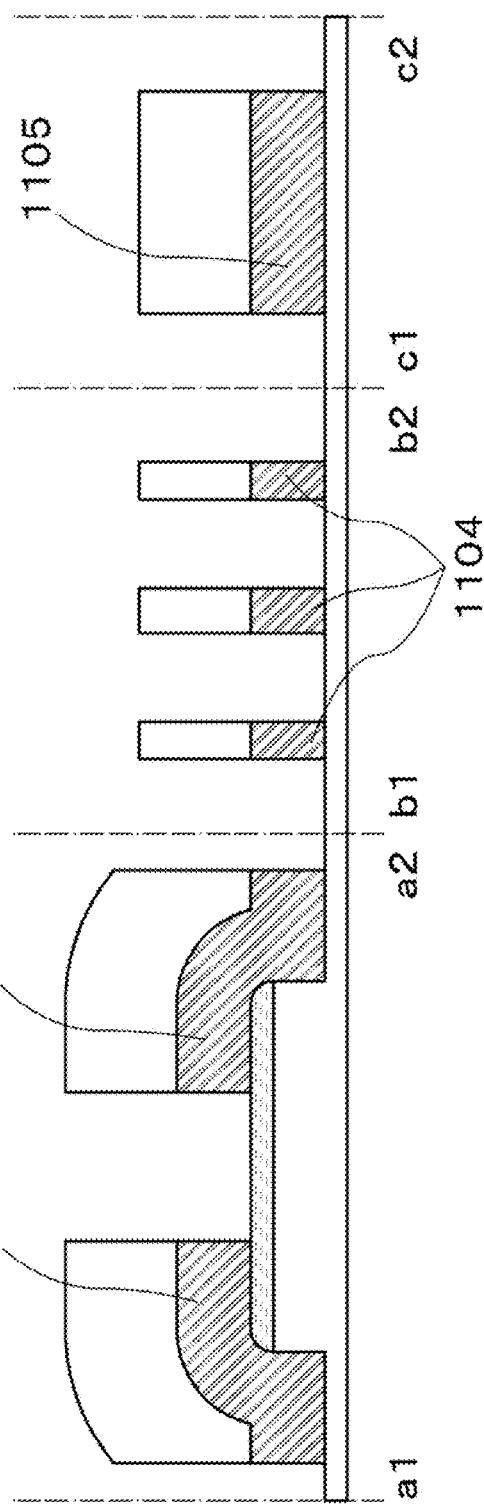
FIG. 11A
FIG. 11B

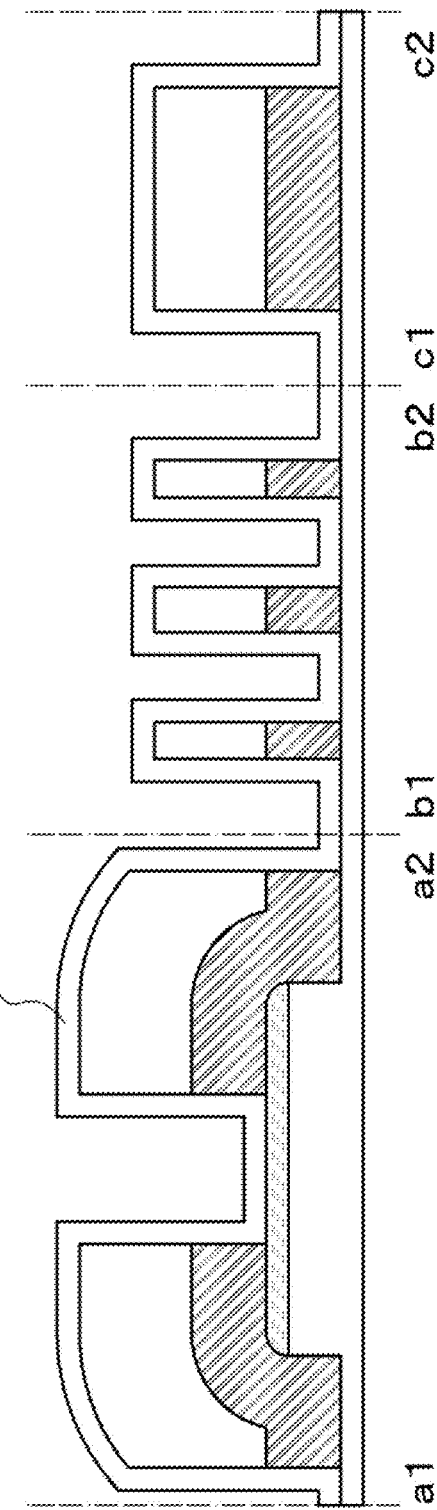
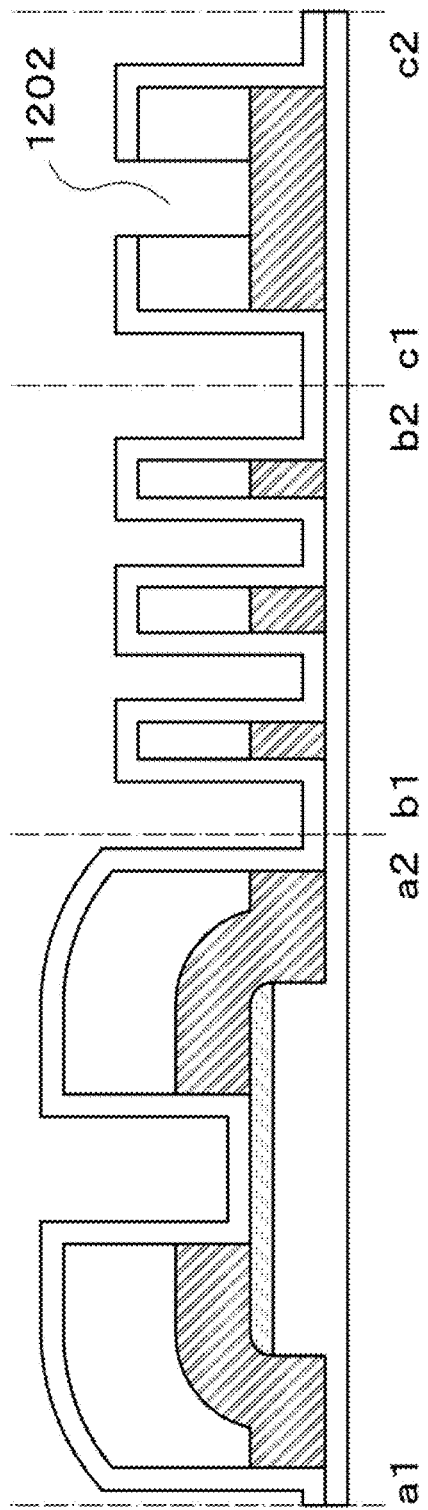

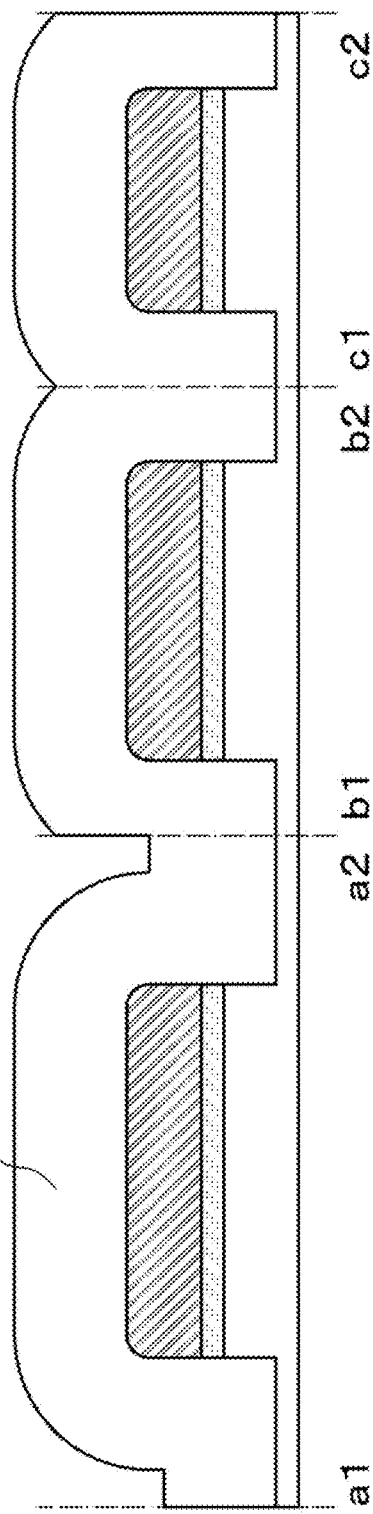
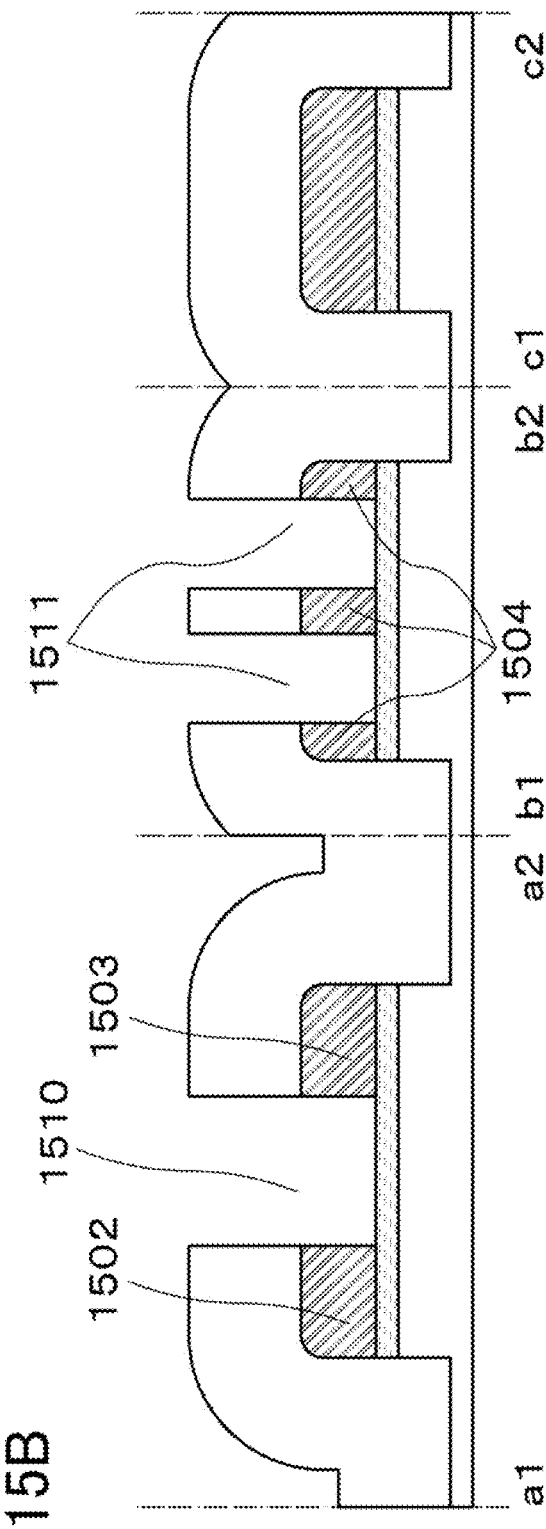
FIG. 15A
FIG. 15B

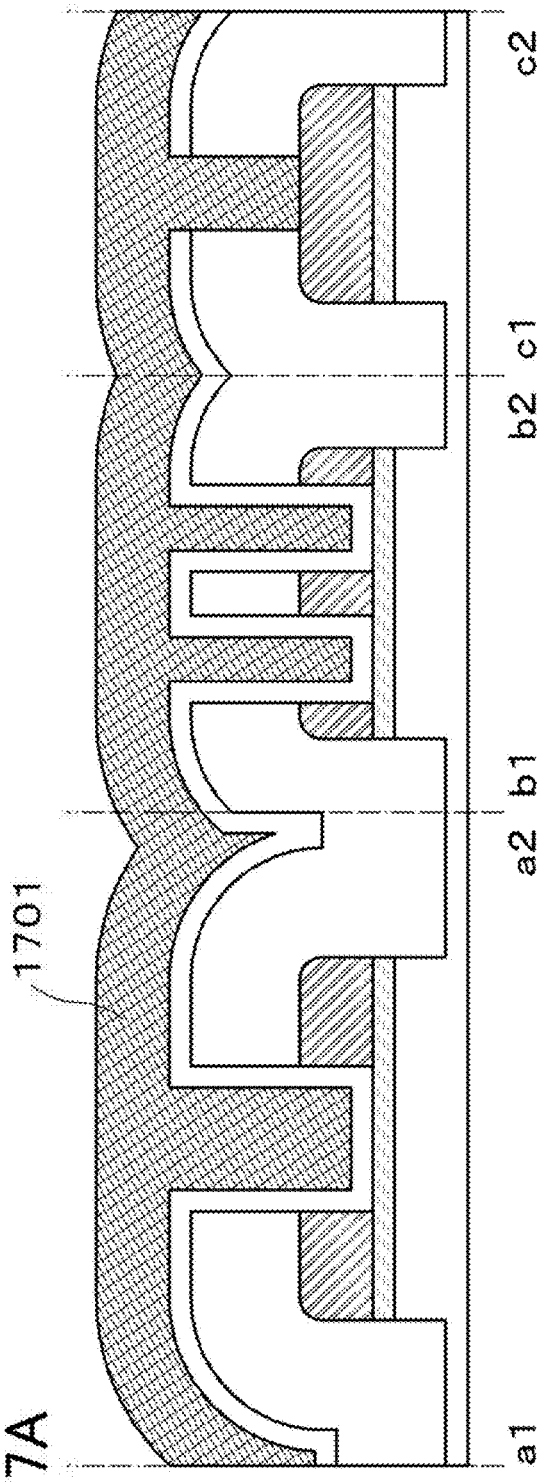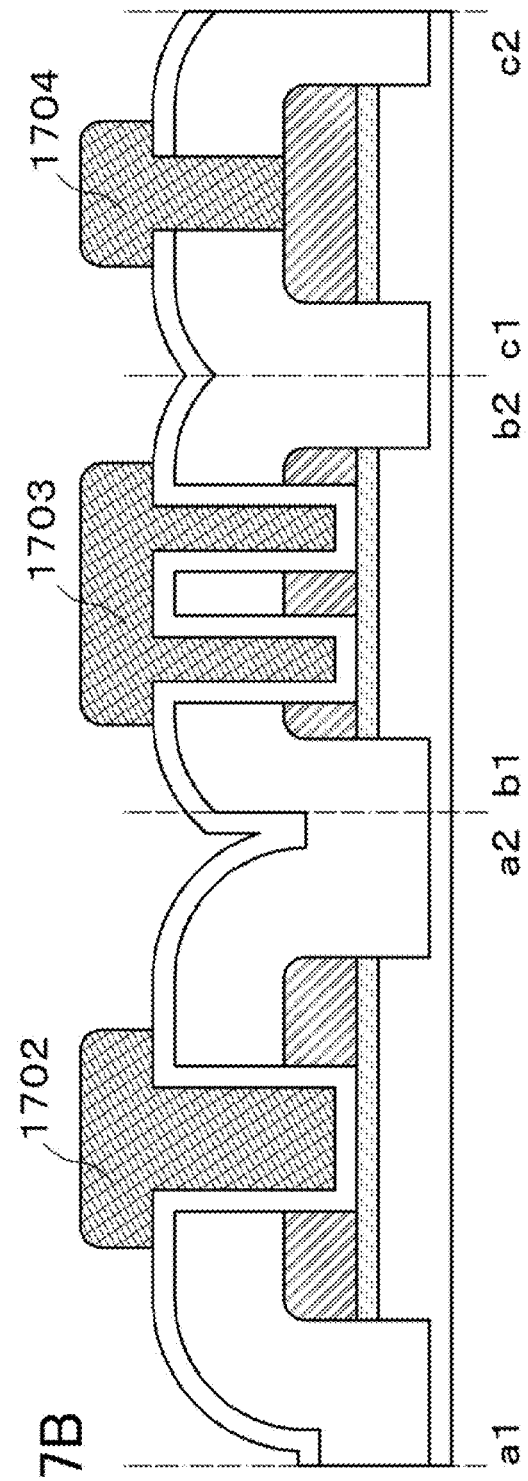
FIG. 17A
FIG. 17B

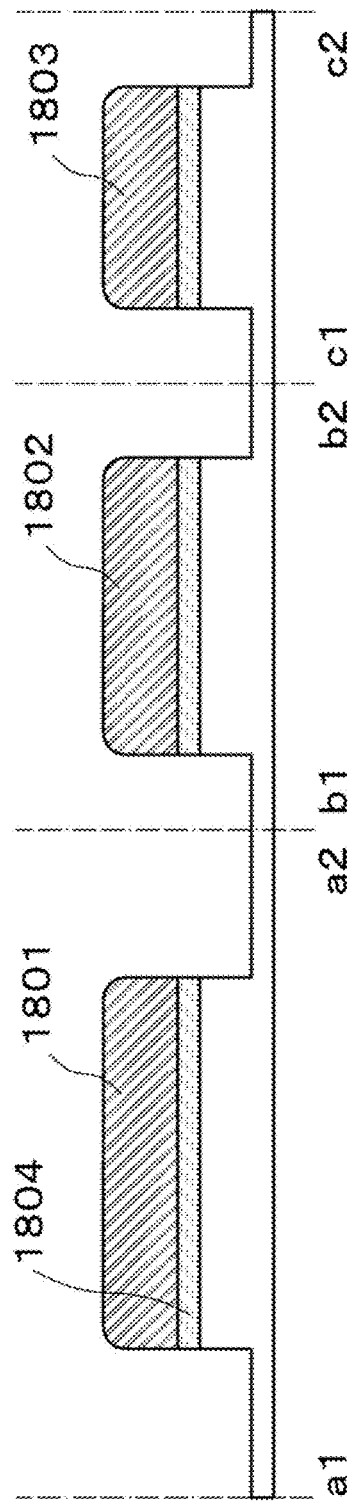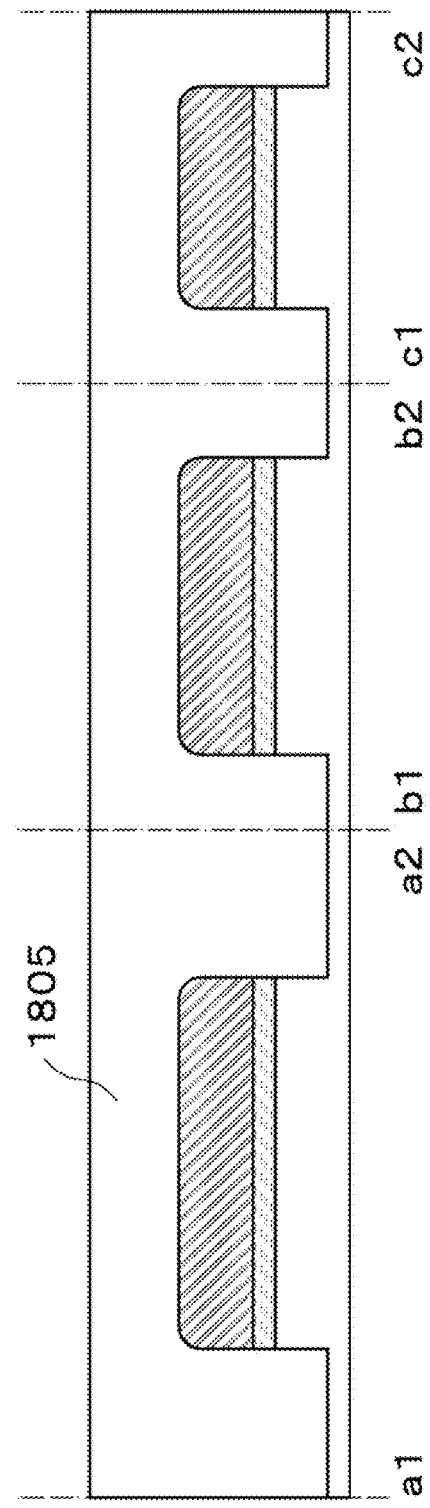

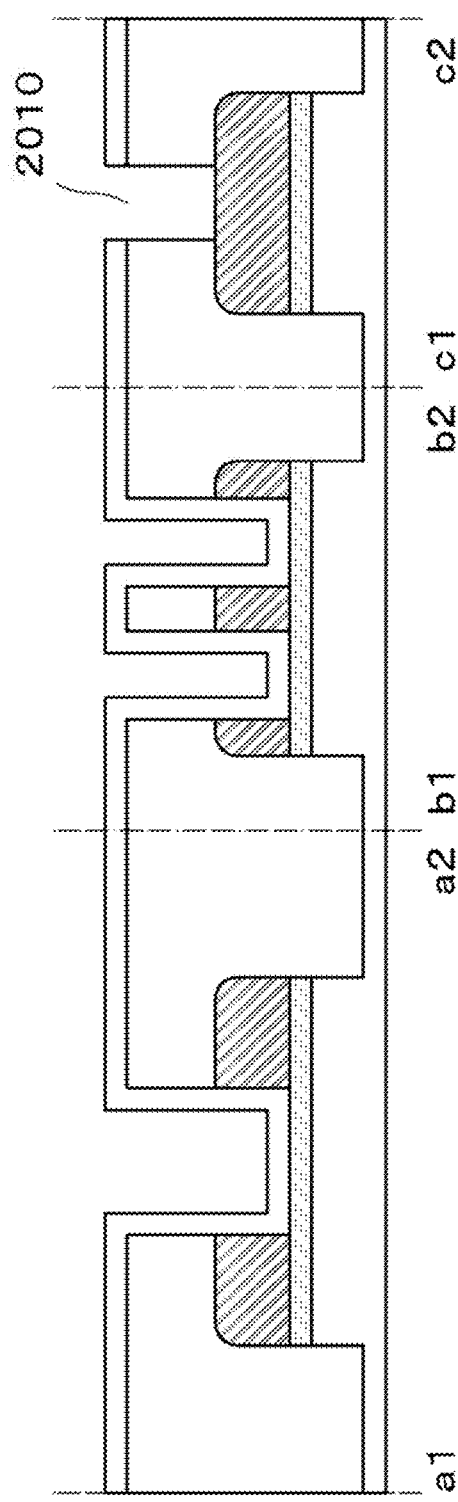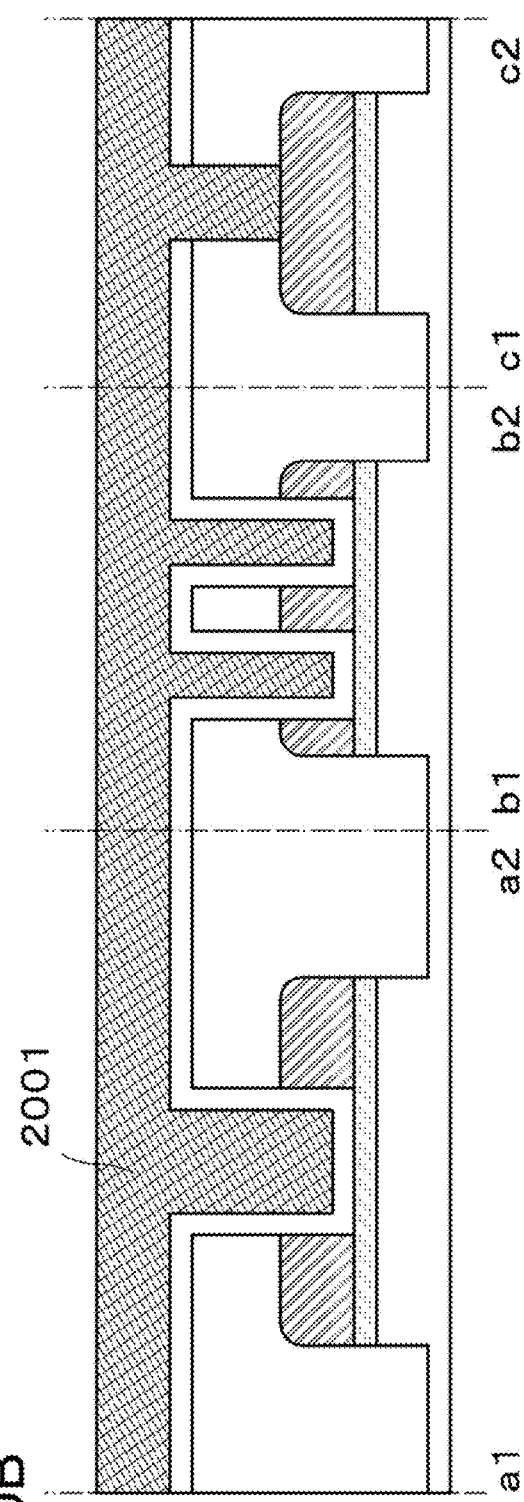

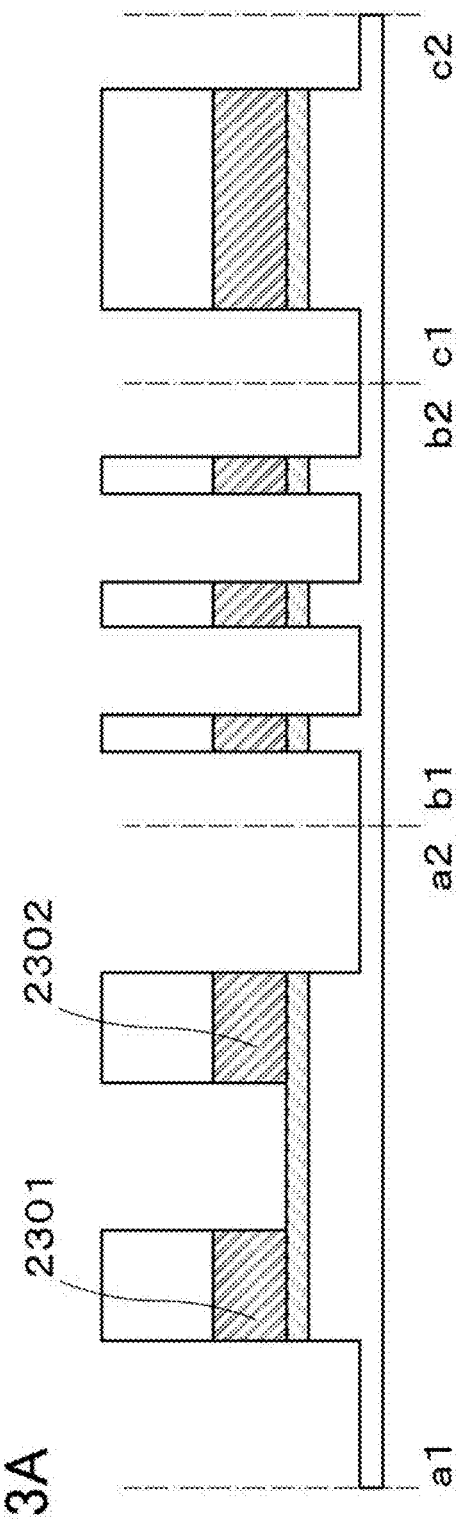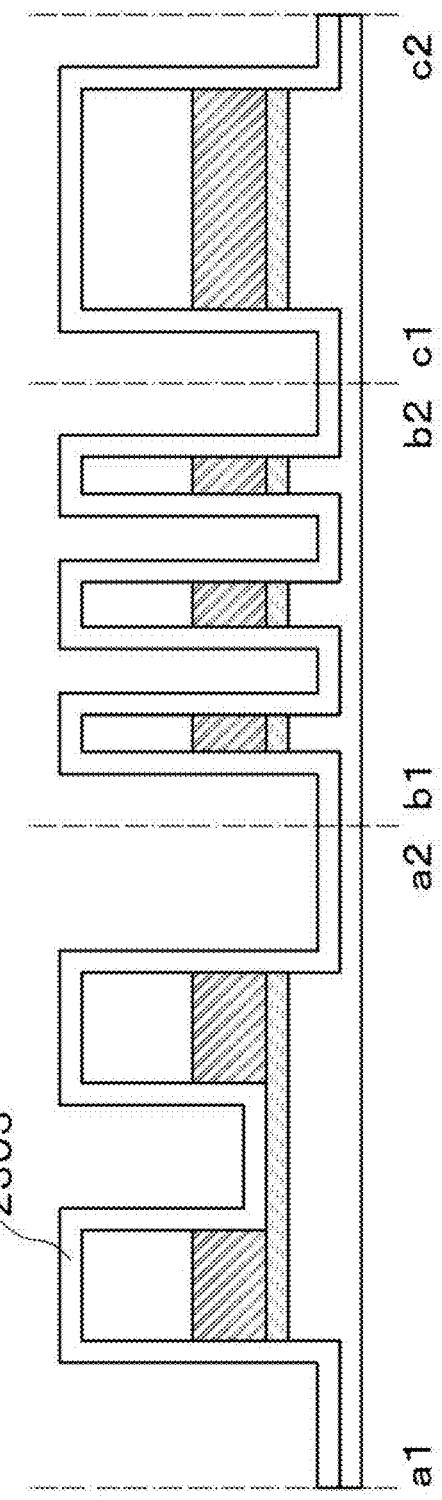

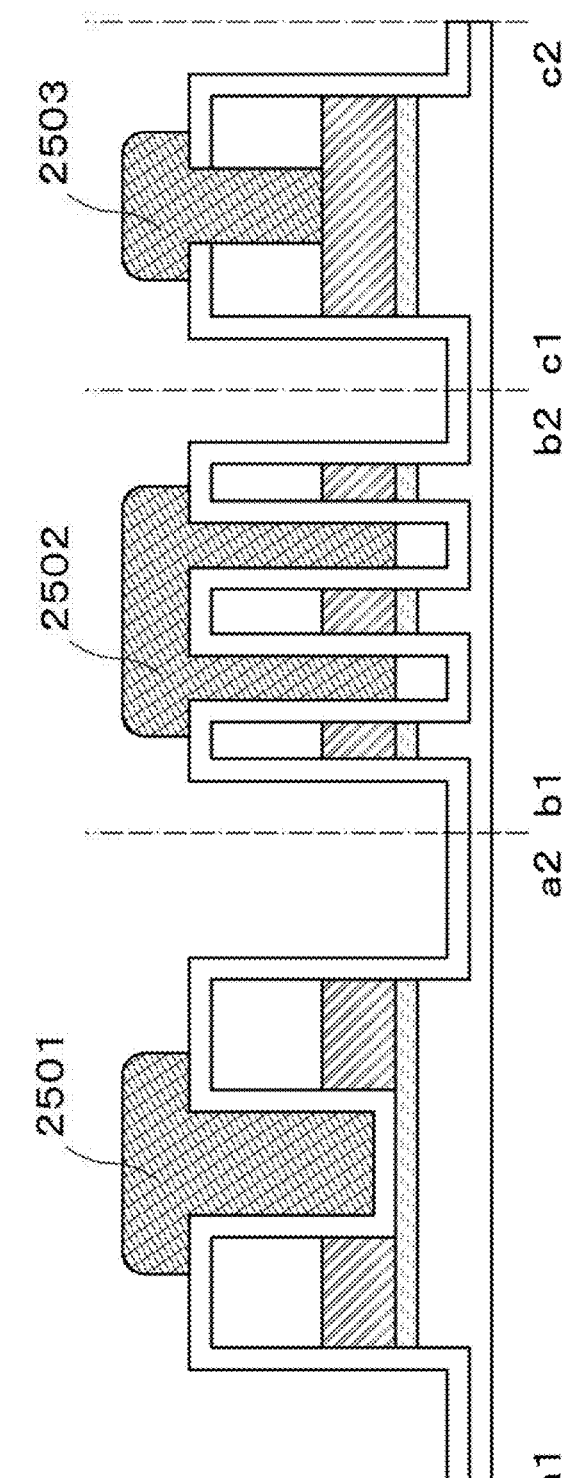

FIG. 26A
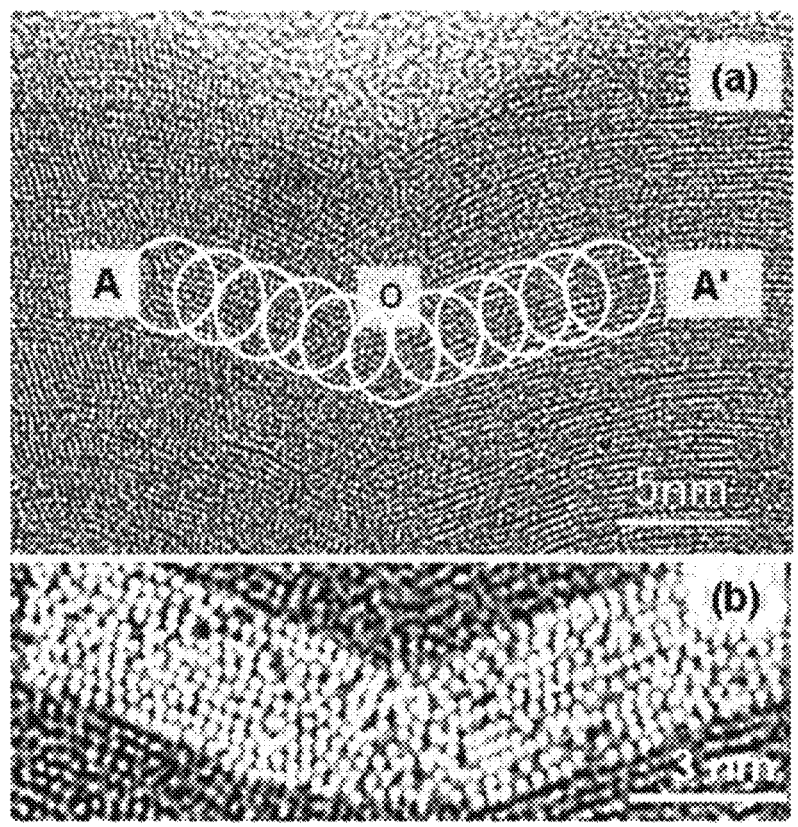
FIG. 26B
FIG. 26C
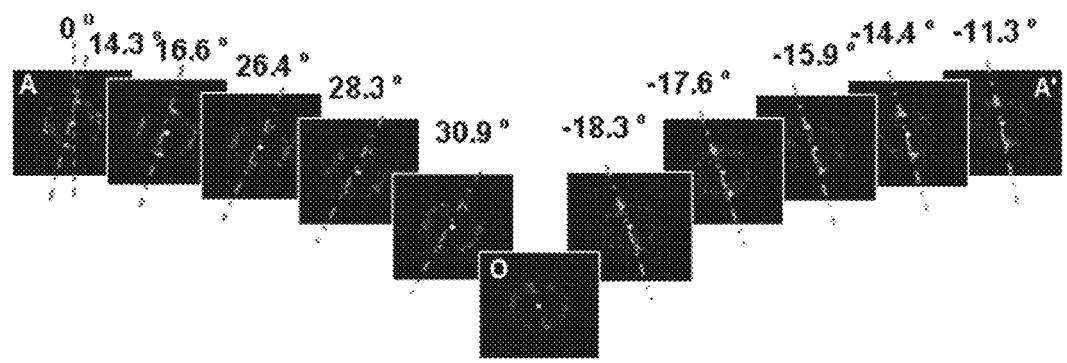

CAAC-OS nc-OS

As-sputtered

After a thermal treatment at 450°C

SEMICONDUCTOR DEVICE AND MANUFACTURING METHOD THEREOF

BACKGROUND OF THE INVENTION

1. Field of the Invention

The present invention relates to an object, a method, or a manufacturing method. The present invention also relates to a process, a machine, a manufacture, or a composition of matter. In particular, one embodiment of the present invention relates to a semiconductor device, a driving method thereof, or a manufacturing method thereof.

In this specification and the like, a semiconductor device generally means a device that can function by utilizing semiconductor characteristics. A transistor, a semiconductor circuit, an arithmetic device, a memory device, an imaging device, an electro-optical device, a display device, a light-emitting device, an electric storage device, and a power generation device (including a thin film solar cell, an organic thin film solar cell, and the like) each may include a semiconductor device.

2. Description of the Related Art

A technique in which a transistor is formed using a semiconductor material has attracted attention. The transistor is applied to a wide range of electronic devices such as an integrated circuit (IC) or an image display device. As semiconductor materials applicable to the transistor, silicon-based semiconductor materials have been widely used, but oxide semiconductors have been attracting attention as alternative materials.

For example, a technique for forming a transistor using zinc oxide or an In—Ga—Zn-based oxide semiconductor as an oxide semiconductor is disclosed (see Patent Documents 1 and 2).

In recent years, demand for integrated circuits in which semiconductor elements such as miniaturized transistors are integrated with high density has risen with increased performance and reductions in the size and weight of electronic devices.

REFERENCE

Patent Document

[Patent Document 1] Japanese Published Patent Application No. 2007-123861
[Patent Document 2] Japanese Published Patent Application No. 2007-096055

SUMMARY OF THE INVENTION

An object of one embodiment of the present invention is to provide a semiconductor device that is suitable for high integration.

Another object of one embodiment of the present invention is to provide a semiconductor device with favorable electrical characteristics. Another object is to provide a highly reliable semiconductor device. Another object of one embodiment of the present invention is to provide a semiconductor device with a novel structure.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention is a semiconductor device including an island-shaped semiconductor, a first electrode, a second electrode, a first insulator, a second insulator, and a third electrode. The first electrode and the second electrode are in contact with the island-shaped semiconductor. The first insulator is provided over the island-shaped semiconductor, the first electrode, and the second electrode. The first insulator has an opening or a groove. The second insulator is formed over the first insulator, an inner wall of the opening or the groove, and an exposed portion of the island-shaped semiconductor. The third electrode is formed in the opening or the groove.

One embodiment of the present invention is a method for manufacturing a semiconductor device, including a first step of forming a semiconductor, a second step of performing a first process on the semiconductor so as to form an island-shaped semiconductor, a third step of forming a first conductor over the island-shaped semiconductor, a fourth step of performing a second process on the first conductor so as to form a conductor according to a first pattern, a fifth step of forming a first insulator over the conductor having the first pattern, a sixth step of forming an opening or a groove in the first insulator, a seventh step of performing a third process on the conductor having the first pattern in the opening or the groove so as to form a first electrode and a second electrode and to expose the island-shaped semiconductor, an eighth step of forming a second insulator over the first insulator, an inner wall of the opening or the groove, and an exposed portion of the island-shaped semiconductor, a ninth step of forming a second conductor over the second insulator, and a tenth step of performing a fourth process on the second conductor so as to form a third electrode.

One embodiment of the present invention is a method for manufacturing a semiconductor device, including a first step of forming a semiconductor, a second step of performing a first process on the semiconductor so as to form an island-shaped semiconductor, a third step of forming a first conductor over the island-shaped semiconductor, a fourth step of forming a first insulator over the first conductor, a fifth step of performing a second process on the first insulator so that the first insulator has a desired pattern, performing a third process on the first conductor so as to form a first electrode and a second electrode and to expose the island-shaped semiconductor, a sixth step of forming a second insulator over the first insulator, an inner wall of an opening or a groove formed by the above second and third processes, and an exposed portion of the island-shaped semiconductor, a seventh step of forming a second conductor over the second insulator, and an eighth step of performing a fourth process on the second conductor so as to form a third electrode.

One embodiment of the present invention is a method for manufacturing a semiconductor device, including a first step of forming a semiconductor, a second step of forming a first conductor on and in contact with the semiconductor, a third step of performing a first process on the semiconductor and the first conductor so as to form a semiconductor and a conductor each having a first pattern, a fourth step of forming a first insulator over the semiconductor and the conductor each having the first pattern, a fifth step of forming an opening or a groove in the first insulator, a sixth step of performing a second process on the conductor having the first pattern in the opening or the groove so as to form a first electrode and a second electrode and to expose the semiconductor having the first pattern, a seventh step of forming a second insulator over the first insulator, an inner wall of the opening or the groove, and an exposed portion of the semiconductor having the first pattern, an eighth step of forming a second conductor over the second insulator, and a ninth step of performing a third process on the second conductor so as to from a third electrode.

One embodiment of the present invention is a method for manufacturing a semiconductor device, including a first step of forming a semiconductor, a second step of forming a first conductor on and in contact with the semiconductor, a third step of forming a first insulator over the first conductor, a fourth step of performing a first process on the first insulator, on the first conductor, and on the semiconductor so that the first insulator, the first conductor, and the semiconductor have a desired pattern, a fifth step of performing a second process on the first insulator and on the first conductor so as to form a first electrode and a second electrode and to expose a portion of the semiconductor, a sixth step of forming a second insulator over the first insulator, an inner wall of an opening or a groove formed by the above second process, and the exposed portion of the semiconductor, a seventh step of forming a second conductor over the second insulator, and an eighth step of performing a third process on the second conductor so as to form a third electrode.

The first insulator is preferably an insulator having planarity

The first insulator includes a low-dielectric constant material.

The second conductor is preferably processed by CMP treatment. Using CMP treatment, the third electrode can be formed in the opening or the groove.

The second conductor is preferably processed using a dual damascene method.

One embodiment of the present invention makes it possible to provide a semiconductor device that is suitable for miniaturization.

A semiconductor device with favorable electrical characteristics can be provided. Furthermore, a highly reliable semiconductor device can be provided.

A semiconductor device or the like with a novel structure can be provided. Moreover, the number of steps for forming a semiconductor device can be reduced.

Parasitic capacitance between the first electrode and the third electrode can be reduced due to the existence of the first insulator.

Parasitic capacitance between the second electrode and the third electrode can be reduced due to the existence of the first insulator.

Operation speed of the semiconductor device can be improved by the reduction in parasitic capacitance. In particular, operation speed at the time when the semiconductor device is changed from a first conducting state to a second conducting state can be improved.

The island-shaped semiconductor is made in contact with the first electrode or the second electrode, whereby parasitic resistance can be reduced. Further, on-state current can be increased by the reduction in parasitic resistance.

An offset region can be formed between a channel region and a source region or a drain region due to the existence of the second insulator. Fine processing achieving a size smaller than the minimum feature size of a photolithography process can be performed; thus, a semiconductor device with a gate electrode having a finer gate length can be obtained.

The channel length of a transistor can be controlled with a thickness of the second insulator. The length of the offset region can be controlled between the channel region and the source region or the drain region.

In the formation of the second conductor, use of CMP treatment enables fine processing of a conductor that is difficult to process by etching. In addition fine processing achieving a size smaller than the minimum feature size of a photolithography process can be performed.

Note that the description of these effects does not disturb the existence of other effects. Other effects will be apparent from and can be derived from the description of the specification, the drawings, the claims, and the like.

BRIEF DESCRIPTION OF THE DRAWINGS

FIGS. 1A to 1C illustrate an example of a method for manufacturing a semiconductor device of a first embodiment.

FIGS. 2A and 2B illustrate an example of the method for manufacturing a semiconductor device of the first embodiment.

FIGS. 3A and 3B illustrate an example of the method for manufacturing a semiconductor device of the first embodiment.

FIGS. 6A and 6B illustrate an example of a method for manufacturing a semiconductor device of a second embodiment.

FIGS. 7A and 7B illustrate an example of the method for manufacturing a semiconductor device of the second embodiment.

FIGS. 8A and 8B illustrate an example of the method for manufacturing a semiconductor device of the second embodiment.

FIGS. 10A to 10C illustrate an example of a method for manufacturing a semiconductor device of a third embodiment.

FIGS. 11A and 11B illustrate an example of the method for manufacturing a semiconductor device of the third embodiment.

FIGS. 12A and 12B illustrate an example of the method for manufacturing a semiconductor device of the third embodiment.

FIGS. 15A and 15B illustrate an example of the method for manufacturing a semiconductor device of the fourth embodiment.

FIGS. 17A and 17B illustrate an example of the method for manufacturing a semiconductor device of the fourth embodiment.

FIGS. 18A and 18B illustrate an example of a method for manufacturing a semiconductor device of a fifth embodiment.

FIGS. 20A and 20B illustrate an example of the method for manufacturing a semiconductor device of the fifth embodiment.

FIGS. 23A and 23B illustrate an example of the method for manufacturing a semiconductor device of the sixth embodiment.

FIG. 25 illustrates an example of the method for manufacturing a semiconductor device of the sixth embodiment.

FIGS. 26A to 26C are cross-sectional TEM images and a local Fourier transform image of an oxide semiconductor.

DETAILED DESCRIPTION OF THE INVENTION

Figure 4A:
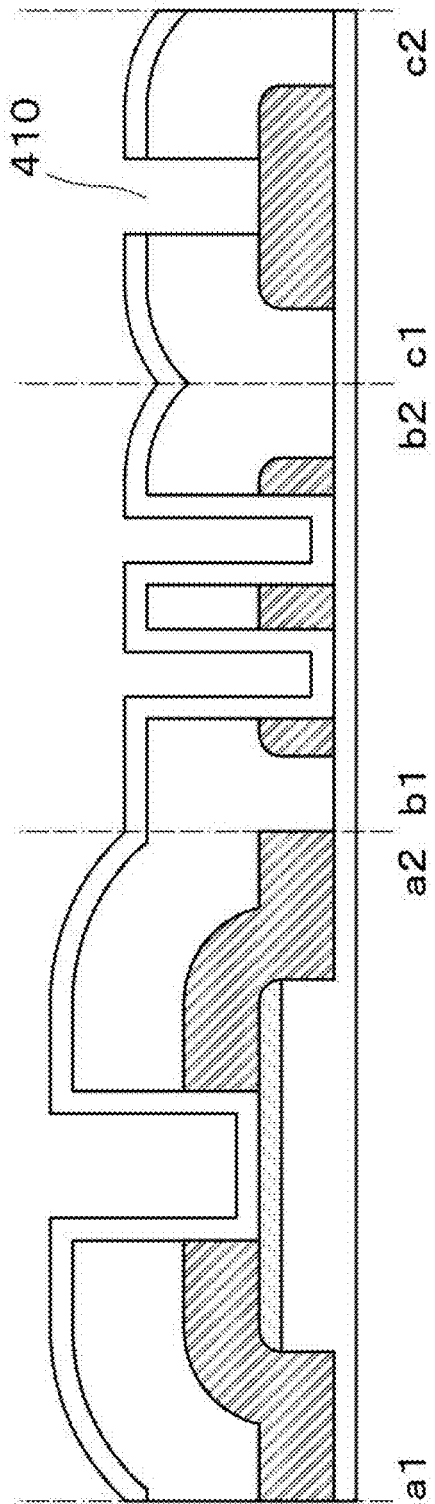
FIGS. 4A and 4B illustrate an example of the method for manufacturing a semiconductor device of the first embodiment.

Embodiments will be described in detail with reference to drawings. Note that the present invention is not limited to the description below, and it is easily understood by those skilled in the art that various changes and modifications can be made without departing from the spirit and scope of the present invention. Accordingly, the present invention should not be interpreted as being limited to the content of the embodiments below.

Note that in the structures of the invention described below, the same portions or portions having similar functions are denoted by the same reference numerals in different drawings, and description of such portions is not repeated. Further, the same hatching pattern is applied to portions having similar functions, and the portions are not especially denoted by reference numerals in some cases.

Note that in each drawing described in this specification, the size, the layer thickness, or the region of each component is exaggerated for clarity in some cases. Therefore, embodiments of the present invention are not limited to such a scale.

Note that in this specification and the like, ordinal numbers such as "first", "second", and the like are used in order to avoid confusion among components and do not limit the number.

Note that in this specification and the like, an electrode and a wiring electrically connected to the electrode may be a single component. In other words, there are cases where a portion of a wiring functions as an electrode and where a portion of an electrode functions as a wiring.

A transistor is a kind of semiconductor elements and can achieve amplification of current or voltage, switching operation for controlling conduction or non-conduction, or the like. A transistor in this specification includes an insulated-gate field effect transistor (IGFET) and a thin film transistor (TFT).

Embodiment 1

An example of a method for manufacturing a semiconductor device of one embodiment of the present invention is described below with reference to FIGS. 1A to 1C, FIGS. 2A and 2B, FIGS. 3A and 3B, FIGS. 4A and 4B, and FIG. 5. Note that cross sections of a FET portion, a capacitor, and a contact portion along lines a1-a2, b1-b2, and c1-c2 are shown in the drawings, respectively.

First, an insulator 101 is provided; then, a semiconductor 102 is provided (FIG. 1A).

In addition to an insulator described later, a glass substrate, a quartz substrate, a silicon oxide film formed by a local oxidation of silicon (LOCOS) method, or the like can be used as the insulator 101. In the case of using a glass substrate, a quartz substrate, or the like as the insulator 101, a silicon oxide film, a silicon nitride film, a silicon oxnitiride film, or a stacked film of these films is preferably provided between the insulator 101 and the semiconductor 102.

Next, a resist mask is formed over the semiconductor 102 by a photolithography process or the like and an unnecessary portion of the semiconductor 102 is removed, whereby an island-shaped semiconductor 103 is formed. Then, the resist mask is removed (FIG. 1B). Also, as shown in FIG. 1B, when the unnecessary portion of the semiconductor 102 is removed, a portion of the insulator 101 is removed.

Next, a conductor 104 is provided (FIG. 1C).

Next, a resist mask is formed over the conductor 104 by a photolithography process or the like and an unnecessary portion of the conductor 104 is removed. Then, the resist mask is removed. Thus, conductive patterns 201, 202, and 203 are formed (FIG. 2A).

Next, an insulator 204 is provided over the conductive patterns 201, 202, and 203 (FIG. 2B).

An insulator described later can be used as the insulator 204. In particular, a film having planarity is appropriate.

The insulator 204 is preferably formed using a low-dielectric constant material (also referred to as a low-k material) because the insulator 204 also functions as an interlayer insulating film.

Next, a resist mask is formed over the insulator 204 by a photolithography process or the like and an unnecessary portion of the insulator 204 is removed. Then, unnecessary portions of the conductive patterns 201 and 202 are removed, so that electrodes 301 and 302 which function as a source electrode and a drain electrode, an electrode 303 of the capacitor, and openings or grooves 310 and 311 are formed. At this time, unnecessary portions of the conductive patterns 201 and 202 may be removed before the resist mask is removed or after the resist mask is removed (FIG. 3A).

Next, an insulator 304 is provided (FIG. 3B).

An insulator described later can be used as the insulator 304; however, a film formed by an atomic layer deposition (ALD) method is preferably used. Using an ALD method, a thin insulator can be formed with a uniform thickness. Thus, the insulator with a uniform thickness can be formed over the insulator 204, an inner wall of the opening or the groove 310, and an exposed portion of the island-shaped semiconductor 103.

Furthermore, part of the insulator 304 is preferably formed using a high-dielectric constant material (also referred to as a high-k material) because the insulator 304 also functions as a gate insulating film.

Next, a resist mask is formed over the insulator 304 by a photolithography process or the like and unnecessary portions of the insulator 304 and the insulator 204 are removed. Accordingly, an opening or a groove 410 is formed. After that, the resist mask is removed (FIG. 4A).

Figure 4B:
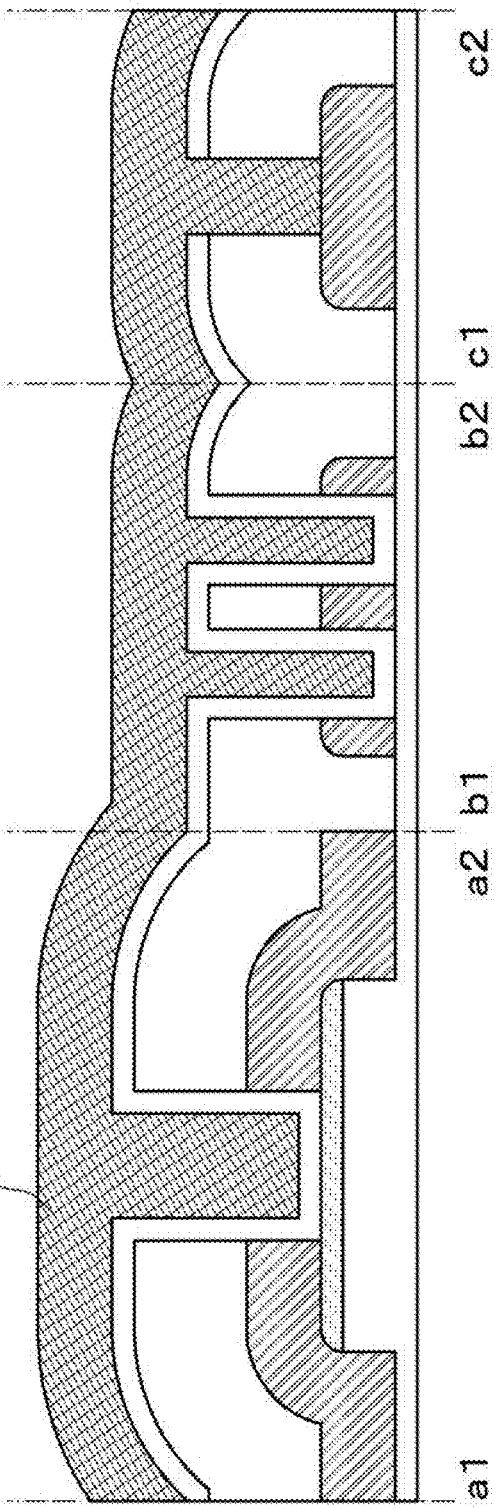

Next, a conductor 401 is provided (FIG. 4B).

A conductor described later can be used for the conductor 401; however, a conductor formed by a metal organic CVD (MOCVD) method is preferably used. By using an MOCVD method to form a conductor on a surface, it is possible to fill with the conductor a depressed portion having a high aspect ratio.

Figure 5:
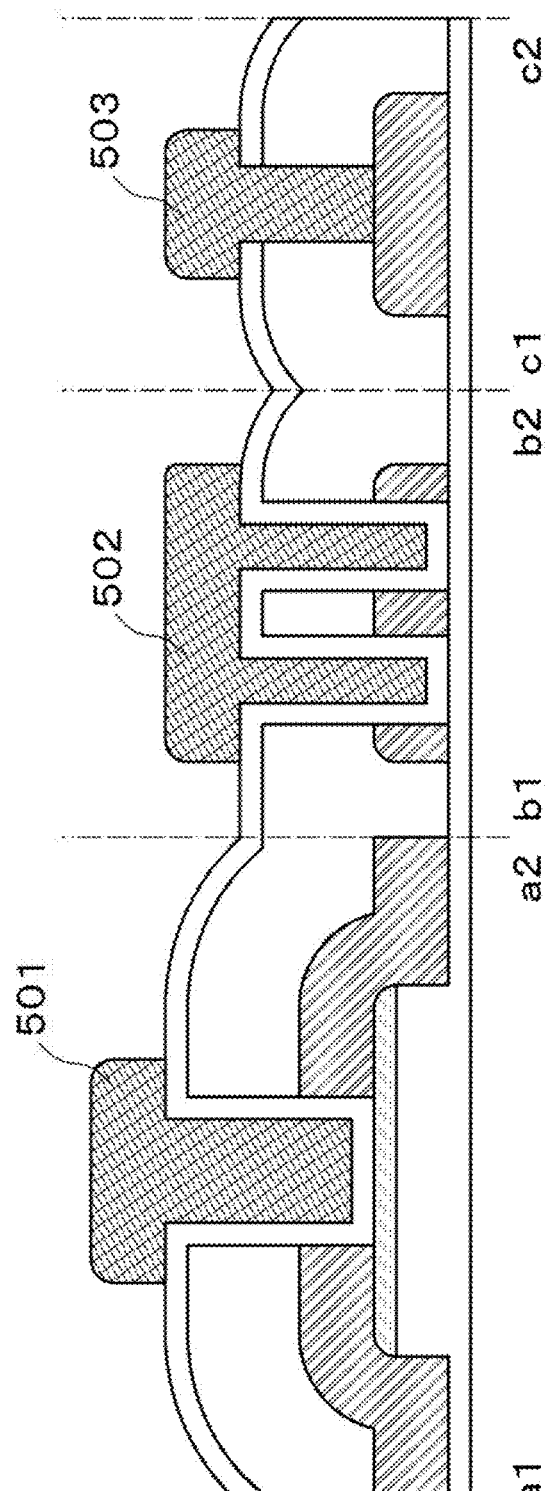
FIG. 5 illustrates an example of the method for manufacturing a semiconductor device of the first embodiment.

Next, a resist mask is formed over the conductor 401 by a photolithography process or the like and an unnecessary portion of the conductor 401 is removed. Accordingly, conductive patterns 501, 502, and 503 are formed. After that, the resist mask is removed. Note that the conductive pattern 501 functions as a gate electrode. The conductive pattern 502 can form a capacitor in a portion facing the electrode 303 with the insulator 304 provided therebetween (FIG. 5).

In the semiconductor device of one embodiment of the present invention, the FET portion, the capacitor, and the contact portion can be formed at the same time as shown in FIGS. 1A to 1C, FIGS. 2A and 2B, FIGS. 3A and 3B, FIGS. 4A and 4B, and FIG. 5.

In the FET portion, parasitic capacitance between the electrode 301 and the conductive pattern 501, and between the electrode 302 and the conductive pattern 501 can be reduced due to the existence of the insulator 204. Further, the operation speed of the semiconductor device can be improved by the reduction in parasitic capacitance. In particular, the operation speed at the time when the semiconductor device is changed from a first conducting state to a second conducting state can be improved. A large part of a source region or a drain region of the island-shaped semiconductor 103 is made in contact with the electrode 301 or the electrode 302, whereby parasitic resistance can be reduced. Further, on-state current can be increased by the reduction in parasitic resistance. An offset region can be formed between a channel region and the source region or the drain region due to the existence of the insulator 304, and the electrode 301 or the electrode 302 can be arranged in the vicinity of the channel region. Fine processing achieving a size smaller than the minimum feature size of a photolithography process can be performed; thus, a semiconductor device with a gate electrode having a finer gate length can be obtained. The channel length of the transistor can be controlled with the thickness of the insulator 304. Further, the length of the offset region can be controlled between the channel region and the source region or the drain region.

At least part of this embodiment can be implemented in combination with any of the embodiments described in this specification as appropriate.

Embodiment 2

An example of a method for manufacturing a semiconductor device of one embodiment of the present invention is described below with reference to FIGS. 6A and 6B, FIGS. 7A and 7B, FIGS. 8A and 8B, and FIG. 9. Note that cross sections of a FET portion, a capacitor, and a contact portion along lines a1-a2, b1-b2, and c1-c2 are shown in the drawings, respectively.

In Embodiment 2, a method for manufacturing a semiconductor device, which is a partial modification of the method for manufacturing a semiconductor device described in Embodiment 1, will be described.

First, the structure shown in FIG. 6A is obtained by a method similar to the method described in Embodiment 1 with reference to FIGS. 1A to 1C and FIG. 2A.

Next, over conductive patterns 601, 602, and 603, an insulator 604 is formed using an insulator having planarity (FIG. 6B).

The insulator 604 is preferably formed using a low-dielectric constant material (also referred to as a low-k material) because the insulator 604 also functions as an interlayer insulating film.

Next, a resist mask is formed over the insulator 604 by a photolithography process or the like and an unnecessary portion of the insulator 604 is removed. By the removal of unnecessary portions of the conductive patterns 601 and 602, electrodes 701 and 702 that function as a source electrode and a drain electrode, an electrode 703 of the capacitor, openings or grooves 710 and 711 are formed. At that time, unnecessary portions of the conductive patterns 601 and 602 may be removed before the resist mask is removed or after the resist mask is removed (FIG. 7A).

Next, an insulator 704 is provided (FIG. 7B).

An insulator described later can be used as the insulator 704; however, a film formed by an atomic layer deposition (ALD) method is preferably used. Using an ALD method, a thin insulator can be formed with a uniform thickness. Thus, the insulator with a uniform thickness can be formed over the insulator 604, an inner wall of the opening or the groove 710, and an exposed portion of an island-shaped semiconductor.

Furthermore, part of the insulator 704 is preferably formed using a high-dielectric constant material (also referred to as a high-k material) because the insulator 704 also functions as a gate insulating film.

Next, a resist mask is formed over the insulator 704 by a photolithography process or the like and unnecessary portions of the insulator 704 and the insulator 604 are removed. Accordingly, an opening or a groove 810 is formed. After that, the resist mask is removed (FIG. 8A).

Next, a conductor 801 is provided (FIG. 8B).

A conductor described later can be used for the conductor 801; however, a conductor formed by a metal organic CVD (MOCVD) method is preferably used. By using an MOCVD method to form a conductor on a surface, it is possible to fill with the conductor a depressed portion having a high aspect ratio.

Figure 9:
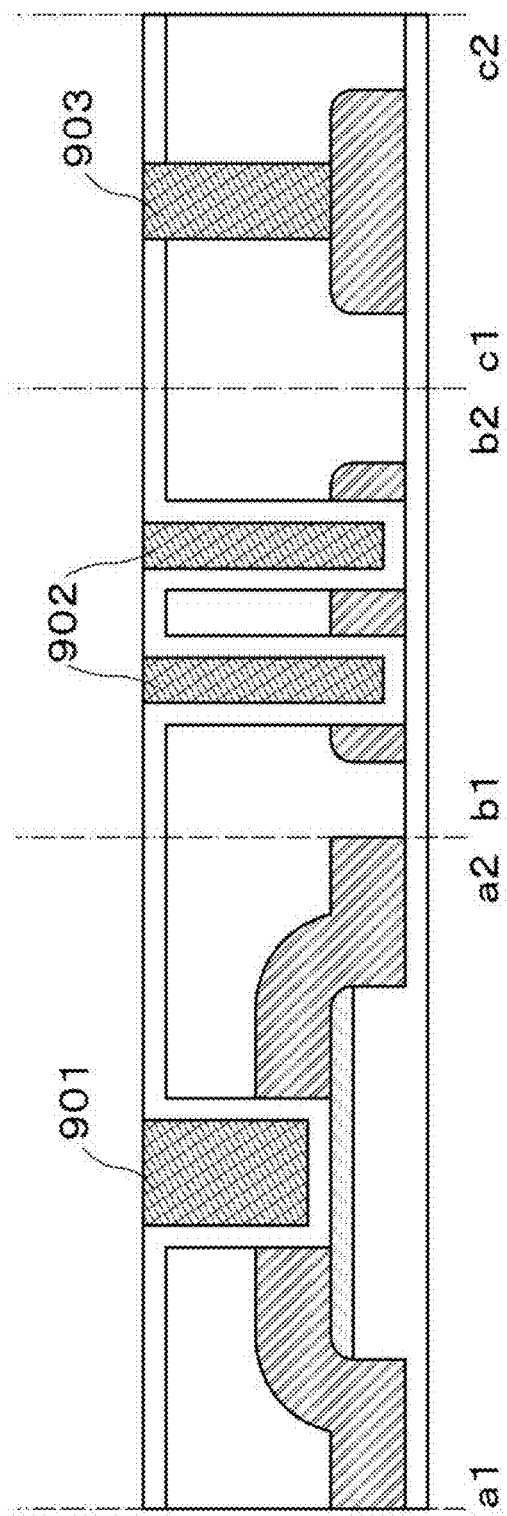
FIG. 9 illustrates an example of the method for manufacturing a semiconductor device of the second embodiment.

The conductor 801 is processed using a chemical mechanical polishing (CMP) method, whereby conductive patterns 901, 902, and 903 can be formed. Note that the conductive pattern 901 has a function as a gate electrode. The conductive pattern 902 can form a capacitor in a portion facing the electrode 703 with the insulator 704 provided therebetween. A dual damascene method or the like may be used for forming the conductive patterns 901, 902, and 903, or the like (FIG. 9).

In the semiconductor device of one embodiment of the present invention, the FET portion, the capacitor, and the contact portion can be formed at the same time as shown in FIGS. 6A and 6B, FIGS. 7A and 7B, FIGS. 8A and 8B, and FIG. 9.

In the FET portion, parasitic capacitance between the electrode 701 and the conductive pattern 901, and between the electrode 702 and the conductive pattern 901 can be reduced due to the existence of the insulator 604. Further, the operation speed of the semiconductor device can be improved by the reduction in parasitic capacitance. In particular, the operation speed at the time when the semiconductor device is changed from a first conducting state to a second conducting state can be improved. A large part of a source region or a drain region of the island-shaped semiconductor is made in contact with the electrode 701 or the electrode 702, whereby parasitic resistance can be reduced. Further, on-state current can be increased by the reduction in parasitic resistance. An offset region can be formed between a channel region and the source region or the drain region due to the existence of the insulator 704. Fine processing achieving a size smaller than the minimum feature size of a photolithography process can be performed; thus, a semiconductor device with a gate electrode having a finer gate length can be obtained. The channel length of the transistor can be controlled with the thickness of the insulator 704. Further, the length of the offset region can be controlled between the channel region and the source region or the drain region.

The conductor 801 is processed using a CMP method, whereby the conductive patterns 901, 902, and 903 can be formed without using a photolithography process. Thus, simplification of manufacturing process of the semiconductor device, such as reducing the number of photomasks, can be achieved.

At least part of this embodiment can be implemented in combination with any of the embodiments described in this specification as appropriate.

Embodiment 3

An example of a method for manufacturing a semiconductor device of one embodiment of the present invention is described below with reference to FIGS. 10A to 10C, FIGS. 11A and 11B, FIGS. 12A and 12B, and FIGS. 13A and 13B. Note that cross sections of a FET portion, a capacitor, and a contact portion along lines a1-a2, b1-b2, and c1-c2 are shown in the drawings, respectively.

First, an insulator 1001 is provided. Then, a semiconductor 1002 is provided (FIG. 10A).

In addition to an insulator described later, a glass substrate, a quartz substrate, a silicon oxide film formed by a local oxidation of silicon (LOCOS) method, or the like can be used as the insulator 1001. In the case of using a glass substrate, a quartz substrate, or the like as the insulator 1001, a silicon oxide film, a silicon nitride film, a silicon oxynitride film, or a stacked film of these films is preferably provided between the insulator 1001 and the semiconductor 1002.

Next, a resist mask is formed over the semiconductor 1002 by a photolithography process or the like and an unnecessary portion of the semiconductor layer 1002 is removed, whereby an island-shaped semiconductor 1003 is formed. After that, the resist mask is removed (FIG. 10B). Also, as shown in FIG. 10B, when the unnecessary portion of the semiconductor layer 1002 is removed, a portion of the insulator 1001 is removed.

Next, a conductor 1004 is provided (FIG. 10C).

An insulator 1101 is provided over the conductor 1004 (FIG. 11A).

An insulator described later can be used as the insulator 1101. In particular, a film having planarity is appropriate.

The insulator 1101 is preferably formed using a low-dielectric constant material (also referred to as a low-k material) because the insulator 1101 also functions as an interlayer insulating film.

Next, a resist mask is formed over the insulator 1101 by a photolithography process or the like and unnecessary portions of the insulator 1101 and the conductor 1004 are removed. By the removal of the unnecessary portions of the conductor 1004, electrodes 1102 and 1103 that function as a source electrode and a drain electrode, an electrode 1104 of the capacitor, and a conductive pattern 1105 are formed. At that time, after the removal of the unnecessary portions of the insulator 1101, the unnecessary portions of the conductor 1004 may be removed before the resist mask is removed or after the resist mask is removed (FIG. 11B).

Next, an insulator 1201 is provided (FIG. 12A).

An insulator described later can be used as the insulator 1201; however, a film formed by an atomic layer deposition (ALD) method is preferably used. Using an ALD method, a thin insulator can be formed with a uniform thickness. Thus, the insulator with a uniform thickness can be formed over a top surface and side surfaces of the insulator 1101, side surfaces of the electrodes 1102 and 1103 which function as a source electrode and a drain electrode, side surfaces of the electrode 1104 of the capacitor and the conductive pattern 1105, and an exposed portion of the island-shaped semiconductor 1003.

Furthermore, part of the insulator 1201 is preferably formed using a high-dielectric constant material (also referred to as a high-k material) because the insulator 1201 also functions as a gate insulating film.

Next, a resist mask is formed over the insulator 1201 by a photolithography process or the like and unnecessary portions of the insulator 1101 and the insulator 1201 are removed. Accordingly, an opening or a groove 1202 is formed. After that, the resist mask is removed (FIG. 12B).

Figure 13A:
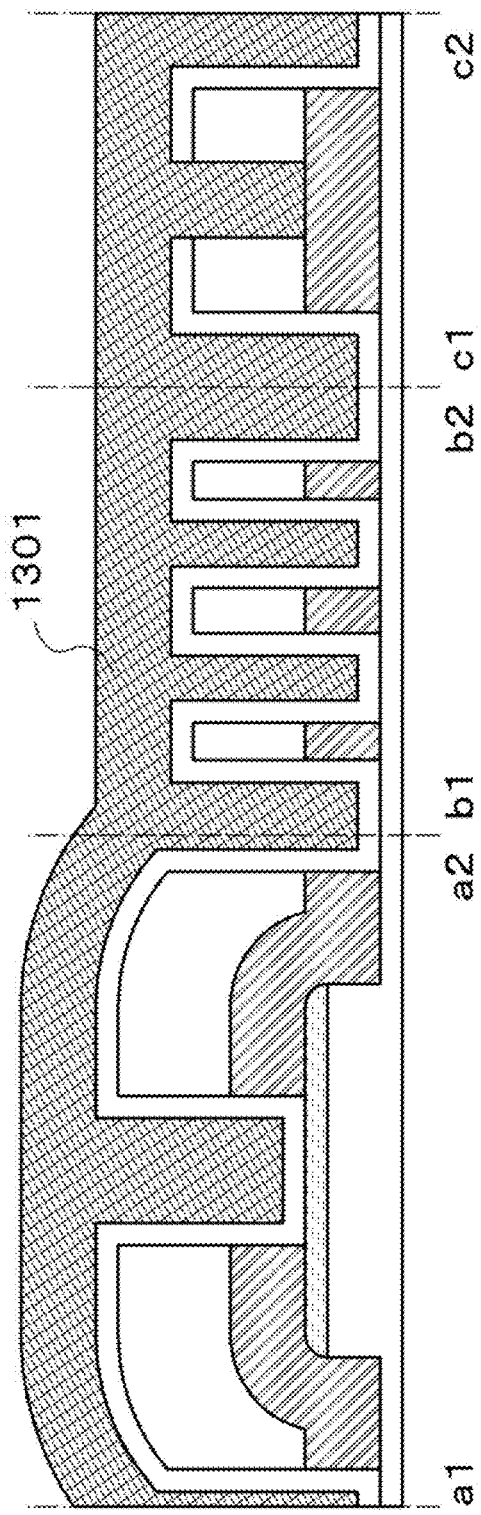
FIGS. 13A and 13B illustrate an example of the method for manufacturing a semiconductor device of the third embodiment.

Then, a conductor 1301 is provided (FIG. 13A).

A conductor described later can be used for the conductor 1301; however, a conductor formed by a metal organic CVD (MOCVD) method is preferably used. Using a conductor formed by a MOCVD method, a depressed portion of a surface over which a film is formed with a high aspect ratio can also be filled with the conductor.

Figure 13B:
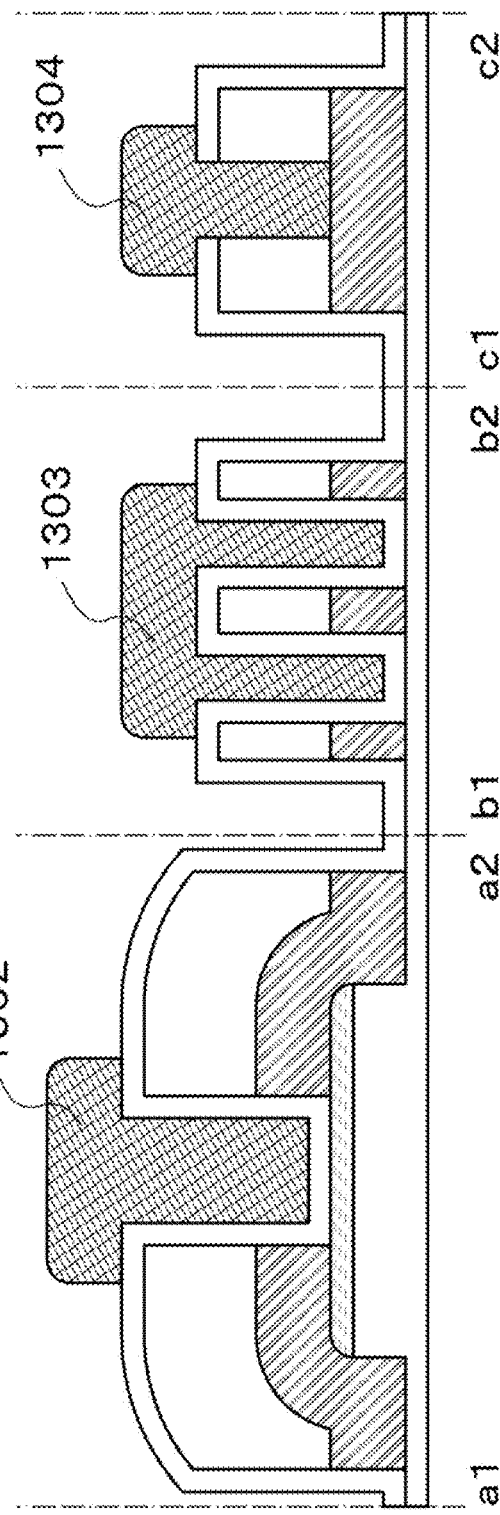

Next, a resist mask is formed over the conductor 1301 by a photolithography process or the like and an unnecessary portion of the conductor 1301 is removed. Accordingly, conductive patterns 1302, 1303, and 1304 are formed. After that, the resist mask is removed. Note that the conductive pattern 1302 functions as a gate electrode. The conductive pattern 1303 can form a capacitor in a portion facing the electrode 1104 with the insulator 1201 provided therebetween (FIG. 13B).

In the semiconductor device of one embodiment of the present invention, the FET portion, the capacitor, and the contact portion can be formed at the same time as shown in FIGS. 10A to 10C, FIGS. 11A and 11B, FIGS. 12A and 12B, and FIGS. 13A and 13B.

In the FET portion, parasitic capacitance between the electrode 1102 and the conductive pattern 1302, and between the electrode 1103 and the conductive pattern 1302 can be reduced due to the existence of the insulator 1101. Further, the operation speed of the semiconductor device can be improved by the reduction in parasitic capacitance. In particular, the operation speed at the time when the semiconductor device is changed from a first conducting state to a second conducting state can be improved. A large part of a source region or a drain region of the island-shaped semiconductor 1003 is made in contact with the electrode 1102 or the electrode 1103, whereby parasitic resistance can be reduced. Further, on-state current can be increased by the reduction in parasitic resistance. An offset region can be formed between a channel region and the source region or the drain region due to the existence of the insulator 1201. Fine processing achieving a size smaller than the minimum feature size of a photolithography process can be performed; thus, a semiconductor device with a gate electrode having a finer gate length can be obtained. The channel length of the transistor can be controlled with the thickness of the insulator 1201. Further, the length of the offset region can be controlled between the channel region and the source region or the drain region.

The conductor 1004 and the insulator 1101 are processed using the same mask, whereby simplification of manufacturing process of the semiconductor device, such as reducing the number of photomasks, can be achieved.

At least part of this embodiment can be implemented in combination with any of the embodiments described in this specification as appropriate.

Embodiment 4

An example of a method for manufacturing a semiconductor device of one embodiment of the present invention is described below with reference to FIGS. 14A and 14B, FIGS. 15A and 15B, FIGS. 16A and 16B, and FIGS. 17A and 17B. Note that cross sections of a FET portion, a capacitor, and a contact portion along lines a1-a2, b1-b2, and c1-c2 are shown in the drawings, respectively.

Figure 14A:
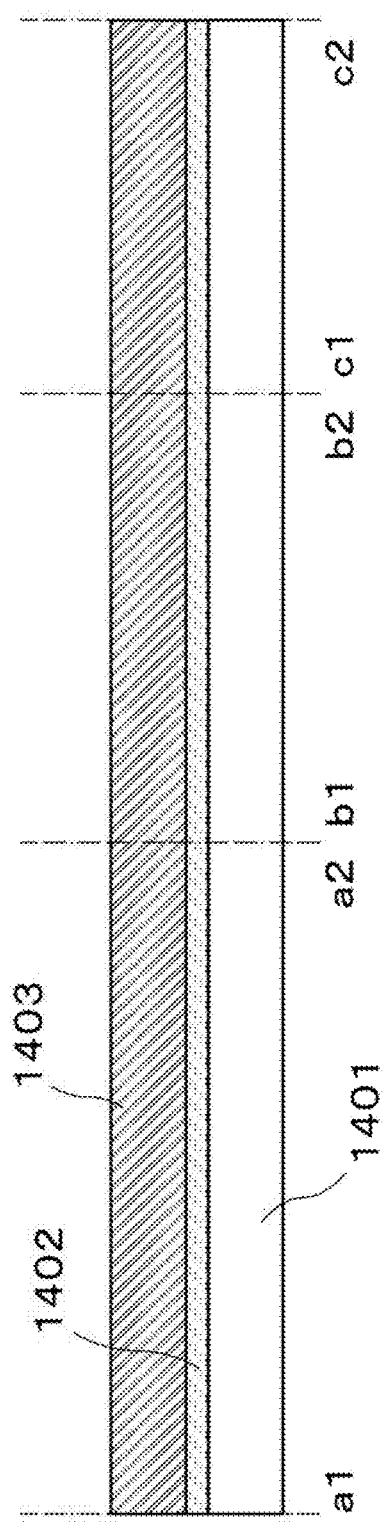
FIGS. 14A and 14B illustrate an example of a method for manufacturing a semiconductor device of a fourth embodiment.

First, an insulator 1401 is provided. Then, a semiconductor 1402 and a conductor 1403 are provided (FIG. 14A).

In addition to an insulator described later, a glass substrate, a quartz substrate, a silicon oxide film formed by a local oxidation of silicon (LOCOS) method, or the like can be used as the insulator 1401. In the case of using a glass substrate, a quartz substrate, or the like as the insulator 1401, a silicon oxide film, a silicon nitride film, a silicon oxnitiride film, or a stacked film of these films is preferably provided between the insulator 1401 and the semiconductor 1402.

Figure 14B:
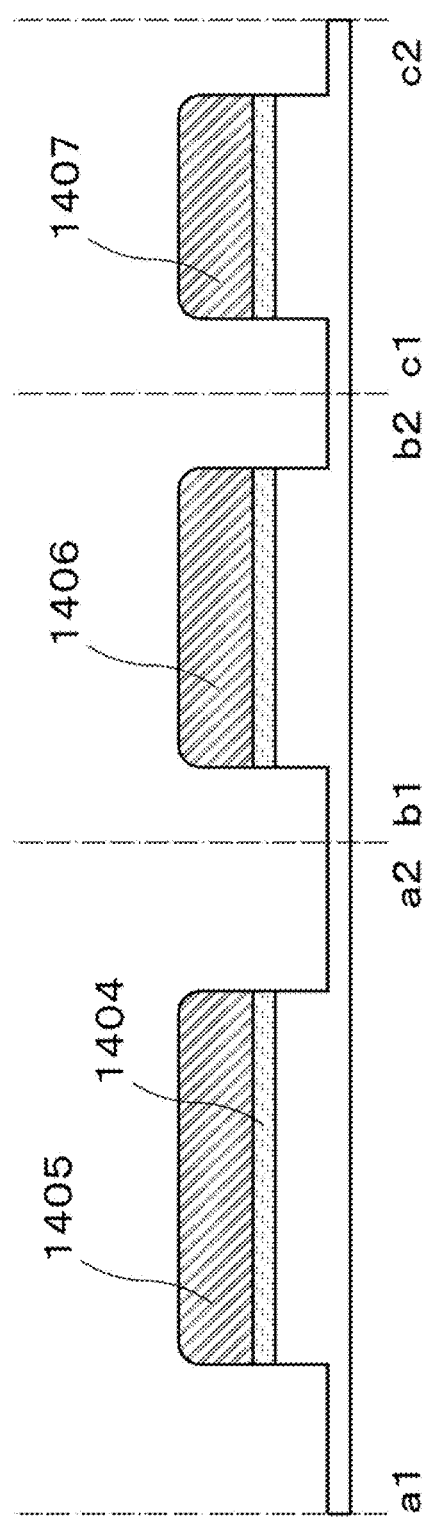

Next, a resist mask is formed over the conductor 1403 by a photolithography process or the like and unnecessary portions of the conductor 1403 and the semiconductor 1402 are removed, whereby a semiconductor 1404 and conductive patterns 1405, 1406, and 1407 are formed. After that, the resist mask is removed (FIG. 14B). Also, as shown in FIG. 14B, when the unnecessary portions of the conductor 1403 and the semiconductor 1402 are removed, a portion of the insulator 1401 is removed.

Next, an insulator 1501 is formed over the conductive patterns 1405, 1406, and 1407 (FIG. 15A).

For the insulator 1501, an insulator described later can be used. In particular, a film having planarity is appropriate.

The insulator 1501 is preferably formed using a low-dielectric constant material (also referred to as a low-k material) because the insulator 1501 also functions as an interlayer insulating film.

Next, a resist mask is formed over the insulator 1501 by a photolithography process or the like and an unnecessary portion of the insulator 1501 is removed. Then, by the removal of unnecessary portions of the conductive patterns 1405 and 1406, electrodes 1502 and 1503 that function as a source electrode and a drain electrode, an electrode 1504 of the capacitor, and openings or grooves 1510 and 1511 are formed. At that time, the unnecessary portions of the conductive patterns 1405 and 1406 may be removed before the resist mask is removed or after the resist mask is removed (FIG. 15B).

Figure 16A:
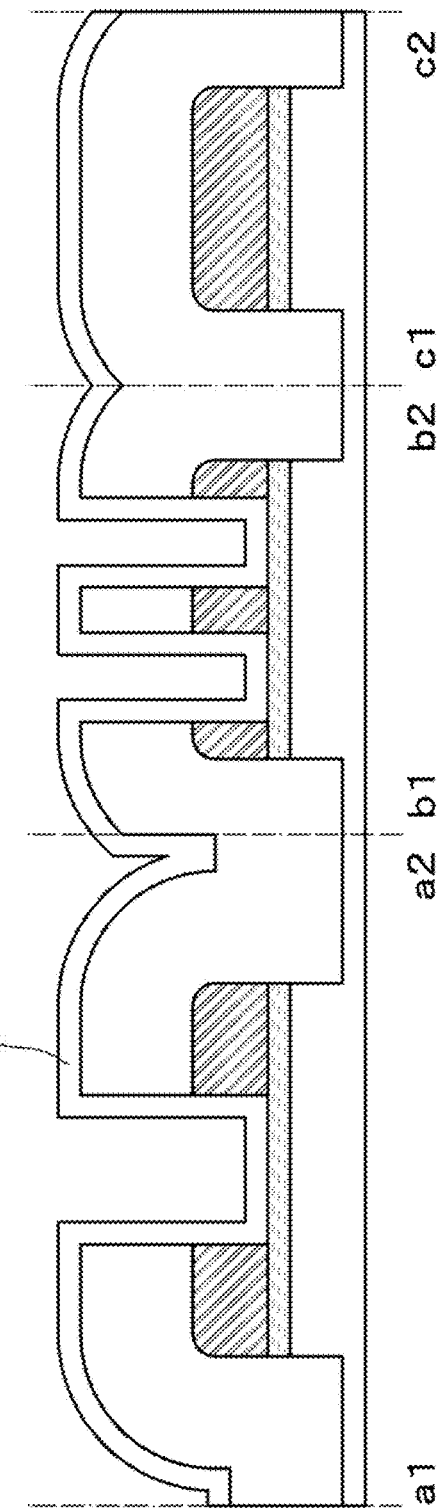
FIGS. 16A and 16B illustrate an example of the method for manufacturing a semiconductor device of the fourth embodiment.

Next, an insulator 1601 is provided (FIG. 16A).

An insulator described later can be used as the insulator 1601; however, a film formed by an atomic layer deposition (ALD) method is preferably used. Using an ALD method, a thin insulator can be formed with a uniform thickness. Thus, the insulator with a uniform thickness can be formed over the insulator 1501, inner walls of the openings or the grooves 1510 and 1511, and an exposed portion of the semiconductor 1404.

Furthermore, part of the insulator 1601 is preferably formed using a high-dielectric constant material (also referred to as a high-k material) because the insulator 1601 also functions as a gate insulating film.

Figure 16B:
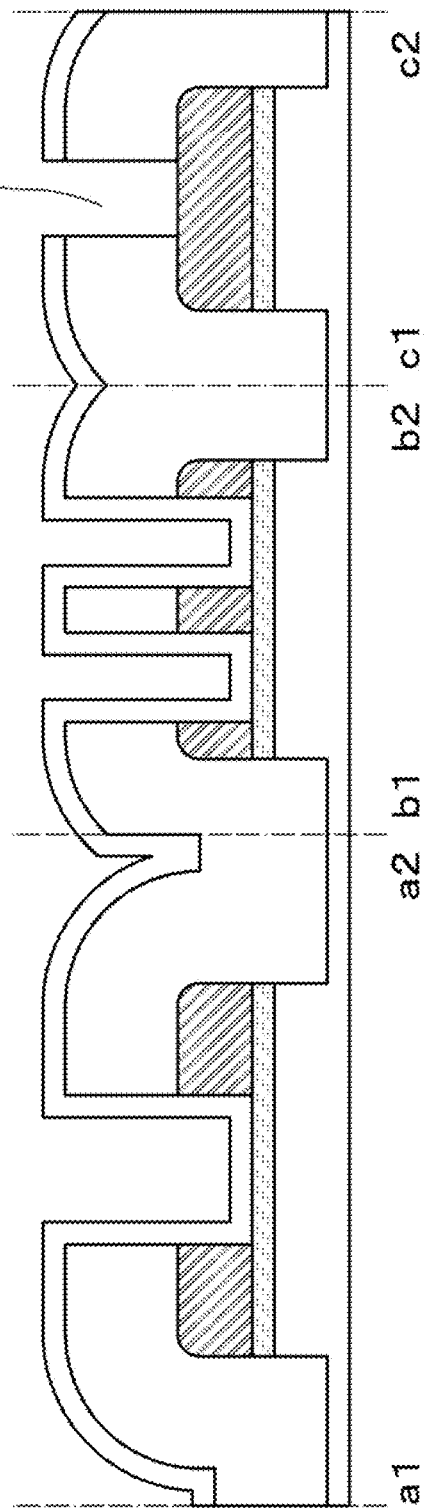

Next, a resist mask is formed over the insulator 1601 by a photolithography process or the like and unnecessary portions of the insulator 1601 and the insulator 1501 are removed. Accordingly, an opening or a groove 1610 is formed. After that, the resist mask is removed (FIG. 16B).

Next, a conductor 1701 is provided (FIG. 17A).

A conductor described later can be used for the conductor 1701; however, a conductor formed by a metal organic CVD (MOCVD) method is preferably used. Using a conductor formed by a MOCVD method, a depressed portion of a surface over which a film is formed with a high aspect ratio can also be filled with the conductor.

Next, a resist mask is formed over the conductor 1701 by a photolithography process or the like and an unnecessary portion of the conductor 1701 is removed. Accordingly, conductive patterns 1702, 1703, and 1704 are formed. After that, the resist mask is removed. Note that the conductive pattern 1702 functions as a gate electrode. The conductive pattern 1703 can form a capacitor in a portion facing the electrode 1504 with the insulator 1601 provided therebetween (FIG. 17B).

In the semiconductor device of one embodiment of the present invention, the FET portion, the capacitor, and the contact portion can be formed at the same time as shown in FIGS. 14A and 14B, FIGS. 15A and 15B, FIGS. 16A and 16B, and FIG. 17A In the FET portion, parasitic capacitance between the electrode 1502 and the conductive pattern 1702, and between the electrode 1503 and the conductive pattern 1702 can be reduced due to the existence of the insulator 1501. Further, the operation speed of the semiconductor device can be improved by the reduction in parasitic capacitance. In particular, the operation speed at the time when the semiconductor device is changed from a first conducting state to a second conducting state can be improved. A large part of a source region or a drain region of the semiconductor 1404 is made in contact with the electrode 1502 or the electrode 1503, whereby parasitic resistance can be reduced. Further, on-state current can be increased by the reduction in parasitic resistance. An offset region can be formed between a channel region and the source region or the drain region due to the existence of the insulator 1601. Fine processing achieving a size smaller than the minimum feature size of a photolithography process can be performed; thus, a semiconductor device with a gate electrode having a finer gate length can be obtained. The channel length of the transistor can be controlled with the thickness of the insulator 1601. Further, the length of the offset region can be controlled between the channel region and the source region or the drain region.

The semiconductor 1402 and the conductor 1403 are processed using the same mask, whereby simplification of manufacturing process of the semiconductor device, such as reducing the number of photomasks, can be achieved.

At least part of this embodiment can be implemented in combination with any of the embodiments described in this specification as appropriate.

Embodiment 5

An example of a method for manufacturing a semiconductor device of one embodiment of the present invention is described below with reference to FIGS. 18A and 18B, FIGS. 19A and 19B, FIGS. 20A and 20B, and FIG. 21. Note that cross sections of a FET portion, a capacitor, and a contact portion along lines a1-a2, b1-b2, and c1-c2 are shown in the drawings, respectively.

In Embodiment 5, a method for manufacturing a semiconductor device, which is a partial modification of the method for manufacturing a semiconductor device described in Embodiment 4, will be described.

First, the structure shown in FIG. 18A is obtained by a method similar to that described in Embodiment 4 with reference to FIGS. 14A and 14B.

Next, an insulator 1805 is provided using an insulator having planarity over conductive patterns 1801, 1802, and 1803, and a semiconductor 1804 (FIG. 18B).

The insulator 1805 is preferably formed using a low-dielectric constant material (also referred to as a low-k material) because the insulator 1805 also functions as an interlayer insulating film.

Figure 19A:
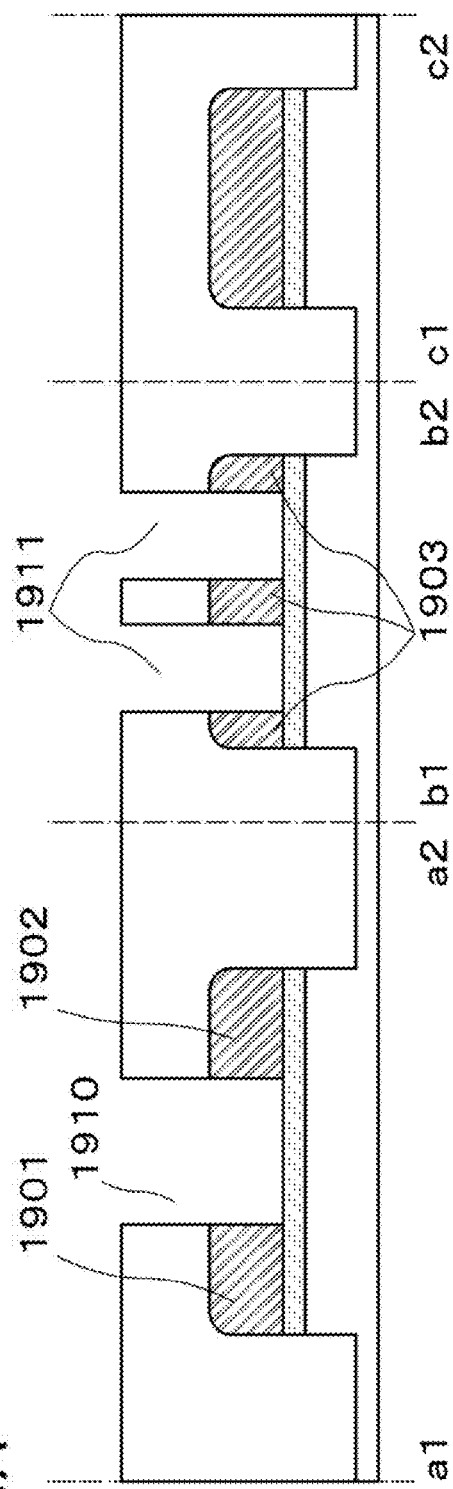
FIGS. 19A and 19B illustrate an example of the method for manufacturing a semiconductor device of the fifth embodiment.

Next, a resist mask is formed over the insulator 1805 by a photolithography process or the like and an unnecessary portion of the insulator 1805 is removed. Then, by the removal of unnecessary portions of the conductive patterns 1801 and 1802, electrodes 1901 and 1902 that function as a source electrode and a drain electrode, an electrode 1903 of the capacitor, and openings or grooves 1910 and 1911 are formed. At that time, the unnecessary portions of the conductive patterns 1801 and 1802 may be removed before the resist mask is removed or after the resist mask is removed (FIG. 19A).

Figure 19B:
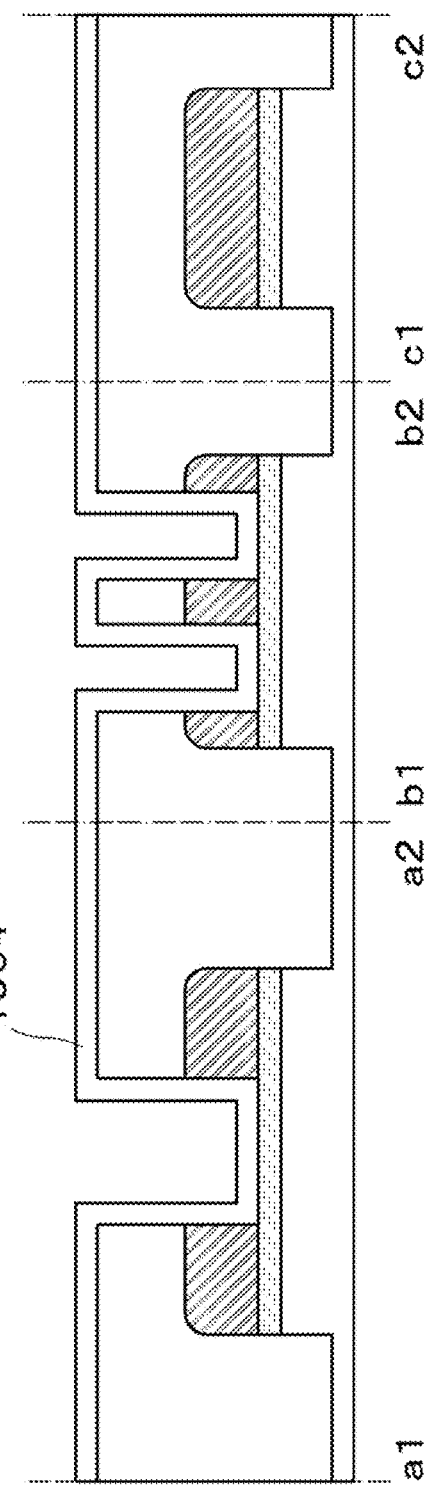

Next, an insulator 1904 is provided (FIG. 19B).

An insulator described later can be used as the insulator 1904; however, a film formed by an atomic layer deposition (ALD) method is preferably used. Using an ALD method, a thin insulator can be formed with a uniform thickness. Thus, the insulator with a uniform thickness can be formed over the insulator 1805, inner walls of the openings or the grooves 1910 and 1911, and an exposed portion of the semiconductor 1804.

Furthermore, part of the insulator 1904 is preferably formed using a high-dielectric constant material (also referred to as a high-k material) because the insulator 1904 also functions as a gate insulating film.

Next, a resist mask is formed over the insulator 1904 by a photolithography process or the like and unnecessary portions of the insulator 1904 and the insulator 1805 are removed. Accordingly, an opening or a groove 2010 is formed. After that, the resist mask is removed (FIG. 20A).

Then, a conductor 2001 is provided (FIG. 20B).

A conductor described later can be used for the conductor 2001; however, a conductor formed by a metal organic CVD (MOCVD) method is preferably used. By using MOCVD method, it is possible to fill with the conductor a depressed portion having a high aspect ratio.

Figure 21:
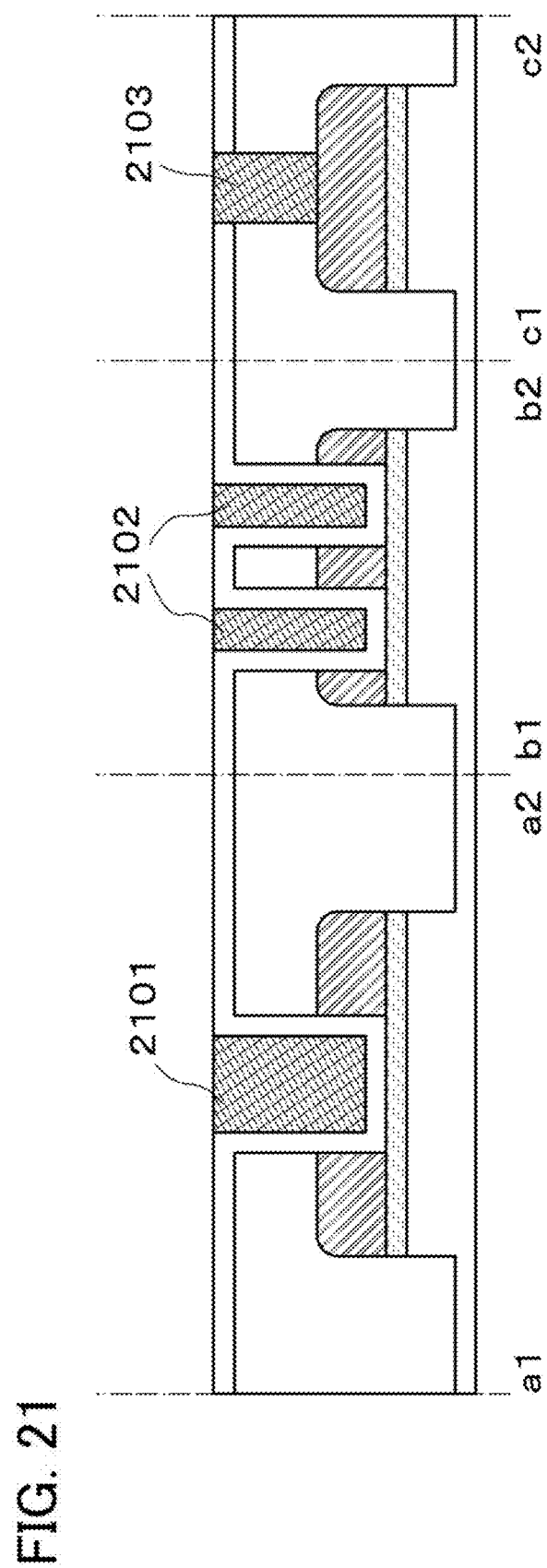
FIG. 21 illustrates an example of the method for manufacturing a semiconductor device of the fifth embodiment.

The conductor 2001 is processed using a chemical mechanical polishing (CMP) method, whereby conductive patterns 2101, 2102, and 2103 can be formed. Note that the conductive pattern 2101 has a function of a gate electrode. The conductive pattern 2102 can form a capacitor in a portion facing the electrode 1903 with the insulator 1904 provided therebetween. A dual damascene method or the like may be used for forming the conductive patterns 2101, 2102, and 2103, or the like (FIG. 21).

In the semiconductor device of one embodiment of the present invention, the FET portion, the capacitor, and the contact portion can be formed at the same time as shown in FIGS. 18A and 18B, FIGS. 19A and 19B, FIGS. 20A and 20B, and FIG. 21.

In the FET portion, parasitic capacitance between the electrode 1901 and the conductive pattern 2101, and between the electrode 1902 and the conductive pattern 2101 can be reduced due to the existence of the insulator 1805. Further, the operation speed of the semiconductor device can be improved by the reduction in parasitic capacitance. In particular, the operation speed at the time when the semiconductor device is changed from a first conducting state to a second conducting state can be improved. A large part of a source region or a drain region of the semiconductor is made in contact with the electrode 1901 or the electrode 1902, whereby parasitic resistance can be reduced. Further, on-state current can be increased by the reduction in parasitic resistance. An offset region can be formed between a channel region and the source region or the drain region due to the existence of the insulator 1904. Fine processing achieving a size smaller than the minimum feature size of a photolithography process can be performed; thus, a semiconductor device with a gate electrode having a finer gate length can be obtained. The channel length of the transistor can be controlled with the thickness of the insulator 1904. Further, the length of the offset region can be controlled between the channel region and the source region or the drain region.

The conductor 2001 is processed using a CMP method, whereby the conductive patterns 2101, 2102, and 2103 can be formed without using a photolithography process. Thus, simplification of manufacturing process of the semiconductor device, such as reducing the number of photomasks, can be achieved.

At least part of this embodiment can be implemented in combination with any of the embodiments described in this specification as appropriate.

Embodiment 6

Figure 22A:
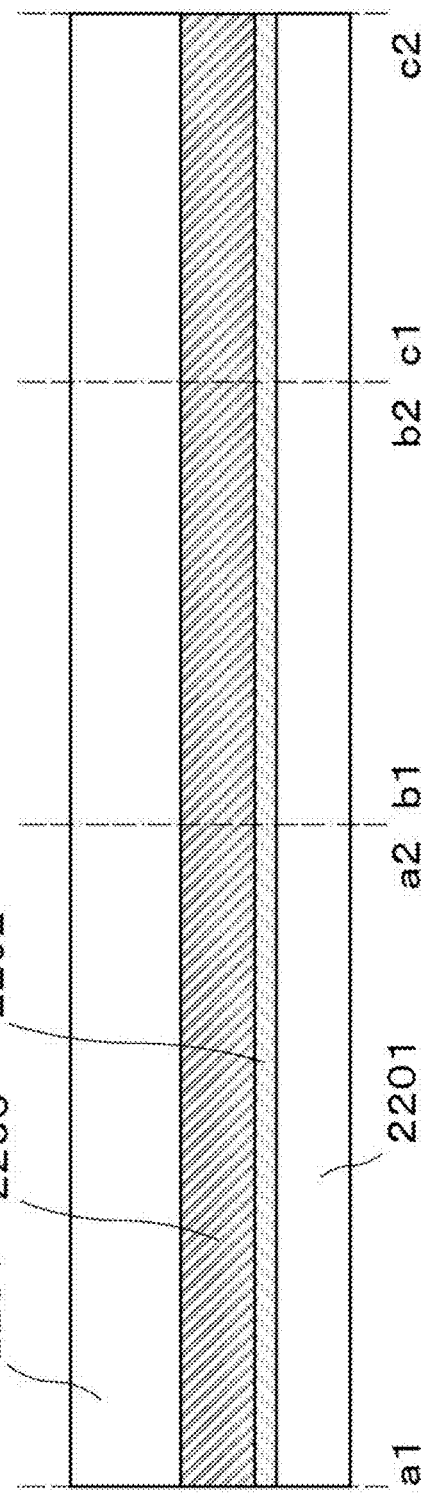
FIGS. 22A and 22B illustrate an example of a method for manufacturing a semiconductor device of a sixth embodiment.

An example of a method for manufacturing a semiconductor device of one embodiment of the present invention is described below with reference to FIGS. 22A and 22B, FIGS. 23A and 23B, FIGS. 24A and 24B, and FIG. 25. Note that cross sections of a FET portion, a capacitor, and a contact portion along lines a1-a2, b1-b2, and c1-c2 are shown in the drawings, respectively First, an insulator 2201 is provided. Then, a semiconductor 2202, a conductor 2203, and an insulator 2204 are sequentially provided (FIG. 22A).

In addition to an insulator described later, a glass substrate, a quartz substrate, a silicon oxide film formed by a local oxidation of silicon (LOCOS) method, or the like can be used as the insulator 2201. In the case of using a glass substrate, a quartz substrate, or the like as the insulator 2201, a silicon oxide film, a silicon nitride film, a silicon oxnitiride film, or a stacked film of these films is preferably provided between the insulator 2201 and the semiconductor 2202.

For the insulator 2204, an insulator described later can be used. In particular, a film having planarity is appropriate.

The insulator 2204 is preferably formed using a low-dielectric constant material (also referred to as a low-k material) because the insulator 2204 also functions as an interlayer insulating film.

Figure 22B:
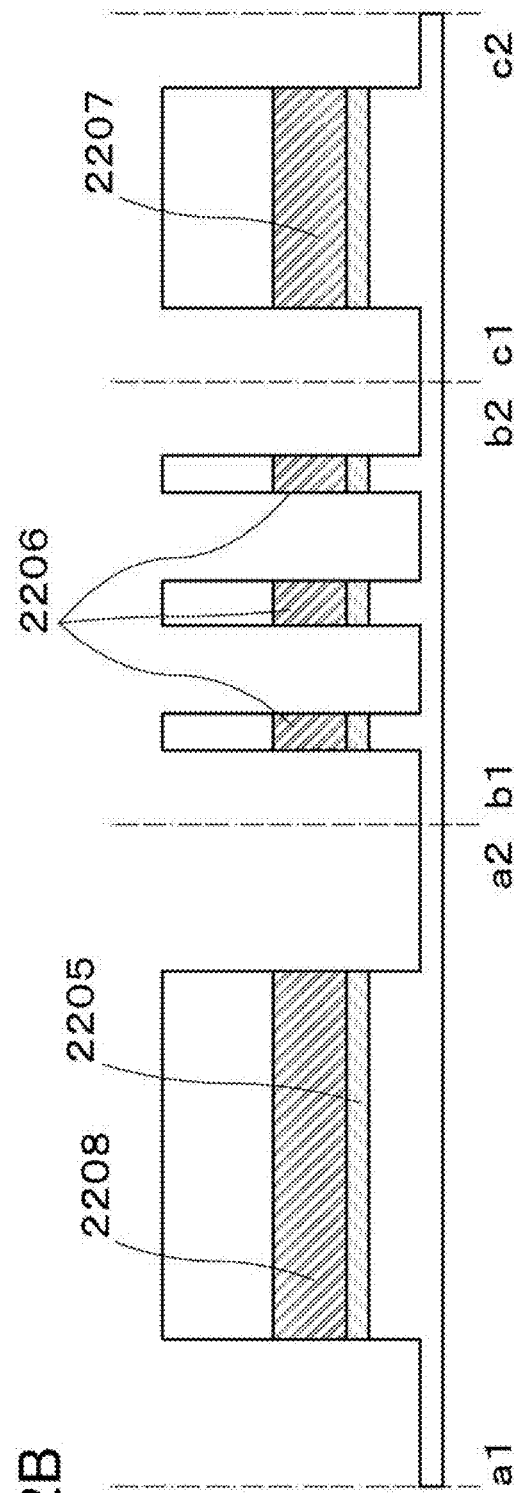

Next, a resist mask is formed over the insulator 2204 by a photolithography process or the like and unnecessary portions of the insulator 2204, the conductor 2203, and the semiconductor 2202 are removed. By the removal of unnecessary portions of the conductor 2203, conductive patterns 2206, 2207, and 2208, and a semiconductor 2205 are formed. At that time, after the removal of the unnecessary portions of the insulator 2204, the unnecessary portion of the conductor 2203 may be removed before the resist mask is removed or after the resist mask is removed. Also, when the unnecessary portions of the semiconductor 2202 are removed, a portion of the insulator 2201 may be removed. The conductive pattern 2206 functions as an electrode of the capacitor (FIG. 22B).

Next, a resist mask is again formed by a photolithography process or the like so that unnecessary portions of the insulator 2204 and the conductive pattern 2208 are removed, whereby electrodes 2301 and 2302 which function as a source electrode and a drain electrode are formed. At that time, unnecessary portions of the conductor 2208 may be removed before the resist mask is removed or after the resist mask is removed (FIG. 23A)

Next, an insulator 2303 is provided (FIG. 23B).

An insulator described later can be used as the insulator 2303; however, a film formed by an atomic layer deposition (ALD) method is preferably used. Using an ALD method, a thin insulator can be formed with a uniform thickness. Thus, the insulator with a uniform thickness can be formed over a top surface and side surfaces of the insulator 2204 in which the unnecessary portion is removed, side surfaces of the electrodes 2301 and 2302 which function as a source electrode and a drain electrode, side surfaces of the conductive patterns 2206 and 2207, and an exposed portion of the semiconductor 2205.

Furthermore, part of the insulator 2303 is preferably formed using a high-dielectric constant material (also referred to as a high-k material) because the insulator 2303 also functions as a gate insulating film.

Figure 24A:
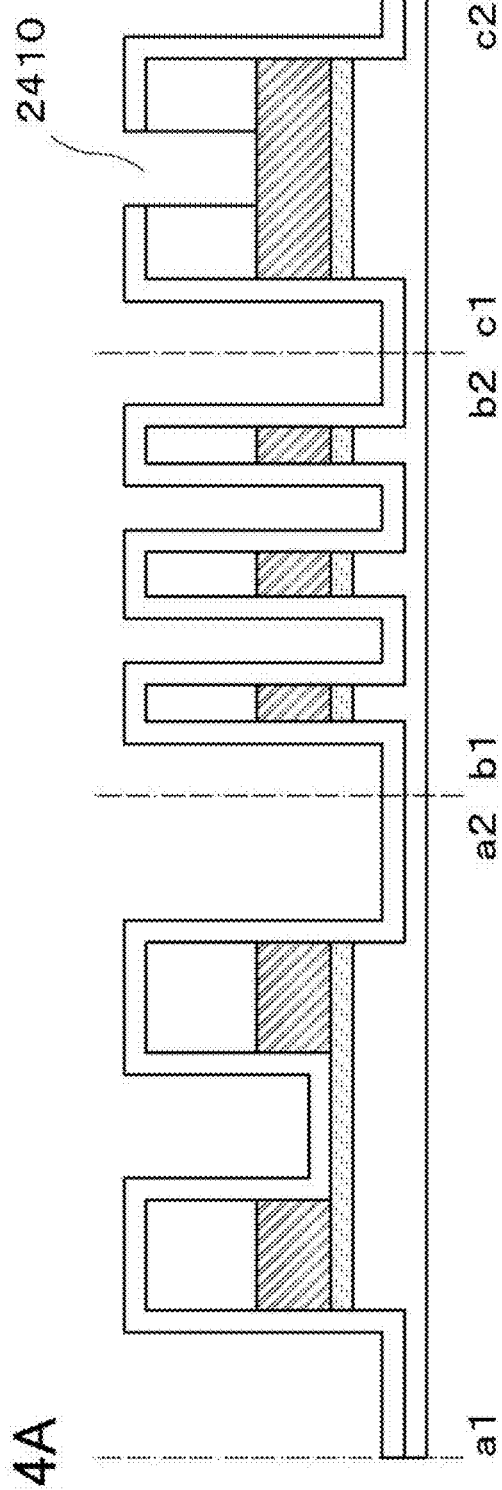
FIGS. 24A and 24B illustrate an example of the method for manufacturing a semiconductor device of the sixth embodiment.

Next, a resist mask is formed over the insulator 2303 by a photolithography process or the like and unnecessary portions of the insulator 2303 and the insulator 2204 are removed. Accordingly, an opening or a groove 2410 is formed. After that, the resist mask is removed (FIG. 24A).

Figure 24B:
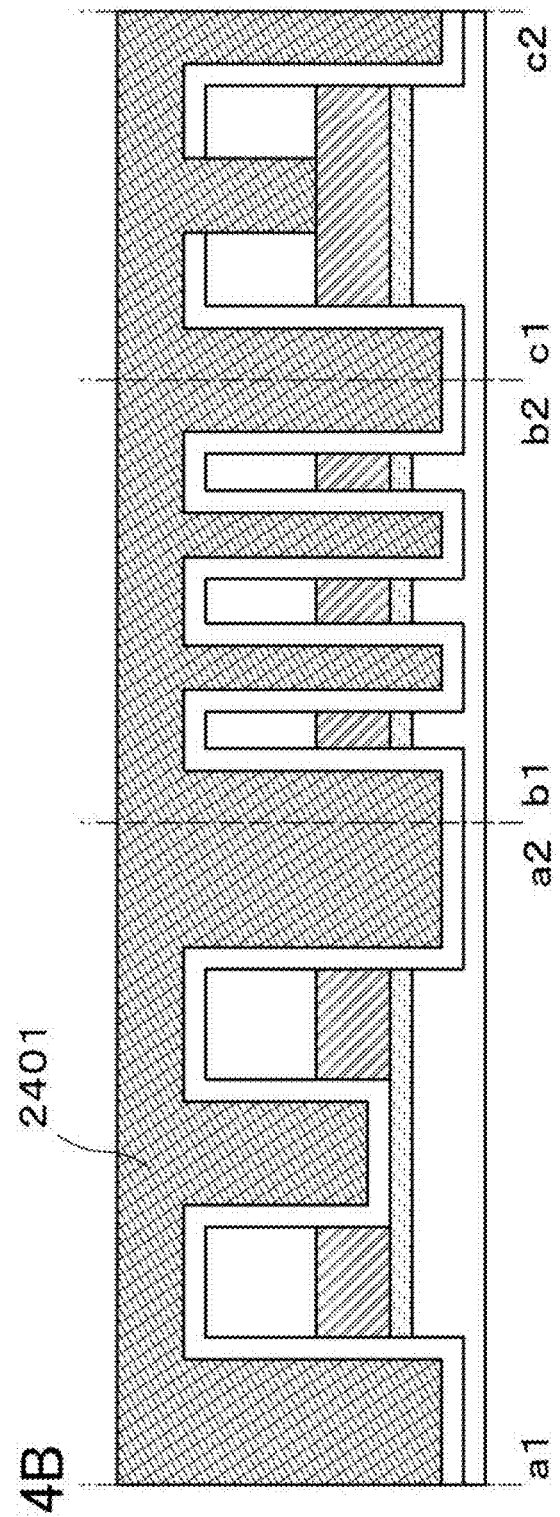

Next, a conductor 2401 is provided (FIG. 24B).

A conductor described later can be used for the conductor 2401; however, a conductor formed by a metal organic CVD (MOCVD) method is preferably used. Using a conductor formed by a MOCVD method, a depressed portion of a surface over which a film is formed with a high aspect ratio can also be filled with the conductor.

Next, a resist mask is formed over the conductor 2401 by a photolithography process or the like and an unnecessary portion of the conductor 2401 is removed. Accordingly, conductive patterns 2501, 2502, and 2503 are formed. After that, the resist mask is removed. Note that the conductive pattern 2501 functions as a gate electrode. The conductive pattern 2502 can form a capacitor in a portion facing the conductive pattern 2206 with the insulator 2303 provided therebetween (FIG. 25).

In the semiconductor device of one embodiment of the present invention, the FET portion, the capacitor, and the contact portion can be formed at the same time as shown in FIGS. FIGS. 22A and 22B, FIGS. 23A and 23B, FIGS. 24A and 24B, and FIG. 25.

In the FET portion, parasitic capacitance between the electrode 2301 and the conductive pattern 2501, and between the electrode 2302 and the conductive pattern 2501 can be reduced due to the existence of the insulator 2303. Further, the operation speed of the semiconductor device can be improved by the reduction in parasitic capacitance. In particular, the operation speed at the time when the semiconductor device is changed from a first conducting state to a second conducting state can be improved. A large part of a source region or a drain region of the semiconductor 2205 is made in contact with the electrode 2301 or the electrode 2302, whereby parasitic resistance can be reduced. Further, on-state current can be increased by the reduction in parasitic resistance. An offset region can be formed between a channel region and the source region or the drain region due to the existence of the insulator 2303. Fine processing achieving a size smaller than the minimum feature size of a photolithography process can be performed; thus, a semiconductor device with a gate electrode having a finer gate length can be obtained. The channel length of the transistor can be controlled with the thickness of the insulator 2303. Further, the length of the offset region can be controlled between the channel region and the source region or the drain region.

The semiconductor 2202, the conductor 2203, and the insulator 2204 are processed using the same mask, whereby simplification of manufacturing process of the semiconductor device, such as reducing the number of photomasks, can be achieved.

At least part of this embodiment can be implemented in combination with any of the embodiments described in this specification as appropriate.

Embodiment 7

An insulator, a semiconductor, and a conductor that can be favorably used for a semiconductor device of one embodiment of the present invention, and a formation method and a processing method thereof are described in this embodiment.

The insulator can be formed with a single layer or a stack using silicon oxide, silicon oxynitride, silicon nitride oxide, silicon nitride, aluminum oxide, aluminum oxynitride, aluminum nitride oxide, aluminum nitride, and the like.

As the high-dielectric constant material (also referred to as a high-k material) that can be used as the insulator, a metal oxide such as a tantalum oxide, a hafnium oxide, a hafnium silicate oxide, a zirconium oxide, an aluminum oxide, or a titanium oxide; or a rare-earth oxide such as a lanthanum oxide, can be used.

In the case of using an oxide semiconductor for the semiconductor, an oxide material from which oxygen is partly released due to heating is preferably used for the insulator. As the oxide material from which oxygen is released due to heating, oxide containing oxygen in excess of the stoichiometric composition is preferably used, for example. The oxide film containing oxygen in excess of the stoichiometric composition is an oxide film of which the amount of released oxygen converted into oxygen atoms is greater than or equal to $1.0 \times 10^{18}$ atoms/cm$^3$, and preferably greater than or equal to $3.0 \times 10^{20}$ atoms/cm$^3$ in thermal desorption spectroscopy (TDS) analysis. Note that the temperature of the film surface in the TDS analysis is preferably higher than or equal to 100° C. and lower than or equal to 700° C., or higher than or equal to 100° C. and lower than or equal to 500° C. For example, as such a material, a material containing silicon oxide or silicon oxynitride is preferably used. Alternatively, a metal oxide can be used. Note that in this specification, "silicon oxynitride" refers to a material that contains oxygen at a higher proportion than nitrogen, and "silicon nitride oxide" refers to a material that contains nitrogen at a higher proportion than oxygen.

The insulator may be formed by a sputtering method, a chemical vapor deposition (CVD) method (including a thermal CVD method, a metal organic CVD (MOCVD) method, a plasma enhanced CVD (PECVD) method, and the like), a molecular beam epitaxy (MBE) method, an atomic layer deposition (ALD) method, a pulsed laser deposition (PLD) method, or the like.

For the insulator having planarity, a heat-resistant organic material, such as polyimide, acrylic, benzocyclobutene, polyamide, or epoxy can be used. Other than such organic materials, it is also possible to use a siloxane-based resin, PSG (phosphosilicate glass), BPSG (borophosphosilicate glass), or the like. Note that the insulator may be formed by stacking a plurality of insulating films formed using these materials. The insulator formed using such materials can be formed by a method such as a CVD method, a sputtering method, an SOG method, spin coating, dipping, spray coating, or a droplet discharge method (e.g., an ink-jet method, or with a tool (equipment) such as a doctor knife, a roll coater, a curtain coater, or a knife coater.

As a method for forming the insulator having planarity, other than the above-described method, a chemical mechanical polishing (CMP) method can be used. After the formation of the insulator, the surface of the insulator is subjected to CMP treatment, so that a flat surface can be obtained.

For the semiconductor, a semiconductor such as a polycrystalline semiconductor, a microcrystalline semiconductor, an amorphous semiconductor, or a compound semiconductor can be used. For example, amorphous silicon, polycrystalline silicon or single crystal silicon, or such a semiconductor doped with an element belonging to Group 15 such as phosphorus of the periodic table may be used. Alternatively, an oxide semiconductor such as an In—Ga—Zn—O-based oxide semiconductor may be used.

A metal such as aluminum, titanium, chromium, nickel, copper, yttrium, zirconium, molybdenum, silver, tantalum, niobium, or tungsten, or an alloy material or a compound material containing any of these as its main component can be used for the conductor. Alternatively, polycrystalline silicon to which an impurity such as phosphorus is added can be used. The conductor may have a single-layer structure or a stack of a plurality of materials. For example, a single-layer structure of an aluminum film containing silicon, a two-layer structure in which an aluminum film is stacked over a titanium film, a two-layer structure in which an aluminum film is stacked over a tungsten film, a two-layer structure in which a copper film is stacked over a copper-magnesium-aluminum alloy film, a two-layer structure in which a copper film is stacked over a titanium film, a two-layer structure in which a copper film is stacked over a tungsten film, a three-layer structure in which a titanium film or a titanium nitride film, an aluminum film or a copper film, and a titanium film or a titanium nitride film are stacked in this order, a three-layer structure in which a molybdenum film or a molybdenum nitride film, an aluminum film or a copper film, and a molybdenum film or a molybdenum nitride film are stacked in this order, and the like can be given. When the metal nitride film is provided, adhesiveness of the metal film can be increased; thus, separation can be prevented. Note that a transparent conductive material containing indium oxide, tin oxide, or zinc oxide may be used.

The conductor can be formed by a sputtering method, an evaporation method, a CVD method, or the like. The CVD method can include a plasma enhanced CVD (PECVD) method using plasma, a thermal CVD (TCVD) method using heat, and the like. Moreover, the CVD method can include a metal CVD (MCVD) method and a metal organic CVD (MOCVD) method depending on a source gas. By using the PECVD method, a high-quality film can be formed at a relatively low temperature. By using the TCVD method, in which plasma is not used, a film can be formed with few defects because damage caused by plasma does not occur.

Here, a method for processing a film is described. In the case of finely processing a film, a variety of fine processing techniques can be used. For example, a method may be used in which a resist mask formed by a photolithography process or the like is subjected to thinning treatment. Alternatively, a method may be used in which a dummy pattern is formed by a photolithography process or the like, the dummy pattern is provided with a sidewall and is then removed, and a film is etched using the remaining sidewall as a resist mask. In order to achieve a high aspect ratio, anisotropic dry etching is preferably used for etching of a film. Alternatively, a hard mask formed of an inorganic film or a metal film may be used.

As light used to form the resist mask, light with an i-line (with a wavelength of 356 nm), light with a g-line (with a wavelength of 436 nm), light with an h-line (with a wavelength of 405 nm), or light in which the i-line, the g-line, and the h-line are mixed can be used. Alternatively, ultraviolet light, KrF laser light, ArF laser light, or the like can be used. Exposure may be performed by liquid immersion exposure technique. As the light for the exposure, extreme ultra-violet light (EUV) or X-rays may be used. Instead of the light for the exposure, an electron beam can be used. It is preferable to use extreme ultra-violet light (EUV), X-rays, or an electron beam because extremely minute processing can be performed. Note that in the case of performing exposure by scanning a beam such as an electron beam, a photomask is not needed.

An organic resin film having a function of improving adhesion between the film to be processed and a resist film may be formed before the resist film serving as a resist mask is formed. The organic resin film can be formed to planarize a surface by covering a step under the film by a spin coating method or the like, and thus can reduce variation in thickness of the resist mask over the organic resin film. In the case of fine processing, in particular, a material serving as a film having a function of preventing reflection of light for the exposure is preferably used for the organic resin film. Examples of such an organic resin film include bottom anti-reflection coating (BARC) film. The organic resin film may be removed at the same time as the removal of the resist mask or after the removal of the resist mask.

At least part of this embodiment can be implemented in combination with any of the embodiments described in this specification as appropriate.

Embodiment 8

An oxide semiconductor that can be favorably used for a semiconductor of a semiconductor device of one embodiment of the present invention is described in this embodiment.

An oxide semiconductor has a wide energy gap of 3.0 eV or more. A transistor including an oxide semiconductor film obtained by processing of the oxide semiconductor in an appropriate condition and a sufficient reduction in carrier density of the oxide semiconductor can have much lower leakage current between a source and a drain in an off state (off-state current) than a conventional transistor including silicon.

An applicable oxide semiconductor preferably contains at least indium (In) or zinc (Zn). In particular, In and Zn are preferably contained. In addition, as a stabilizer for reducing variation in electric characteristics of the transistor using the oxide semiconductor, one or more selected from gallium (Ga), tin (Sn), hafnium (Hf), zirconium (Zr), titanium (Ti), scandium (Sc), yttrium (Y), and an lanthanoid (such as cerium (Ce), neodymium (Nd), or gadolinium (Gd), for example) is preferably contained.

As the oxide semiconductor, for example, any of the following can be used: indium oxide, tin oxide, zinc oxide, an In—Zn-based oxide, a Sn—Zn-based oxide, an Al—Zn-based oxide, a Zn—Mg-based oxide, a Sn—Mg-based oxide, an In—Mg-based oxide, an In—Ga-based oxide, an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—Zr—Zn-based oxide, an In—Ti—Zn-based oxide, an In—Sc—Zn-based oxide, an In—Y—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

Here, an "In—Ga—Zn-based oxide" means an oxide containing In, Ga, and Zn as its main components and there is no particular limitation on the ratio of In, Ga, and Zn. The In—Ga—Zn-based oxide may contain another metal element in addition to In, Ga, and Zn.

Alternatively, a material represented by $InMO_3(ZnO)_m$ (m>0 is satisfied, and m is not an integer) may be used as an oxide semiconductor. Note that M represents one or more metal elements selected from Ga, Fe, Mn, and Co, or the above-described element as a stabilizer. Alternatively, as the oxide semiconductor, a material represented by a chemical formula, $In_2SnO_5(ZnO)_n$ (n>0, n is a natural number) may be used.

For example, In—Ga—Zn-based oxide with an atomic ratio of In:Ga:Zn=1:1:1, 1:3:2, 1:3:4, 1:3:6, 3:1:2, or 2:1:3, or an oxide whose composition is in the neighborhood of the above compositions may be used.

When an oxide semiconductor film contains a large amount of hydrogen, the hydrogen and an oxide semiconductor are bonded to each other, so that a donor level might be formed owing to the hydrogen in the oxide semiconductor film. For example, donor levels might be formed by entry of hydrogen in sites of oxygen vacancies. As a result, the threshold voltage of the transistor shifts in the negative direction. Therefore, it is preferable that, after formation of the oxide semiconductor film, dehydration treatment (dehydrogenation treatment) be performed to remove hydrogen or moisture from the oxide semiconductor film so that the oxide semiconductor film is highly purified to contain impurities as little as possible.

Note that oxygen in the oxide semiconductor film is also reduced by the dehydration treatment (dehydrogenation treatment) in some cases. Therefore, it is preferable that oxygen whose amount is reduced in the dehydration treatment (dehydrogenation treatment) be added to the oxide semiconductor or oxygen be supplied to fill the oxygen vacancies in the oxide semiconductor film. In this specification and the like, supplying oxygen to an oxide semiconductor film may be expressed as oxygen adding treatment, and treatment for making the oxygen content of an oxide semiconductor film be in excess of that in the stoichiometric composition may be expressed as treatment for making an oxygen-excess state.

In this manner, hydrogen or moisture is removed from the oxide semiconductor film by the dehydration treatment (dehydrogenation treatment) and oxygen vacancies therein are filled by the oxygen adding treatment, whereby the oxide semiconductor film can be turned into an i-type (intrinsic) oxide semiconductor film or a substantially i-type (intrinsic) oxide semiconductor film which is extremely close to an i-type oxide semiconductor film. Note that "substantially intrinsic" means that the oxide semiconductor film contains extremely few (close to zero) carriers derived from a donor and has a carrier density which is lower than $1\times10^{17}/cm^3$, lower than $1\times10^{15}/cm^3$, or lower than $1\times10^{13}/cm^3$.

Thus, the transistor including an i-type or substantially i-type oxide semiconductor film can have extremely favorable off-state current characteristics. For example, the drain current at the time when the transistor including an oxide semiconductor film is in an off-state can be less than or equal to $1\times10^{-18}$ A, preferably less than or equal to $1\times10^{-21}$ A, further preferably less than or equal to $1\times10^{-18}$ A at room temperature (about 25° C.); or less than or equal to $1\times10^{-15}$ A, preferably less than or equal to $1\times10^{-18}$ A, further preferably less than or equal to $1\times10^{-21}$ A at 85° C. Note that an off state of an n-channel transistor refers to a state where the gate voltage is sufficiently lower than the threshold voltage. Specifically, the transistor is in an off state when the gate voltage is lower than the threshold voltage by 1V or more, 2V or more, or 3V or more.

A structure of the oxide semiconductor film is described below.

An oxide semiconductor film is classified roughly into a single-crystal oxide semiconductor film and a non-single-crystal oxide semiconductor film. The non-single-crystal oxide semiconductor film includes any of a c-axis aligned crystalline oxide semiconductor (CAAC-OS) film, a polycrystalline oxide semiconductor film, a microcrystalline oxide semiconductor film, an amorphous oxide semiconductor film, and the like.

First, a CAAC-OS film is described.

The CAAC-OS film is one of oxide semiconductor films having a plurality of c-axis aligned crystal parts.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology that reflects a surface over which the CAAC-OS film is formed (hereinafter, a surface over which the CAAC-OS film is formed is referred to as a formation surface) or a top surface of the CAAC-OS film, and is arranged parallel to the formation surface or the top surface of the CAAC-OS film.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

FIG. 26A is a cross-sectional TEM image of a CAAC-OS film. FIG. 26B is a cross-sectional TEM image obtained by enlarging the image of FIG. 26A. In FIG. 26B, atomic order is highlighted for easy understanding.

FIG. 26C shows Fourier transform images of regions each surrounded by a circle (diameter is approximately 4 nm) between A and O and between O and A' in FIG. 26A. C-axis alignment can be observed in each region in FIG. 26C. The c-axis direction between A and O is different from that between O and A', which indicates that a grain in the region between A and O is different from that between O and A'. In addition, between A and O, the angle of the c-axis continuously and gradually changes from 14.3°, 16.6° to 26.4°. Similarly, between O and A', the angle of the c-axis continuously changes from −18.3°, −17.6°, to −15.9°.

Figure 27A:
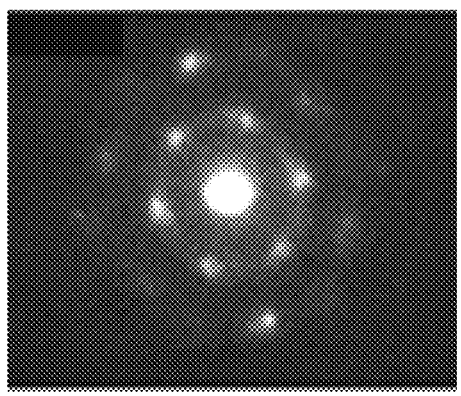
FIGS. 27A and 27B show nanobeam electron diffraction patterns of oxide semiconductor films.

Note that in an electron diffraction pattern of the CAAC-OS film, spots (bright spots) having alignment are shown. For example, when electron diffraction with an electron beam having a diameter of 1 to 30 nm (such electron diffraction is also referred to as nanobeam electron diffraction) is performed on the top surface of the CAAC-OS film, spots are observed (see FIG. 27A).

From the results of the cross-sectional TEM image and the plan TEM image, alignment is found in the crystal parts in the CAAC-OS film.

Most of the crystal parts included in the CAAC-OS film each fit inside a cube whose one side is less than 100 nm. Thus, there is a case where a crystal part included in the CAAC-OS film fits inside a cube whose one side is less than 10 nm, less than 5 nm, or less than 3 nm. Note that when a plurality of crystal parts included in the CAAC-OS film are connected to each other, one large crystal region is formed in some cases. For example, a crystal region with an area of 2500 nm$^2$ or more, 5 mm$^2$ or more, or 1000 mm$^2$ or more is observed in some cases in the plan TEM image.

A CAAC-OS film is subjected to structural analysis with an X-ray diffraction (XRD) apparatus. For example, when the CAAC-OS film including an InGaZnO$_4$ crystal is analyzed by an out-of-plane method, a peak appears frequently when the diffraction angle (2θ) is around 31°. This peak is derived from the (009) plane of the InGaZnO$_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the InGaZnO$_4$ crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of InGaZnO$_4$, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film having c-axis alignment, while the directions of a-axes and b-axes are irregularly oriented between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where a shape of the CAAC-OS film is changed by etching or the like, the c-axis might not be necessarily parallel to a normal vector of a formation surface or a normal vector of a top surface of the CAAC-OS film.

Further, distribution of c-axis aligned crystal parts in the CAAC-OS film is not necessarily uniform. For example, in the case where crystal growth leading to the crystal parts of the CAAC-OS film occurs from the vicinity of the top surface of the film, the proportion of the c-axis aligned crystal parts in the vicinity of the top surface is higher than that in the vicinity of the formation surface in some cases. Further, when an impurity is added to the CAAC-OS film, a region to which the impurity is added is altered, and the proportion of the c-axis aligned crystal parts in the CAAC-OS film varies depending on regions, in some cases.

Note that when the CAAC-OS film with an InGaZnO$_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ not appear at around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. Further, a heavy metal such as iron or nickel, argon, carbon dioxide, or the like has a large atomic radius (molecular radius), and thus disturbs the atomic arrangement of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. In some cases, oxygen vacancies in the oxide semiconductor film serve as carrier traps or serve as carrier generation sources when hydrogen is captured therein.

The state in which impurity concentration is low and density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Thus, a transistor including the oxide semiconductor film rarely has negative threshold voltage (is rarely normally on). The highly purified intrinsic or substantially highly purified intrinsic oxide semiconductor film has a low density of defect states, and thus has few carrier traps. Accordingly, the transistor including the oxide semiconductor film has little variation in electrical characteristics and high reliability. Electric charge trapped by the carrier traps in the oxide semiconductor film takes a long time to be released, and might behave like fixed electric charge. Thus, the transistor which includes the oxide semiconductor film having high impurity concentration and a high density of defect states has unstable electrical characteristics in some cases.

With the use of the CAAC-OS film in a transistor, variation in the electrical characteristics of the transistor due to irradiation with visible light or ultraviolet light is small.

Next, a polycrystalline oxide semiconductor film is described.

In an image obtained with a TEM, for example, crystal grains can be found in the polycrystalline oxide semiconductor film. In most cases, the size of a crystal grain in the polycrystalline oxide semiconductor film is greater than or equal to 2 nm and less than or equal to 300 nm, greater than or equal to 3 nm and less than or equal to 100 nm, or greater than or equal to 5 nm and less than or equal to 50 nm in an image obtained with the TEM, for example. Moreover, in an image obtained with the TEM, a boundary between crystals can be found in the polycrystalline oxide semiconductor film in some cases.

The polycrystalline oxide semiconductor film may include a plurality of crystal grains, and alignment of crystals may be different in the plurality of crystal grains. A polycrystalline oxide semiconductor film is subjected to structural analysis with an XRD apparatus. For example, when the polycrystalline oxide semiconductor film including an $InGaZnO_4$ crystal is analyzed by an out-of-plane method, peaks of $2\theta$ appear at around 31°, 36°, and the like in some cases.

The polycrystalline oxide semiconductor film has high crystallinity and thus has high electron mobility in some cases. Accordingly, a transistor including the polycrystalline oxide semiconductor film has high field-effect mobility. Note that there are cases in which an impurity is segregated at the grain boundary between the crystals in the polycrystalline oxide semiconductor film. Moreover, the grain boundary of the polycrystalline oxide semiconductor film becomes a defect state. Since the grain boundary of the polycrystalline oxide semiconductor film may serve as a carrier trap or a carrier generation source, a transistor including the polycrystalline oxide semiconductor film has larger variation in electrical characteristics and lower reliability than a transistor including a CAAC-OS film in some cases.

Next, a microcrystalline oxide semiconductor film is described.

In an image obtained with the TEM, crystal parts cannot be found clearly in the microcrystalline oxide semiconductor in some cases. In most cases, a crystal part in the microcrystalline oxide semiconductor is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as an nc-OS (nanocrystalline oxide semiconductor) film. In an image obtained with TEM, a crystal grain boundary cannot be found clearly in the nc-OS film in some cases.

Figure 27B:
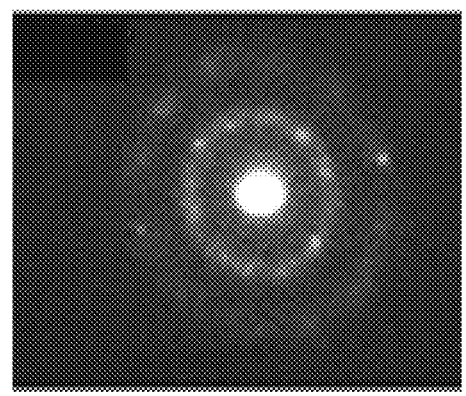

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic order. Note that there is no regularity of crystal orientation between different crystal parts in the nc-OS film. Thus, the orientation of the whole film is not observed. Accordingly, in some cases, the nc-OS film cannot be distinguished from an amorphous oxide semiconductor depending on an analysis method. For example, when the nc-OS film is subjected to structural analysis by an out-of-plane method with an XRD apparatus using an X-ray having a diameter larger than that of a crystal part, a peak which shows a crystal plane does not appear. Further, a halo pattern is shown in a selected-area electron diffraction pattern of the nc-OS film which is obtained by using an electron beam having a probe diameter (e.g., greater than or equal to 50 nm) larger than the diameter of a crystal part. Meanwhile, spots are shown in a nanobeam electron diffraction pattern of the nc-OS film obtained by using an electron beam having a probe diameter close to, or smaller than the diameter of a crystal part. Further, in a nanobeam electron diffraction pattern of the nc-OS film, regions with high luminance in a circular (ring) pattern are shown in some cases. Also in a nanobeam electron diffraction pattern of the nc-OS film, a plurality of spots are shown in a ring-like region in some cases (see FIG. 27B).

The nc-OS film is an oxide semiconductor film that has high regularity as compared to an amorphous oxide semiconductor film. Therefore, the nc-OS film has a lower density of defect states than an amorphous oxide semiconductor film. However, there is no regularity of crystal orientation between different crystal parts in the nc-OS film; hence, the nc-OS film has a higher density of defect states than the CAAC-OS film.

Thus, the nc-OS film may have a higher carrier density than the CAAC-OS film. The oxide semiconductor film having a high carrier density may have high electron mobility. Thus, a transistor including the nc-OS film may have high field-effect mobility. The nc-OS film has a higher defect state density than the CAAC-OS film, and thus may have a lot of carrier traps. Consequently, a transistor including the nc-OS film has larger variation in electrical characteristics and lower reliability than a transistor including the CAAC-OS film. The nc-OS film can be formed easily as compared to the CAAC-OS film because nc-OS film can be formed even when a relatively large amount of impurities are included; thus, depending on the purpose, the nc-OS film can be favorably used in some cases. Therefore, a semiconductor device including the transistor including the nc-OS film can be manufactured with high productivity in some cases.

Next, an amorphous oxide semiconductor film is described.

The amorphous oxide semiconductor film has disordered atomic arrangement and no crystal part. For example, the amorphous oxide semiconductor film does not have a specific state like quartz.

In an image obtained with a TEM, crystal parts cannot be found in the amorphous oxide semiconductor film.

When the amorphous oxide semiconductor film is subjected to structural analysis by an out-of-plane method with an XRD apparatus, a peak which shows a crystal plane does not appear. A halo pattern is shown in an electron diffraction pattern of the amorphous oxide semiconductor film. Further, a halo pattern is shown but a spot is not shown in a nanobeam electron diffraction pattern of the amorphous oxide semiconductor film.

The amorphous oxide semiconductor film contains impurities such as hydrogen at a high concentration. In addition, the amorphous oxide semiconductor film has a high density of defect states.

The oxide semiconductor film having a high impurity concentration and a high density of defect states has many carrier traps or many carrier generation sources.

Accordingly, the amorphous oxide semiconductor film has a much higher carrier density than the nc-OS film. Therefore, a transistor including the amorphous oxide semiconductor film tends to be normally on. Thus, in some cases, such an amorphous oxide semiconductor layer can be applied to a transistor which needs to be normally on. Since the amorphous oxide semiconductor film has a high density of defect states, carrier traps might be increased. Consequently, a transistor including the amorphous oxide semiconductor film has larger variation in electrical characteristics and lower reliability than a transistor including the CAAC-OS film or the nc-OS film.

Next, a single-crystal oxide semiconductor film is described.

The single-crystal oxide semiconductor film has a lower impurity concentration and a lower density of defect states (few oxygen vacancies). Thus, the carrier density can be decreased. Accordingly, a transistor including the single-crystal oxide semiconductor film is unlikely to be normally on. Moreover, since the single-crystal oxide semiconductor film has a lower impurity concentration and a lower density of defect states, carrier traps might be reduced. Thus, the transistor including the single-crystal oxide semiconductor film has small variation in electrical characteristics and accordingly has high reliability.

Note that when the oxide semiconductor film has few defects, the density thereof is increased. When the oxide semiconductor film has high crystallinity, the density thereof is increased. When the oxide semiconductor film has a lower concentration of impurities such as hydrogen, the density thereof is increased. The single-crystal oxide semiconductor film has a higher density than the CAAC-OS film. The CAAC-OS film has a higher density than the microcrystalline oxide semiconductor film. The polycrystalline oxide semiconductor film has a higher density than the microcrystalline oxide semiconductor film. The microcrystalline oxide semiconductor film has a higher density than the amorphous oxide semiconductor film.

Note that an oxide semiconductor film may be a stacked film including two or more kinds of an amorphous oxide semiconductor film, a microcrystalline oxide semiconductor film, and a CAAC-OS film, for example.

In the case where the oxide semiconductor film has a plurality of structures, the structures can be analyzed using nanobeam electron diffraction in some cases.

Figure 27C:
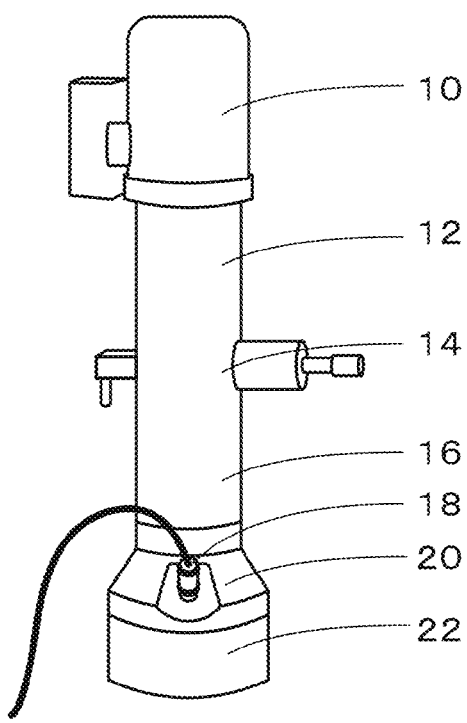
FIGS. 27C and 27D illustrate an example of a transmission electron diffraction measurement apparatus.

FIG. 27C illustrates a transmission electron diffraction measurement apparatus which includes an electron gun chamber 10, an optical system 12 below the electron gun chamber 10, a sample chamber 14 below the optical system 12, an optical system 16 below the sample chamber 14, an observation chamber 20 below the optical system 16, a camera 18 installed in the observation chamber 20, and a film chamber 22 below the observation chamber 20. The camera 18 is provided to face toward the inside of the observation chamber 20. Note that the film chamber 22 is not necessarily provided.

Figure 27D:
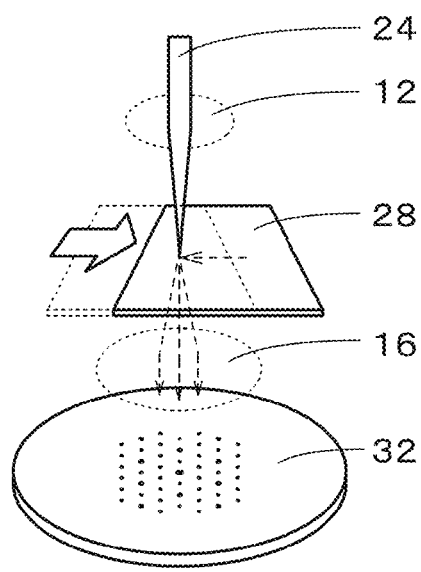

FIG. 27D illustrates the internal structure of the transmission electron diffraction measurement apparatus in FIG. 27C. In the transmission electron diffraction measurement apparatus, a substance 28 which is positioned in the sample chamber 14 is irradiated with electrons emitted from an electron gun installed in the electron gun chamber 10 through the optical system 12. Electrons passing through the substance 28 enter a fluorescent plate 32 provided in the observation chamber 20 through the optical system 16. On the fluorescent plate 32, a pattern corresponding to the intensity of entered electron appears, which allows measurement of a transmission electron diffraction pattern.

The camera 18 is installed so as to face the fluorescent plate 32 and can take a picture of a pattern appearing in the fluorescent plate 32. An angle formed by a straight line which passes through the center of a lens of the camera 18 and the center of the fluorescent plate 32 and an upper surface of the fluorescent plate 32 is, for example, 15° or more and 80° or less, 30° or more and 75° or less, or 45° or more and 70° or less. As the angle is reduced, distortion of the transmission electron diffraction pattern taken by the camera 18 becomes larger. Note that if the angle is obtained in advance, the distortion of an obtained transmission electron diffraction pattern can be corrected. Note that the film chamber 22 may be provided with the camera 18. For example, the camera 18 may be set in the film chamber 22 so as to be opposite to the incident direction of electrons 24. In this case, a transmission electron diffraction pattern with less distortion can be taken from the rear surface of the fluorescent plate 32.

A holder for fixing the substance 28 that is a sample is provided in the sample chamber 14. The holder transmits electrons passing through the substance 28. The holder may have, for example, a function of moving the substance 28 in the direction of the X, Y, and Z axes. The movement function of the holder may have an accuracy of moving the substance in the range of, for example, 1 nm to 10 nm, 5 nm to 50 nm, 10 nm to 100 nm, 50 nm to 500 nm, and 100 nm to 1 μm. The range is preferably determined to be an optimal range for the structure of the substance 28.

Then, a method for measuring a transmission electron diffraction pattern of a substance by the transmission electron diffraction measurement apparatus described above will be described.

For example, changes in the structure of a substance can be observed by changing the irradiation position of the electrons 24 that are a nanobeam in the substance (or by scanning) as illustrated in FIG. 27D. At this time, when the substance 28 is a CAAC-OS film, a diffraction pattern shown in FIG. 27A can be observed. When the substance 28 is an nc-OS film, a diffraction pattern shown in FIG. 27B can be observed.

Even when the substance 28 is a CAAC-OS film, a diffraction pattern similar to that of an nc-OS film or the like is partly observed in some cases. Therefore, whether or not a CAAC-OS film is favorable can be determined by the proportion of a region where a diffraction pattern of a CAAC-OS film is observed in a predetermined area (also referred to as proportion of CAAC). In the case of a high quality CAAC-OS film, for example, the proportion of CAAC is higher than or equal to 50%, preferably higher than or equal to 80%, further preferably higher than or equal to 90%, still further preferably higher than or equal to 95%.

Note that a proportion of a region other than that of the CAAC region is referred to as the proportion of non-CAAC.

For example, transmission electron diffraction patterns were obtained by scanning a top surface of a sample including a CAAC-OS film obtained just after deposition (represented as "as-sputtered") and a top surface of a sample including a CAAC-OS film subjected to heat treatment at 450° C. in an atmosphere containing oxygen. Here, the proportion of CAAC was obtained in such a manner that diffraction patterns were observed by scanning for 60 seconds at a rate of 5 nm/second and the obtained diffraction patterns were converted into still images every 0.5 seconds. Note that as an electron beam, a nanobeam with a probe diameter of 1 nm was used. The above measurement was performed on six samples. The proportion of CAAC was calculated using the average value of the six samples.

Figure 28A:
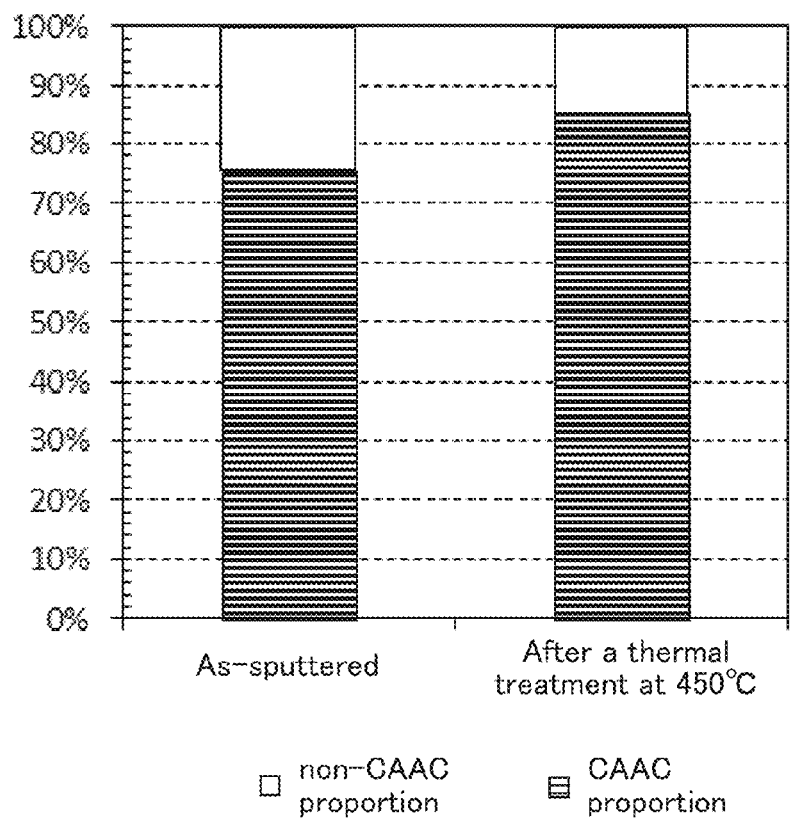
FIG. 28A shows an example of structural analysis by transmission electron diffraction measurement.

FIG. 28A shows the proportion of CAAC in each sample. The proportion of CAAC of the CAAC-OS film obtained just after the deposition was 75.7% (the proportion of non-CAAC was 24.3%). The proportion of CAAC of the CAAC-OS film subjected to the heat treatment at 450° C. was 85.3% (the proportion of non-CAAC was 14.7%). These results show that the proportion of CAAC obtained after the heat treatment at 450° C. is higher than that obtained just after the deposition. That is, heat treatment at a high temperature (e.g., higher than or equal to 400° C.) reduces the proportion of non-CAAC (increases the proportion of CAAC). Further, the above results also indicate that even when the temperature of the heat treatment is lower than 500° C., the CAAC-OS film can have a high proportion of CAAC.

Here, most of diffraction patterns different from that of a CAAC-OS film are diffraction patterns similar to that of an nc-OS film. Further, an amorphous oxide semiconductor film was not able to be observed in the measurement region. Therefore, the above results suggest that the region having a structure similar to that of an nc-OS film is rearranged by the heat treatment owing to the influence of the structure of the adjacent region, whereby the region becomes CAAC.

Figure 28B:
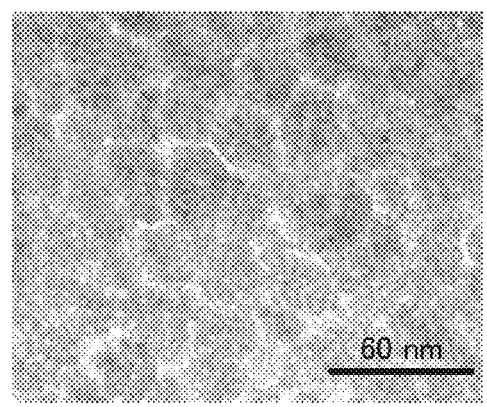
FIGS. 28B and 28C show plan-view TEM images.
Figure 28C:
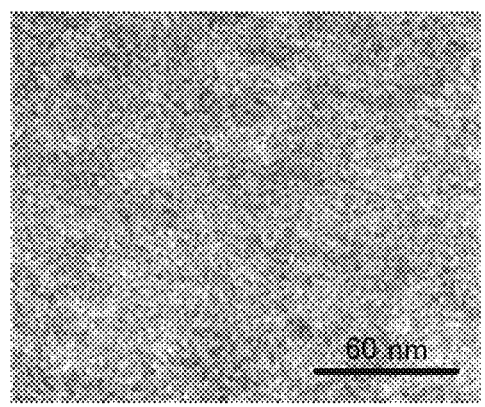

FIGS. 28B and 28C are planar TEM images of the CAAC-OS film obtained immediately after the deposition and the CAAC-OS film subjected to the heat treatment at 450° C., respectively. Comparison between FIGS. 28B and 28C shows that the CAAC-OS film subjected to the heat treatment at 450° C. has more even film quality. That is, the heat treatment at a high temperature improves the film quality of the CAAC-OS film.

With such a measurement method, the structure of an oxide semiconductor film having a plurality of structures can be analyzed in some cases.

The CAAC-OS film is formed, for example, by the following method.

By reducing the amount of impurities entering the CAAC-OS layer during the deposition, the crystal state can be prevented from being broken by the impurities. For example, the concentration of impurities (e.g., hydrogen, water, carbon dioxide, or nitrogen) which exist in the deposition chamber may be reduced. Furthermore, the concentration of impurities in a deposition gas may be reduced. Specifically, a deposition gas whose dew point is −80° C. or lower, preferably −100° C. or lower is used.

Furthermore, it is preferable that the proportion of oxygen in the deposition gas be increased and the power be optimized in order to reduce plasma damage at the deposition. The proportion of oxygen in the deposition gas is higher than or equal to 30 vol %, preferably 100 vol %.

Alternatively, the CAAC-OS film is formed by the following method.

First, a first oxide semiconductor film is formed to a thickness of greater than or equal to 1 nm and less than 10 nm. The first oxide semiconductor film is formed by a sputtering method. Specifically, the substrate temperature is set to higher than or equal to 100° C. and lower than or equal to 500° C., preferably higher than or equal to 150° C. and lower than or equal to 450° C., and the proportion of oxygen in a deposition gas is set to higher than or equal to 30 vol %, preferably 100 vol %.

Next, heat treatment is performed so that the first oxide semiconductor film becomes a first CAAC-OS film with high crystallinity. The temperature of the heat treatment is higher than or equal to 350° C. and lower than or equal to 740° C., preferably higher than or equal to 450° C. and lower than or equal to 650° C. The heat treatment time is longer than or equal to 1 minute and shorter than or equal to 24 hours, preferably longer than or equal to 6 minutes and shorter than or equal to 4 hours. The heat treatment may be performed in an inert atmosphere or an oxidation atmosphere. It is preferable to perform heat treatment in an inert atmosphere and then perform heat treatment in an oxidation atmosphere. The heat treatment in an inert atmosphere can reduce the concentration of impurities in the first oxide semiconductor film for a short time. At the same time, the heat treatment in an inert atmosphere may generate oxygen vacancies in the first oxide semiconductor film. In such a case, the heat treatment in an oxidation atmosphere can reduce the oxygen vacancies. Note that the heat treatment may be performed under a reduced pressure, such as 1000 Pa or lower, 100 Pa or lower, 10 Pa or lower, or 1 Pa or lower. The heat treatment under the reduced pressure can reduce the concentration of impurities in the first oxide semiconductor film for a shorter time.

The first oxide semiconductor film can be crystallized easier in the case where the thickness is greater than or equal to 1 nm and less than 10 nm than in the case where the thickness is greater than or equal to 10 nm.

Next, a second oxide semiconductor film having the same composition as the first oxide semiconductor film is formed to a thickness of greater than or equal to 10 nm and less than or equal to 50 nm. The second oxide semiconductor film is formed by a sputtering method. Specifically, the substrate temperature is set to higher than or equal to 100° C. and lower than or equal to 500° C., preferably higher than or equal to 150° C. and lower than or equal to 450° C., and the proportion of oxygen in a deposition gas is set to higher than or equal to 30 vol %, preferably 100 vol %.

Next, heat treatment is performed so that solid phase growth of the second oxide semiconductor film is performed using the first CAAC-OS film, thereby forming a second CAAC-OS film with high crystallinity. The temperature of the heat treatment is higher than or equal to 350° C. and lower than or equal to 740° C., preferably higher than or equal to 450° C. and lower than or equal to 650° C. The heat treatment time is longer than or equal to 1 minute and shorter than or equal to 24 hours, preferably longer than or equal to 6 minutes and shorter than or equal to 4 hours. The heat treatment may be performed in an inert atmosphere or an oxidation atmosphere. It is preferable to perform heat treatment in an inert atmosphere and then perform heat treatment in an oxidation atmosphere. The heat treatment in an inert atmosphere can reduce the concentration of impurities in the second oxide semiconductor film for a short time. At the same time, the heat treatment in an inert atmosphere may generate oxygen vacancies in the second oxide semiconductor film. In such a case, the heat treatment in an oxidation atmosphere can reduce the oxygen vacancies. Note that the heat treatment may be performed under a reduced pressure, such as 1000 Pa or lower, 100 Pa or lower, 10 Pa or lower, or 1 Pa or lower. The heat treatment under the reduced pressure can reduce the concentration of impurities in the second oxide semiconductor film for a shorter time.

As described above, a CAAC-OS film with a total thickness of greater than or equal to 10 nm can be formed.

At least part of this embodiment can be implemented in combination with any of the embodiments described in this specification as appropriate.

Embodiment 9

An oxide semiconductor that can be favorably used for a semiconductor of a semiconductor device of one embodiment of the present invention is described in this embodiment.

A semiconductor device of one embodiment of the present invention preferably includes an oxide layer, which contains as its constituent element at least one of the metal elements constituting an oxide semiconductor, between the oxide semiconductor and an insulator that overlaps the oxide semiconductor. In this way, a trap state is prevented from being formed at the interface between the oxide semiconductor and the insulator that overlaps the oxide semiconductor.

That is, one embodiment of the present invention preferably has a structure in which each of the top surface and the bottom surface of at least the channel formation region of the oxide semiconductor is in contact with an oxide layer that functions as a barrier film for preventing formation of an interface state of the oxide semiconductor. With this structure, formation of oxygen vacancy and entry of impurities which cause formation of carriers in the oxide semiconductor and the interface can be prevented. Thus, a highly purified intrinsic oxide semiconductor can be obtained. The highly purified intrinsic oxide semiconductor refers to an intrinsic or substantially intrinsic oxide semiconductor. It is thus possible to reduce variation in the electrical characteristics of a transistor including the oxide semiconductor and to provide a highly reliable semiconductor device.

Note that in this specification and the like, in the case of the substantially purified oxide semiconductor, the carrier density thereof is lower than $1\times10^{17}/cm^3$, lower than $1\times10^{15}/cm^3$, or lower than $1\times10^{13}/cm^3$. With a highly purified intrinsic oxide semiconductor, the transistor can have stable electrical characteristics.

A semiconductor 2901 is provided between an insulator 2904 and a semiconductor 2902. A semiconductor 2903 is provided between the semiconductor 2902 and the insulator 2905 functioning as a gate insulating film. The insulator 2905 is provided between the semiconductor 2903 and a conductor 2906 functioning as a gate electrode (FIG. 29C).

The semiconductors 2901 and 2903 each contain an oxide containing one or more metal elements that are also contained in the semiconductor 2902.

Note that the boundary between the semiconductors 2902 and 2901 or the boundary between the semiconductors 2902 and 2903 is not clear in some cases.

For example, the semiconductors 2901 and 2903 contain In or Ga; typically, a material such as In—Ga-based oxide, In—Zn-based oxide, or In-M-Zn-based oxide (M is Al, Ti, Ga, Y, Zr, La, Ce, Nd, or Hf) that has energy of the bottom of the conduction band closer to the vacuum level than that of the semiconductor 2902 is used. Typically, the difference in energy at the bottom of the conduction band between the semiconductor 2901 or 2903 and the semiconductor 2902 is preferably 0.05 eV or more, 0.07 eV or more, 0.1 eV or more, or 0.15 eV or more and 2 eV or less, 1 eV or less, 0.5 eV or less, or 0.4 eV or less.

For each of the semiconductors 2901 and 2903 between which the semiconductor 2902 is provided, an oxide that contains a larger amount of Ga serving as a stabilizer than the semiconductor 2902 is used, which can inhibit release of oxygen from the semiconductor 2902.

When an In—Ga—Zn-based oxide having an atomic ratio of In:Ga:Zn=1:1:1 or 3:1:2 is used for the semiconductor 2902, for example, an In—Ga—Zn-based oxide having an atomic ratio of In:Ga:Zn=1:3:2, 1:3:4, 1:3:6, 1:6:4, 1:6:8, 1:6:10, or 1:9:6 can be used for the semiconductor 2901 or the semiconductor 2903. In each of the semiconductors 2902, 2901, and 2903, the proportions of the atoms in the above atomic ratio vary within a range of ±20% as an error. For the semiconductors 2901 and 2903, materials with the same composition or materials with different compositions may be used.

Further, when an In-M-Zn-based oxide is used for the semiconductor 2902, an oxide containing metal elements in the atomic ratio satisfying the following conditions is preferably used for a target for forming a semiconductor film to be the semiconductor 2902. Given that the atomic ratio of the metal elements in the oxide is In:M:Zn=$x_1$:$y_1$:$z_1$, $x_1/y_1$ is greater than or equal to ⅓ and less than or equal to 6, preferably greater than or equal to 1 and less than or equal to 6, and $z_1/y_1$ is greater than or equal to ⅓ and less than or equal to 6, preferably greater than or equal to 1 and less than or equal to 6. Note that when $z_1/y_1$ is less than or equal to 6, a CAAC-OS film to be described later is easily formed. Typical examples of the atomic ratio of the metal elements in the target are In:M:Zn=1:1:1, In:M:Zn=3:1:2, or the like.

When an In-M-Zn-based oxide is used for the semiconductors 2901 and 2903, an oxide containing metal elements in the following atomic ratio is preferably used for a target for forming oxide films to be the semiconductors 2901 and 2903. Given that the atomic ratio of the metal elements in the oxide is In:M:Zn=$x_2$:$y_2$:$z_2$, $x_2/y_2$ is less than $x_1/y_1$, and $z_2/y_2$ is greater than or equal to ⅓ and less than or equal to 6, preferably greater than or equal to 1 and less than or equal to 6. Note that when $z_2/y_2$ is less than or equal to 6, a CAAC-OS film to be described later is easily formed. Typical examples of the atomic ratio of the metal elements in the target are In:M:Zn=1:3:4, In:M:Zn=1:3:6, In:M:Zn=1:3:8, or the like.

For the semiconductors 2901 and 2903, gallium oxide, gallium zinc oxide, or the like can be used. Using such a material, off-state leakage current of the transistor can be reduced.

By using a material whose energy level of the bottom of the conduction band is closer to the vacuum level than that of the semiconductor 2902 is used for the semiconductors 2901 and 2903, a channel is mainly formed in the semiconductor 2902, so that the semiconductor 2902 serves as a main current path. In this manner, when the semiconductor 2902 in which a channel is formed is provided between the semiconductors 2901 and 2903 that contain the same metal elements, formation of interface states between these films is inhibited, and thus the reliability of the electrical characteristics of the transistor is improved.

Note that, without limitation to those described above, a material with an appropriate composition may be used depending on required semiconductor characteristics and electrical characteristics (e.g., field-effect mobility and threshold voltage) of a transistor. Furthermore, in order to obtain required semiconductor characteristics of the transistor, it is preferable that the carrier density, the impurity concentration, the defect density, the atomic ratio of a metal element to oxygen, the interatomic distance, the density, and the like of the semiconductors 2902, 2901, and 2903 be set to appropriate values.

Here, in some cases, there is a mixed region of the semiconductors 2901 and 2902 between the semiconductors 2901 and 2902. Further, in some cases, there is a mixed region of the semiconductors 2902 and 2903 between the semiconductors 2902 and 2903. The mixed region has a low density of interface states. For that reason, the stack of the semiconductor 2901, the semiconductor 2902, and the semiconductor 2903 has a band structure where energy at each interface and in the vicinity of the interface is changed continuously (continuous junction).

Here, a band structure is described. For easy understanding, the band structure is illustrated with the energy (Ec) at the bottom of the conduction band of each of the insulator 2904, the semiconductor 2901, the semiconductor 2902, the semiconductor 2903, and the insulator 2905 functioning as a gate insulating film.

Figure 29A:
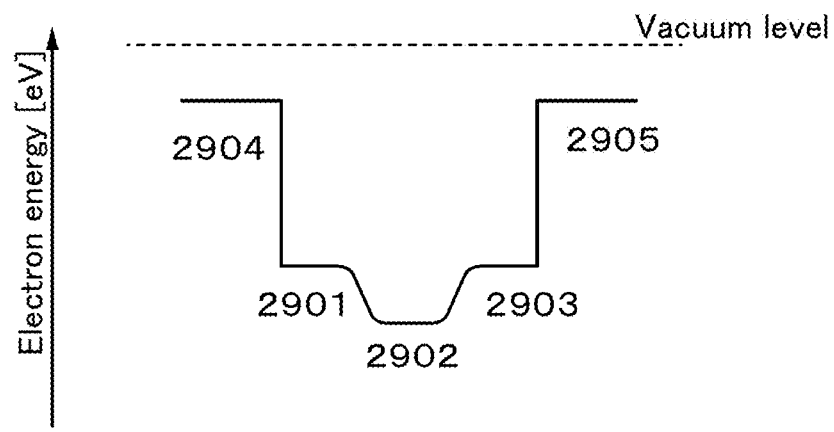
FIGS. 29A to 29C each illustrate a band structure of an embodiment.
Figure 29B:
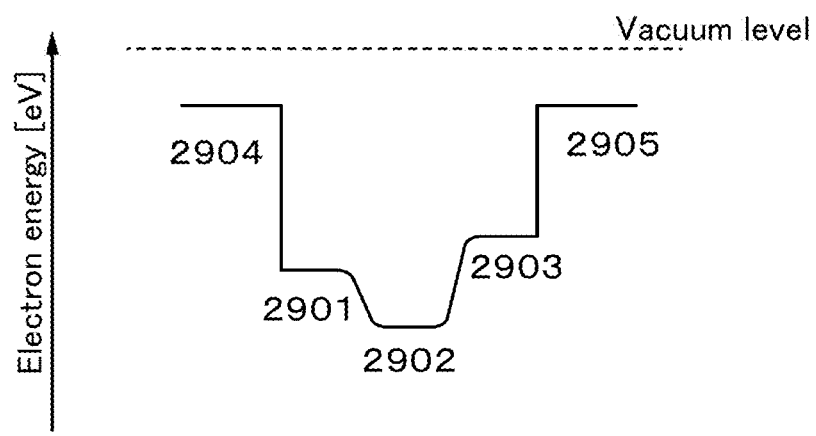
Figure 29C:
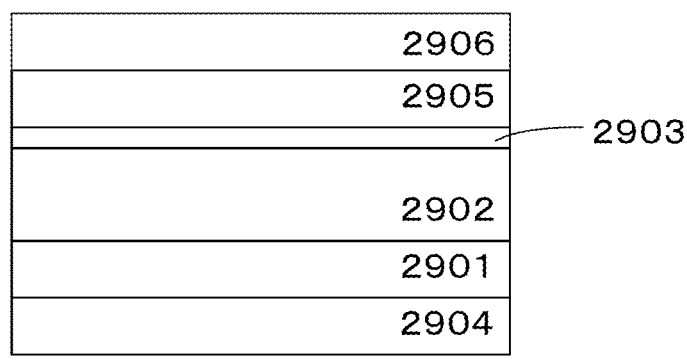

As illustrated in FIGS. 29A and 29B, the energy of the bottom of the conduction band changes continuously in the semiconductor 2901, the semiconductor 2902, and the semiconductor 2903. This can be understood also from the fact that the constituent elements are common among the semiconductors 2901, 2902, and 2903 and oxygen is easily diffused among the semiconductors 2901, 2902, and 2903. Thus, the semiconductors 2901, 2902, and 2903 have a continuous physical property although they are a stack of films having different compositions.

The oxide semiconductors that are stacked and contain the same main components have not only a simple stacked-layer structure of the layers but also a continuous energy band (here, particularly a U-shaped well structure where the energy at the bottom of the conduction band is continuously changed between the layers). In other words, the stacked-layer structure is formed such that there exists no impurity that forms a defect level such as a trap center or a recombination center at each interface. If impurities exist between the stacked layers in the multilayer film, the continuity of the energy band is lost and carriers disappear by a trap or recombination.

Note that FIG. 29A illustrates the case where the Ec of the semiconductor layer 2901 and the Ec of the semiconductor layer 2903 are equal to each other; however, they may be different from each other. For example, part of the band structure in the case where the Ec of the semiconductor 2903 is higher than the Ec of the semiconductor 2901 is illustrated in FIG. 29B.

According to FIGS. 29A and 29B, the semiconductor 2902 serves as a well, and a channel is formed in the semiconductor 2902. Note that since the energies at the bottoms of the conduction bands are changed continuously, the semiconductors 2901, 2902, and 2903 can also be referred to as a U-shaped well. Further, a channel formed to have such a structure can also be referred to as a buried channel.

Note that trap states resulting from impurities or defects might be formed in the vicinity of the interfaces between the insulating film such as a silicon oxide film and each of the semiconductor 2901 and the semiconductor 2903. Owing to the semiconductors 2901 and 2903, the semiconductor 2902 can be separated from the trap states. However, when the energy difference in Ec between the semiconductor 2902 and the semiconductor 2901 or the semiconductor 2903 is small, an electron in the semiconductor 2902 might reach the trap state by passing over the energy difference. When the electrons are captured by the trap level, negative fixed charge is generated at the interface with the insulating layer, whereby the threshold voltage of the transistor shifts in the positive direction.

Thus, to reduce a change in the threshold voltage of the transistor, an energy difference between the Ec of the semiconductor 2902 and the Ec of each of the semiconductors 2901 and 2903 is necessary. Each of the energy differences is preferably greater than or equal to 0.1 eV, further preferably greater than or equal to 0.15 eV.

The semiconductors 2901, 2902, and 2903 preferably include crystal parts. In particular, when a crystal in which c-axes are aligned is used, the transistor can have stable electrical characteristics.

In the band structure illustrated in FIG. 29B, instead of the semiconductor 2903, an In—Ga oxide (e.g., with an atomic ratio of In:Ga=7:93) may be provided between the semiconductor 2902 and the insulator 2905 functioning as a gate insulating film.

As the semiconductor 2902, an oxide having an electron affinity higher than those of the semiconductors 2901 and 2903 is used. For example, as the semiconductor 2902, an oxide having an electron affinity higher than those of the semiconductors 2901 and 2903 by 0.07 eV or higher and 1.3 eV or lower, preferably 0.1 eV or higher and 0.7 eV or lower, or further preferably 0.15 eV or higher and 0.4 eV or lower is used. Note that the electron affinity refers to an energy gap between the vacuum level and the bottom of the conduction band.

Here, it is preferable that the thickness of the semiconductor 2902 be at least larger than that of the semiconductor 2901. The thicker the semiconductor layer 2902 is, the larger the on-state current of the transistor is. The thickness of the semiconductor 2901 may be set as appropriate as long as formation of an interface state at the interface with the semiconductor 2902 is inhibited. For example, the thickness of the oxide semiconductor 2902 is larger than that of the semiconductor 2901, preferably 2 or more times, further preferably 4 or more times, still further preferably 6 or more times as large as that of the semiconductor 2901. Note that the above does not apply in the case where the on-state current of the transistor need not be increased, and the thickness of the semiconductor 2901 may be equal to or greater than that of the semiconductor 2902.

The thickness of the semiconductor 2903 may be set as appropriate, in a manner similar to that of the semiconductor 2901, as long as formation of an interface state at the interface with the semiconductor 2902 is inhibited. For example, the thickness of the semiconductor 2903 may be set smaller than or equal to that of the semiconductor 2901. If the semiconductor 2903 is thick, it may become difficult for the electric field from the conductor 2906 functioning as a gate electrode to reach the semiconductor 2902. Therefore, it is preferable that the semiconductor 2903 be thin; for example, thinner than the semiconductor 2902. Note that the thickness of the semiconductor 2905 is not limited to the above, and may be set as appropriate depending on a driving voltage of the transistor in consideration of the withstand voltage of the insulator 2905 functioning as a gate insulating film.

Here, in the case where the semiconductor 2902 is in contact with an insulator including a different constituent element (e.g., an insulator including a silicon oxide film), an interface state might be formed at the interface of the two layers and the interface state forms a channel. At this time, another transistor having a different threshold voltage appears, so that an apparent threshold voltage of the transistor is varied. However, in the transistor of this structure, the semiconductor 2901 contains one or more kinds of metal elements that constitute the semiconductor 2902. Therefore, an interface state is not easily formed at the interface between the semiconductors 2901 and 2902. Thus, providing the semiconductor 2901 makes it possible to reduce variations or changes in electrical characteristics of the transistor, such as threshold voltage.

When a channel is formed at the interface between the insulator 2905 functioning as a gate insulating film and the semiconductor 2902, interface scattering occurs at the interface and the field-effect mobility of the transistor is reduced in some cases. In the transistor of this structure, however, the semiconductor 2903 contains one or more kinds of metal elements that constitute the semiconductor 2902. Therefore, scattering of carriers is less likely to occur at the interface between the semiconductor 2902 and the semiconductor 2903, and thus the field-effect mobility of the transistor can be increased.

At least part of this embodiment can be implemented in combination with any of the embodiments described in this specification as appropriate.

Embodiment 10

Figure 30A:
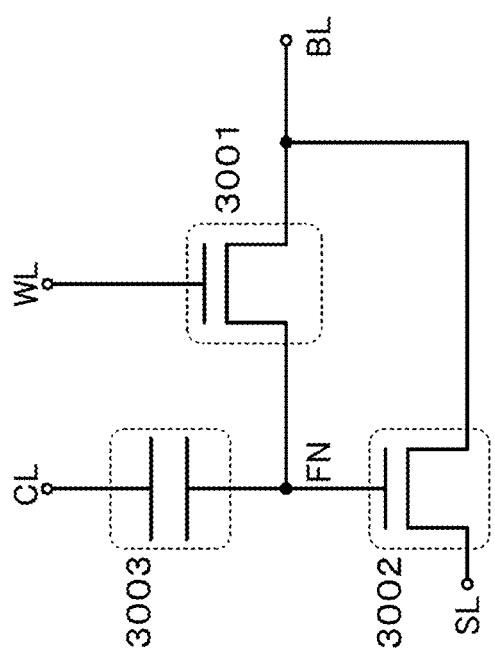
FIGS. 30A and 30B illustrate a structural example of a semiconductor device of an embodiment.

FIG. 30A shows an example of a circuit diagram of a semiconductor device of one embodiment of the present invention. The semiconductor device shown in FIG. 30A includes a transistor 3002, a transistor 3001, a capacitor 3003, a wiring BL, a wiring WL, a wiring CL, and a wiring BG.

One of a source or a drain of the transistor 3002 is electrically connected to the wiring BL, the other is electrically connected to the wiring SL, and a gate of the transistor 3002 is electrically connected to one of a source and a drain of the transistor 3001 and one electrode of the capacitor 3003. The other of the source and the drain of the transistor 3001 is electrically connected to the wiring BL, and a gate of the transistor 3001 is electrically connected to the wiring WL. The other electrode of the capacitor 3003 is electrically connected to the wiring CL. Note that a node between the gate of the transistor 3002, the one of the source and the drain of the transistor 3001, and the one electrode of the capacitor 3003 is referred to as a node FN.

The semiconductor device shown in FIG. 30A supplies a potential corresponding to the potential of the wiring BL to the node FN when the transistor 3001 is in a conductive state (i.e., is on). Meanwhile, in the semiconductor device, the potential of the node FN is retained when the transistor 3001 is in an off state (i.e., is off). In other words, the semiconductor device illustrated in FIG. 30A functions as a memory cell of a memory device. In the case where a display element such as a liquid crystal element or an organic electroluminescence (EL) element is electrically connected to the node FN, the semiconductor device in FIG. 30A can function as a pixel of a display device.

The on/off state of the transistor 3001 can be selected in accordance with the potential supplied to the wiring WL or the wiring BG. The threshold voltage of the transistor 3001 can be controlled by a potential supplied to the wiring WL or the wiring BG. A transistor with small off-state current is used as the transistor 3001, whereby the potential of the node FN at the time when the transistor 3001 is in a non-conduction state can be held for a long time. Thus, the refresh rate of the semiconductor device can be reduced, resulting in low power consumption of the semiconductor device. An example of the transistor with small off-state current is a transistor including an oxide semiconductor.

Note that a reference potential, a ground potential, or a fixed potential such as an arbitrary fixed potential is supplied to the wiring CL. At this time, the apparent threshold voltage of the transistor 3001 varies depending on the potential of the node FN. Conduction and non-conduction states of the transistor 3002 change in response to the change in the apparent threshold voltage; thus, data of a potential retained in the node FN can be read as data.

To hold a potential retained in the node FN at 85° C. for 10 years ($3.15 \times 10^8$ seconds), off-state current is preferably lower than 4.3 yA (yoctoamperes, where 1 yA is $10^{-24}$ A) per femtofarad of capacitance and per micrometer of channel width of the transistor. In that case, the allowable potential variation in the node FN is preferably within 0.5 V. Alternatively, the off-state current is preferably lower than 1.5 yA at 95° C. In the semiconductor device of one embodiment of the present invention, the concentration of hydrogen contained in the layers under the barrier layer is sufficiently reduced; thus, the transistor including an oxide semiconductor over the barrier layer can have such extremely small off-state current.

The subthreshold swing value (S value) of the transistor including an oxide semiconductor is 66 mV/dec. or more, preferably 60 mV/dec. or more, further preferably 50 mV/dec. or more, and 200 mV/dec. or less, preferably 150 mV/dec. or less, further preferably 100 mV/dec. or less, still further preferably 80 mV/dec. As the S value is decreased, the off-state current at a particular voltage at which the transistor is turned off can be decreased.

When the semiconductor device illustrated in FIG. 30A is arranged in a matrix, a memory device (memory cell array) can be formed.

Figure 30B:
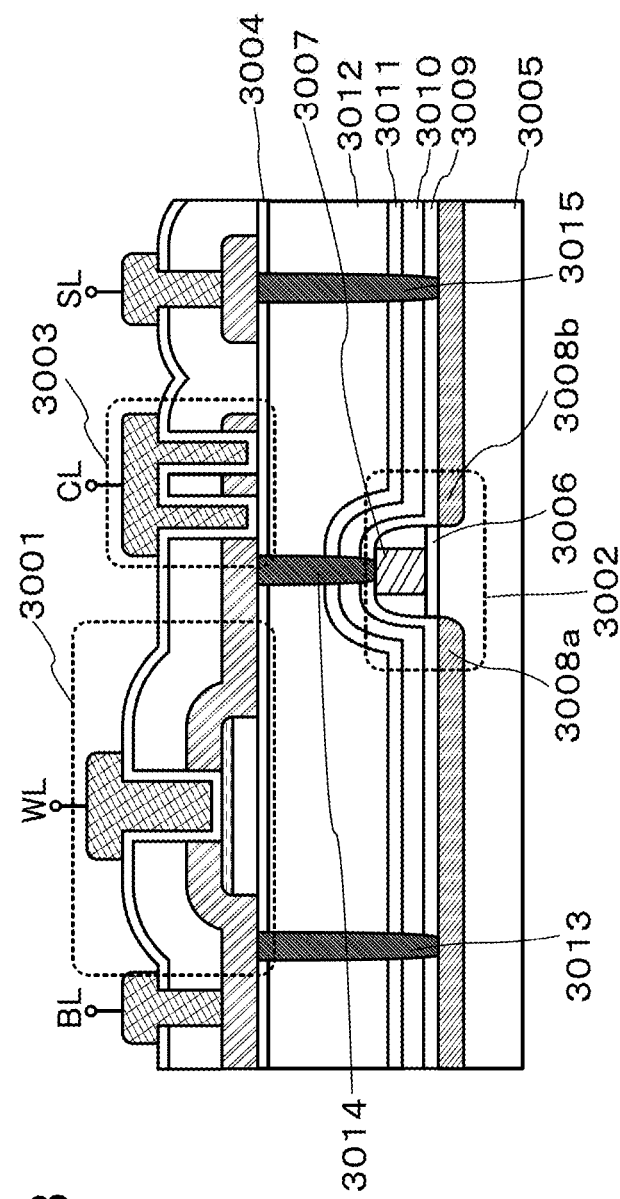

FIG. 30B illustrates an example of a cross-sectional structure of a semiconductor device in which the circuit illustrated in FIG. 30A can be obtained.

The semiconductor device includes the transistor 3002, the transistor 3001, and the capacitor 3003. The transistor 3001 is provided over the transistor 3002, and an insulator 3004 is provided between the transistor 3002 and the transistor 3001.

The transistor 3002 is provided on a semiconductor substrate 3005 and includes a gate insulating film 3006, a gate electrode 3007, and low-resistance regions 3008a and 3008b serving as source and drain regions.

The transistor 3002 may be either a p-channel transistor or an n-channel transistor, and an appropriate transistor may be used depending on the circuit configuration or the driving method.

It is preferable that a region where a channel is formed, a region in the vicinity thereof, the low-resistance regions 3008a and 3008b serving as source and drain regions, and the like contain a semiconductor such as a silicon-based semiconductor, more preferably single crystal silicon. Alternatively, a material including germanium (Ge), silicon germanium (SiGe), gallium arsenide (GaAs), gallium aluminum arsenide (GaAlAs), or the like may be contained. Alternatively, silicon having crystal lattice distortion may be contained. Alternatively, the transistor 3002 may be a high-electron-mobility transistor (HEMT) with GaAs and AlGaAs or the like.

The low-resistance regions 3008a and 3008b contain an element which imparts n-type conductivity, such as phosphorus, or an element which imparts p-type conductivity, such as boron.

The gate electrode 3007 can be formed using a semiconductor material such as silicon containing the element that imparts n-type conductivity, such as phosphorus, or the element that imparts p-type conductivity, such as boron, or a conductive material such as a metal material, an alloy material, or a metal oxide material. It is particularly preferable to use a high-melting-point material that has both heat resistance and conductivity, such as tungsten or molybdenum, and it is particularly preferable to use tungsten.

An insulator 3009, an insulator 3010, an insulator 3011, and an insulator 3012 are stacked in this order to cover the transistor 3002.

In a manufacturing process of the semiconductor device, the insulator 3009 functions as a protective film to activate an element imparting conductivity that is added to the low-resistance regions 3008a and 3008b. The insulator 3009 is not necessarily provided if not needed.

In the case where a silicon-based semiconductor material is used for the semiconductor, the insulator 3010 preferably contains hydrogen. When the insulator 3010 containing hydrogen is provided over the transistor 3002 and heat treatment is performed, dangling bonds in the semiconductor are terminated by hydrogen contained in the insulator 3010, whereby the reliability of the transistor 3002 can be improved.

A silicon nitride film or the like is preferably used as the insulator 3011. The insulator 3011 also functions as a barrier film for preventing hydrogen that is released from the insulator 3010 from diffusing upward.

The insulator 3012 functions as a planarization layer which covers steps due to the transistor 3002 or the like provided therebelow. A top surface of the insulator 3012 may be planarized by a chemical mechanical polishing (CMP) method or the like to increase the planarity of the top surface.

The insulator 3004 is provided over the insulator 3012. A silicon nitride film or the like is preferably used as the insulator 3004. The insulator 3004 also functions as a barrier film for preventing hydrogen that is released from the insulator 3010 from diffusing upward.

In the insulators 3009, 3010, 3011, 3012, and 3004, plugs 3013 and 3015 electrically connected to the low-resistance regions 3008a and 3008b, and the like, a plug 3014 electrically connected to the gate electrode 3007 of the transistor 3002, and the like may be embedded.

The transistor 3001 and the capacitor 3003 are provided over the insulator 3004. The transistor and the capacitor described in any of Embodiments 1 to 6 are preferably used.

The semiconductor device of one embodiment of the present invention includes the transistor 3002, the transistor 3001 over the transistor 3002, and the capacitor 3003. Since these are stacked, the area occupied by the elements can be reduced. Furthermore, the insulator 3004 provided between the transistor 3002 and the transistor 3001 can inhibit diffusion of impurities such as water and hydrogen from an underlying layer to the transistor 3001 side.

Thus, part of or the whole of this embodiment can be freely combined with or replaced with part of or the whole of another embodiment.

Embodiment 11

In this embodiment, description is given of a CPU in which at least the transistor described in any of the above embodiments can be used and the memory device described in Embodiment 10 is included.

Figure 31:
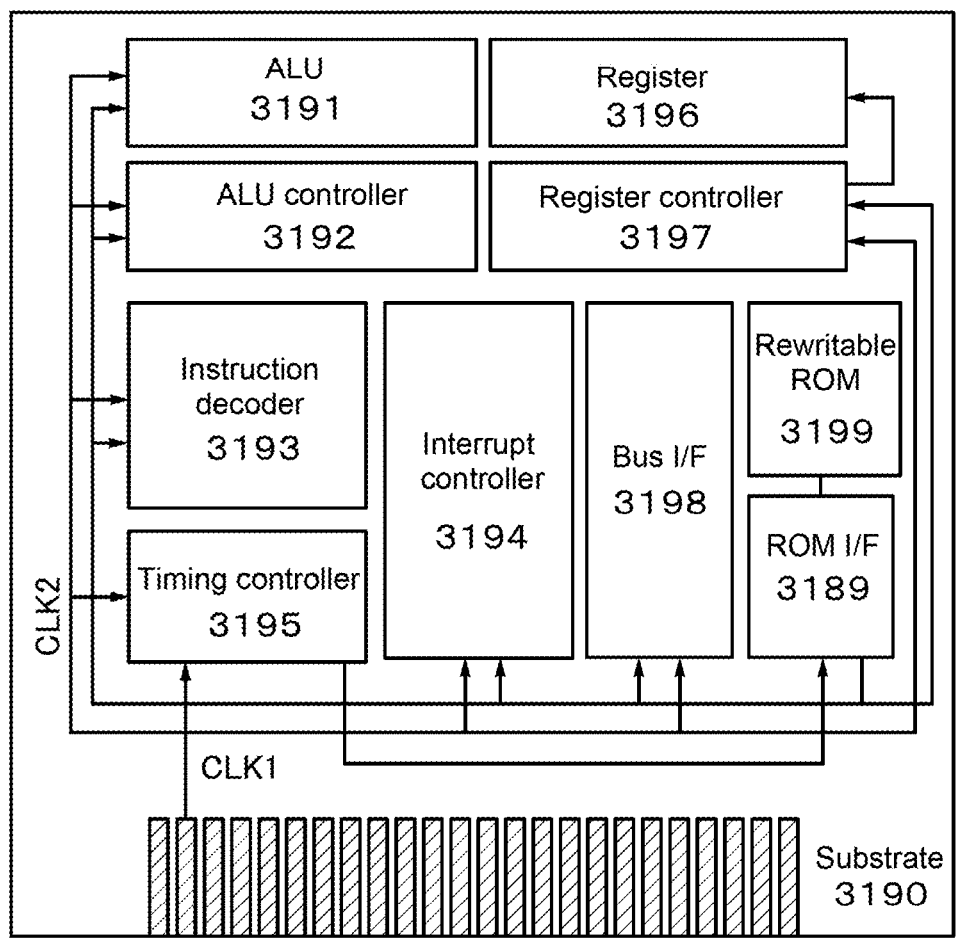
FIG. 31 illustrates a structure example of a CPU of an embodiment.

FIG. 31 is a block diagram illustrating a configuration example of a CPU at least partly including any of the transistors described in the above embodiments as a component.

The CPU illustrated in FIG. 31 includes, over a substrate 3190, an arithmetic logic unit (ALU) 3191, an ALU controller 3192, an instruction decoder 3193, an interrupt controller 3194, a timing controller 3195, a register 3196, a register controller 3197, a bus interface 3198 (Bus I/F), a rewritable ROM 3199, and an ROM interface 3189 (ROM I/F). A semiconductor substrate, an SOI substrate, a glass substrate, or the like is used as the substrate 3190. The ROM 3199 and the ROM interface 3189 may each be provided over a separate chip. Needless to say, the CPU in FIG. 31 is just an example of a simplified structure, and an actual CPU may have a variety of structures depending on the application. For example, the CPU may have the following configuration: a structure including the CPU illustrated in FIG. 31 or an arithmetic circuit is considered as one core; a plurality of the cores is included; and the cores operate in parallel. The number of bits that the CPU can process in an internal arithmetic circuit or in a data bus can be 8, 16, 32, or 64, for example.

An instruction that is input to the CPU through the bus interface 3198 is input to the instruction decoder 3193 and decoded therein, and then, input to the ALU controller 3192, the interrupt controller 3194, the register controller 3197, and the timing controller 3195.

The ALU controller 3192, the interrupt controller 3194, the register controller 3197, and the timing controller 3195 conduct various controls in accordance with the decoded instruction. Specifically, the ALU controller 3192 generates signals for controlling the operation of the ALU 3191. While the CPU is executing a program, the interrupt controller 3194 judges an interrupt request from an external input/output device or a peripheral circuit on the basis of its priority or a mask state, and processes the request. The register controller 3197 generates an address of the register 3196, and reads/writes data from/to the register 3196 in accordance with the state of the CPU.

The timing controller 3195 generates signals for controlling operation timings of the ALU 3191, the ALU controller 3192, the instruction decoder 3193, the interrupt controller 3194, and the register controller 3197. For example, the timing controller 3195 includes an internal clock generator for generating an internal clock signal CLK2 based on a reference clock signal CLK1, and supplies the internal clock signal CLK2 to the above circuits.

In the CPU illustrated in FIG. 31, a memory cell is provided in the register 3196. As the memory cell of the register 3196, any of the transistors described in the above embodiments can be used.

In the CPU illustrated in FIG. 31, the register controller 3197 selects an operation of holding data in the register 3196 in accordance with an instruction from the ALU 3191. That is, the register controller 3197 selects whether data is held by a flip-flop or by a capacitor in the memory cell included in the register 3196. When data retaining by the flip-flop is selected, a power supply voltage is supplied to the memory cell in the register 3196. When data holding by the capacitor is selected, the data in the capacitor is rewritten, and supply of the power supply voltage to the memory cell in the register 3196 can be stopped.

Figure 32:
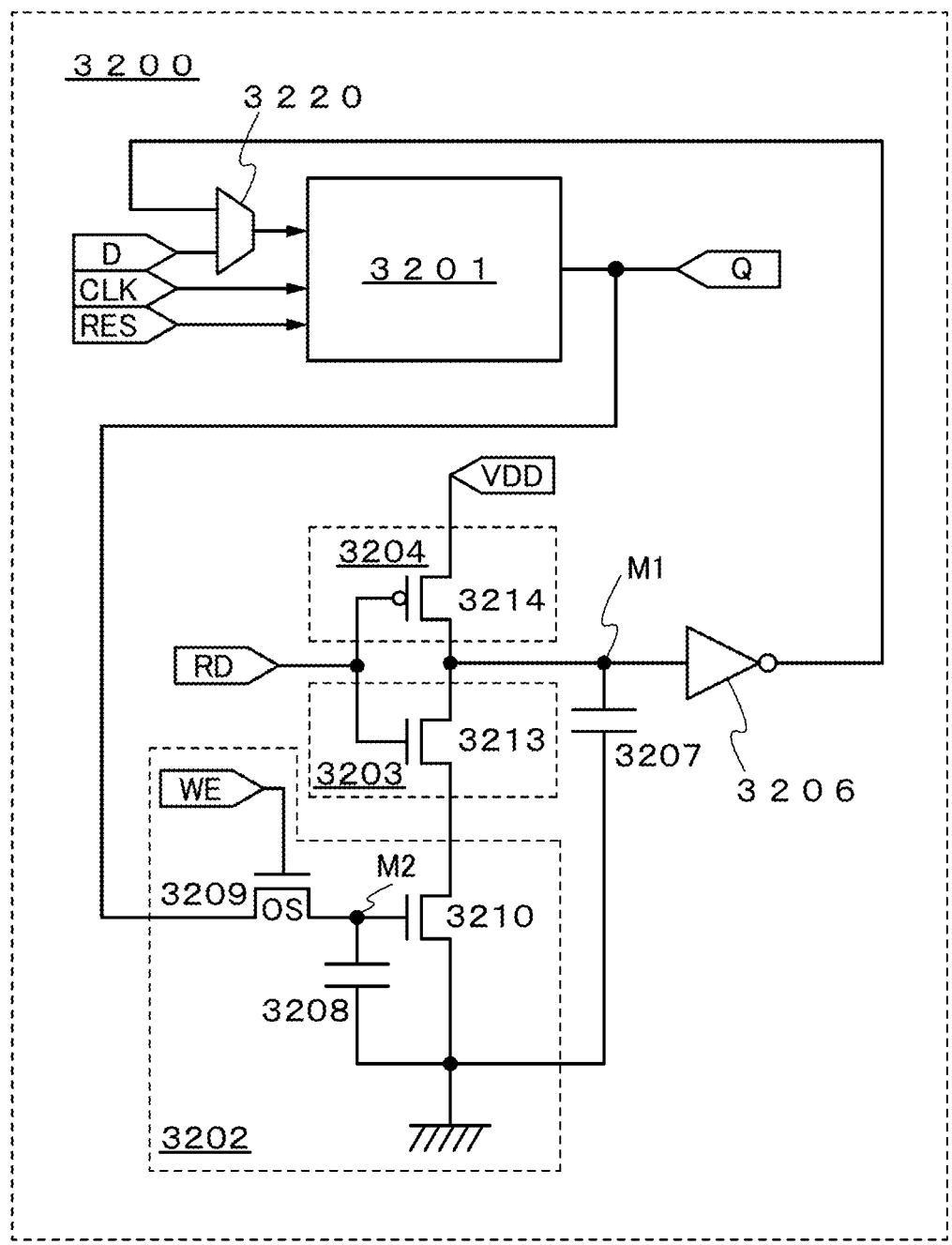
FIG. 32 is a circuit diagram of a memory element of an embodiment.

FIG. 32 is an example of a circuit diagram of a memory element that can be used as the register 3196. A memory element 3200 includes a circuit 3201 in which stored data is volatile when power supply is stopped, a circuit 3202 in which stored data is nonvolatile even when power supply is stopped, a switch 3203, a switch 3204, a logic element 3206, a capacitor 3207, and a circuit 3220 having a selecting function. The circuit 3202 includes a capacitor 3208 and transistors 3209 and 3210. Note that the memory element 3200 may further include another element such as a diode, a resistor, or an inductor, as needed.

Here, the memory device described in the above embodiment can be used as the circuit 3202. When supply of the power supply voltage to the memory element 3200 is stopped, a ground potential (0 V) or a potential at which the transistor 3209 is turned off continues to be input to a gate of the transistor 3209 in the circuit 3202. For example, the gate of the transistor 3209 is grounded through a load such as a resistor.

Shown here is an example in which the switch 3203 is a transistor 3213 having one conductivity type (e.g., an n-channel transistor) and the switch 3204 is a transistor 1214 having a conductivity type opposite to the one conductivity type (e.g., a p-channel transistor). A first terminal of the switch 3203 corresponds to one of a source and a drain of the transistor 3213, a second terminal of the switch 3203 corresponds to the other of the source and the drain of the transistor 3213, and conduction or non-conduction between the first terminal and the second terminal of the switch 3203 (i.e., the on/off state of the transistor 3213) is selected by a control signal RD input to a gate of the transistor 3213. Here, a first terminal of the switch 3204 corresponds to one of a source and a drain of the transistor 3214, a second terminal of the switch 3204 corresponds to the other of the source and the drain of the transistor 3214, and conduction or non-conduction between the first terminal and the second terminal of the switch 3204 (i.e., the on/off state of the transistor 3214) is selected by a control signal RD input to a gate of the transistor 3214.

One of a source and a drain of the transistor 3209 is electrically connected to one of a pair of electrodes of the capacitor 3208 and a gate of the transistor 3210. Here, the connection portion is referred to as a node M2. One of a source and a drain of the transistor 3210 is electrically connected to a line which can supply a low power supply potential (e.g., a GND line), and the other thereof is electrically connected to the first terminal of the switch 3203 (the one of the source and the drain of the transistor 3213). The second terminal of the switch 3203 (the other of the source and the drain of the transistor 3213) is electrically connected to the first terminal of the switch 3204 (the one of the source and the drain of the transistor 3214). The second terminal of the switch 3204 (the other of the source and the drain of the transistor 3214) is electrically connected to a wiring that can supply a power supply potential VDD. The second terminal of the switch 3203 (the other of the source and the drain of the transistor 3213), the first terminal of the switch 3204 (the one of the source and the drain of the transistor 3214), an input terminal of the logic element 3206, and one of a pair of electrodes of the capacitor 3207 are electrically connected to each other. Here, the connection portion is referred to as a node M1. The other of the pair of electrodes of the capacitor 3207 can be supplied with a constant potential. For example, the other of the pair of electrodes of the capacitor 3207 can be supplied with a low power supply potential (e.g., GND) or a high power supply potential (e.g., VDD). The other of the pair of electrodes of the capacitor 3207 is electrically connected to the line which can supply a low power supply potential (e.g., a GND line). The other of the pair of electrodes of the capacitor 3208 can be supplied with a constant potential. For example, the other of the pair of electrodes of the capacitor 3207 can be supplied with a low power supply potential (e.g., GND) or a high power supply potential (e.g., VDD). The other of the pair of electrodes of the capacitor 3208 is electrically connected to the line which can supply a low power supply potential (e.g., a GND line).

The capacitor 3207 and the capacitor 3208 are not necessarily provided as long as the parasitic capacitance of the transistor, the wiring, or the like is actively utilized.

A control signal WE is input to the first gate (first gate electrode) of the transistor 3209. As for each of the switch 3203 and the switch 3204, a conduction state or a non-conduction state between the first terminal and the second terminal is selected by the control signal RD which is different from the control signal WE. When the first terminal and the second terminal of one of the switches are in the conduction state, the first terminal and the second terminal of the other of the switches are in the non-conduction state.

A signal corresponding to data held in the circuit 3201 is input to the other of the source and the drain of the transistor 3209. FIG. 32 illustrates an example in which a signal output from the circuit 3201 is input to the other of the source and the drain of the transistor 3209. The logic value of a signal output from the second terminal of the switch 3203 (the other of the source and the drain of the transistor 3213) is inverted by the logic element 3206, and the inverted signal is input to the circuit 3201 through the circuit 3220.

In the example of FIG. 32, a signal output from the second terminal of the switch 3203 (the other of the source and the drain of the transistor 3213) is input to the circuit 3201 through the logic element 3206 and the circuit 3220; however, one embodiment of the present invention is not limited thereto. The signal output from the second terminal of the switch 3203 (the other of the source and the drain of the transistor 3213) may be input to the circuit 3201 without its logic value being inverted. For example, in the case where the circuit 3201 includes a node in which a signal obtained by inversion of the logic value of a signal input from the input terminal is retained, the signal output from the second terminal of the switch 3203 (the other of the source and the drain of the transistor 3213) can be input to the node.

Further, in FIG. 32, the transistors included in the memory element 3200 except for the transistor 3209 can each be a transistor in which a channel is formed in a layer formed using a semiconductor other than an oxide semiconductor or in the substrate 3190. For example, the transistor can be a transistor in which a channel is formed in a silicon layer or a silicon substrate. Alternatively, all the transistors in the memory element 3200 may be a transistor in which a channel is formed in an oxide semiconductor layer. Still alternatively, in the memory element 3200, a transistor in which a channel is formed in an oxide semiconductor layer can be included besides the transistor 3209, and a transistor in which a channel is formed in a layer or the substrate 3190 including a semiconductor other than an oxide semiconductor can be used for the rest of the transistors.

As the circuit 3201 in FIG. 32, for example, a flip-flop circuit can be used. As the logic element 3206, for example, an inverter, a clocked inverter, or the like can be used.

In a period during which the memory element 3200 is not supplied with the power supply voltage, the semiconductor device of one embodiment of the present invention can retain data stored in the circuit 3201 by the capacitor 3208 which is provided in the circuit 3202.

The off-state current of a transistor in which a channel is formed in an oxide semiconductor layer is extremely low.

For example, the off-state current of a transistor whose channel is formed in an oxide semiconductor layer is much lower than that of a transistor whose channel is formed in crystalline silicon. Thus, with the use of the transistor as the transistor 3209, the signal can be held in the capacitor 3208 for a long time even in a period during which power supply voltage is not supplied to the memory element 3200. The memory element 3200 can thus retain the stored content (data) also in a period during which the supply of the power supply voltage is stopped.

With the switches 3203 and 3204, the memory element performs pre-charge operation; thus, the time required for the circuit 3201 to hold original data again after the supply of the power supply voltage is restarted can be shortened.

In the circuit 3202, a signal retained by the capacitor 3208 is input to the gate of the transistor 3210. Therefore, after supply of the power supply voltage to the memory element 3200 is restarted, the signal held by the capacitor 3208 can be converted into the one corresponding to the state (the on state or the off state) of the transistor 3210 to be read from the circuit 3202. Consequently, the original signal can be accurately read even when a potential corresponding to the signal held in the capacitor 3208 fluctuates to some degree.

By applying the above-described memory element 3200 to a memory device such as a register or a cache memory included in a processor, data in the memory device can be prevented from being lost owing to the stop of the supply of the power supply voltage. Further, shortly after the supply of the power supply voltage is restarted, the memory element can be returned to the same state as that before the power supply is stopped. Therefore, the power supply can be stopped even for a short time in the processor or one or a plurality of logic circuits included in the processor. Accordingly, power consumption can be suppressed.

Although an example of using the memory element 3200 in the CPU is described in this embodiment, the memory element 3200 can also be used in a digital signal processor (DSP), a custom LSI, an LSI such as a programmable logic device (PLD), and a radio frequency identification (RF-ID).

At least part of this embodiment can be implemented in combination with any of the embodiments described in this specification as appropriate.

Embodiment 12

In this embodiment, a structural example of a display panel of one embodiment of the present invention is described.

Figure 33A:
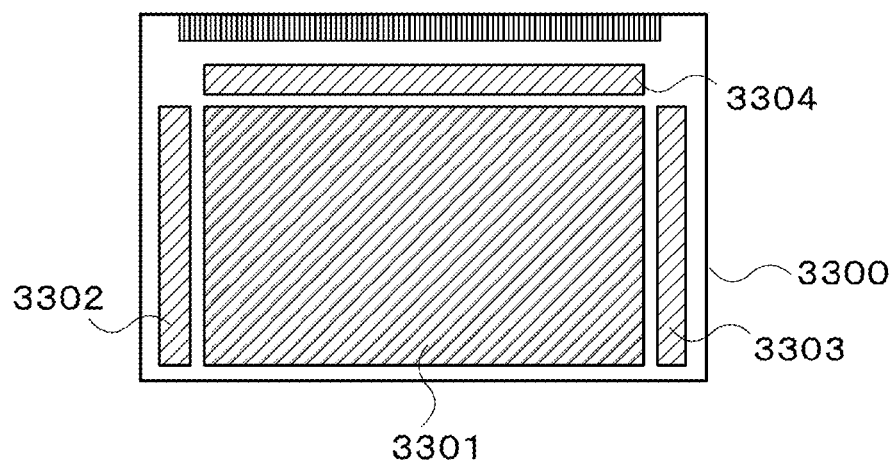
FIGS. 33A to 33C are a top view and circuit diagrams of a display device of an embodiment.
Figure 33B:
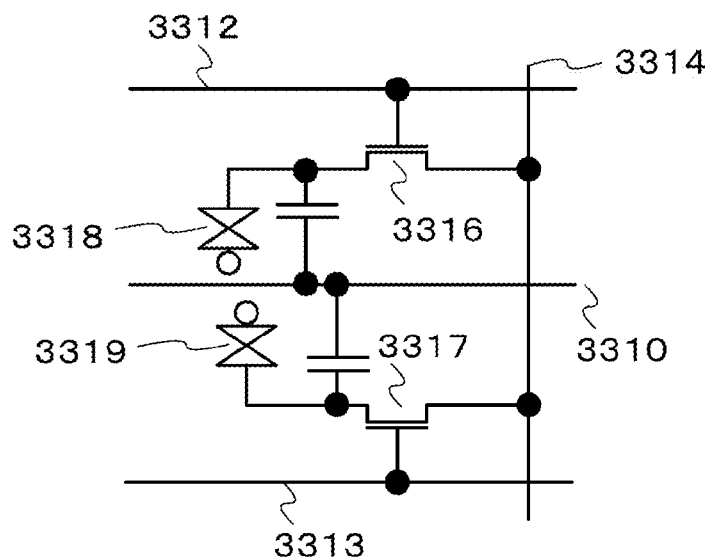
Figure 33C:
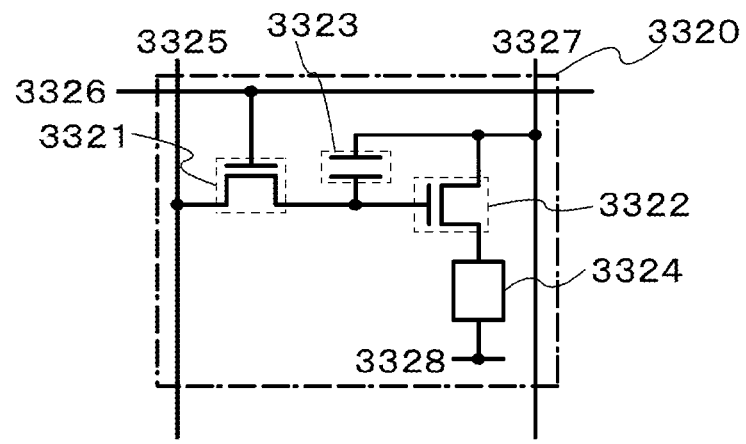

FIG. 33A is a top view of the display panel of one embodiment of the present invention. FIG. 33B is a circuit diagram illustrating a pixel circuit that can be used in the case where a liquid crystal element is used in a pixel in the display panel of one embodiment of the present invention. FIG. 33C is a circuit diagram illustrating a pixel circuit that can be used in the case where an organic EL element is used in a pixel in the display panel of one embodiment of the present invention.

The transistor in the pixel portion can be formed in accordance with the above embodiment. Further, the transistor can easily be an n-channel transistor, and thus, part of a driver circuit that can be formed using an n-channel transistor in the driver circuit is formed over the same substrate as the transistor of the pixel portion. With the use of the transistor described in the above embodiment for the pixel portion or the driver circuit in this manner, a highly reliable display device can be provided.

FIG. 33A shows an example of the block diagram of an active matrix display device. A pixel portion 3301, a first scan line driver circuit 3302, a second scan line driver circuit 3303, and a signal line driver circuit 3304 are provided over a substrate 3300 in the display device. In the pixel portion 3301, a plurality of signal lines extended from the signal line driver circuit 3304 is arranged and a plurality of scan lines extended from the first scan line driver circuit 3302 and the second scan line driver circuit 3303 is arranged. Note that pixels each including a display element are provided in matrix in respective regions in each of which the scan line and the signal line intersect with each other. Further, the substrate 3300 in the display device is connected to a timing control circuit (also referred to as a controller or a controller IC) through a connection portion such as a flexible printed circuit (FPC).

In FIG. 33A, the first scan line driver circuit 3302, the second scan line driver circuit 3303, and the signal line driver circuit 3304 are formed over the same substrate 3300 as the pixel portion 3301. Accordingly, the number of components of a driver circuit which is provided outside and the like are reduced, so that a reduction in cost can be achieved. Further, if the driver circuit is provided outside the substrate 3300, wiring would need to be extended and the number of wiring connections would be increased, but if the driver circuit is provided over the substrate 3300, the number of wiring connections can be reduced. However, by providing the driver circuit over the substrate 3300, the number of connections of the wirings can be reduced. Accordingly, the reliability or yield can be improved.

(Liquid Crystal Panel)

FIG. 33B shows an example of a circuit configuration of the pixel. Here, a pixel circuit which is applicable to a pixel of a VA liquid crystal display panel is illustrated.

This pixel circuit can be applied to a structure in which one pixel includes a plurality of pixel electrode layers. The pixel electrode layers are connected to different transistors, and the transistors can be driven with different gate signals. Accordingly, signals applied to individual pixel electrode layers in a multi-domain pixel can be controlled independently.

A gate wiring 3312 of a transistor 3316 and a gate wiring 3313 of a transistor 3317 are separated so that different gate signals can be given thereto. In contrast, a source or drain electrode layer 3314 functioning as a data line is used in common for the transistor 3316 and the transistor 3317. The transistor described in the above embodiments can be used as appropriate as each of the transistors 3316 and 3317. In the above manner, a highly reliable liquid crystal display panel can be provided.

A first pixel electrode is electrically connected to the transistor 5016 and a second pixel electrode is electrically connected to the transistor 5017. The first pixel electrode and the second pixel electrode are separated. A shape of the first pixel electrode and the second pixel electrode is not especially limited, for example, may be a V-like shape.

A gate electrode of the transistor 3316 is connected to the gate wiring 3312, and a gate electrode of the transistor 3317 is connected to the gate wiring 3313. When different gate signals are supplied to the gate wiring 3312 and the gate wiring 3313, operation timings of the transistor 3316 and the transistor 3317 can be varied. As a result, alignment of liquid crystals can be controlled.

Further, a storage capacitor may be formed using a capacitor wiring 3310, a gate insulating film functioning as a dielectric, and a capacitor electrode electrically connected to the first pixel electrode layer or the second pixel electrode layer.

The multi-domain pixel includes a first liquid crystal element 3318 and a second liquid crystal element 3319. The first liquid crystal element 3318 includes the first pixel electrode layer, a counter electrode layer, and a liquid crystal layer therebetween. The second liquid crystal element 3319 includes the second pixel electrode layer, a counter electrode layer, and a liquid crystal layer therebetween.

Note that a pixel circuit of the present invention is not limited to that shown in FIG. 33B. For example, a switch, a resistor, a capacitor, a transistor, a sensor a logic circuit, or the like may be added to the pixel illustrated in FIG. 33B.

(Organic EL Panel)

FIG. 33C shows another example of a circuit configuration of the pixel. Here, a pixel structure of a display panel using an organic EL element is illustrated.

In an organic EL element, by application of voltage to a light-emitting element, electrons are injected from one of a pair of electrodes and holes are injected from the other of the pair of electrodes, into a layer containing a light-emitting organic compound; thus, current flows. The electrons and holes are recombined, and thus, the light-emitting organic compound is excited. The light-emitting organic compound returns to a ground state from the excited state, thereby emitting light. Based on such a mechanism, such a light-emitting element is referred to as a current-excitation type light-emitting element.

In this example, one pixel includes two n-channel transistors. Note that the metal oxide film of one embodiment of the present invention can be used for channel formation regions of the n-channel transistors. Further, digital time grayscale driving can be employed for the pixel circuit.

The configuration of the applicable pixel circuit and operation of a pixel employing digital time grayscale driving will be described.

A pixel 3320 includes a switching transistor 3321, a driver transistor 3322, a light-emitting element 3324, and a capacitor 3323. A gate electrode layer of the switching transistor 3321 is connected to a scan line 3326, a first electrode (one of a source electrode layer and a drain electrode layer) of the switching transistor 3321 is connected to a signal line 3325, and a second electrode (the other of the source electrode layer and the drain electrode layer) of the switching transistor 3321 is connected to a gate electrode layer of the driving transistor 3322. The gate electrode layer of the driver transistor 3322 is connected to a power supply line 3327 through the capacitor 3323, a first electrode of the driver transistor 3322 is connected to the power supply line 3327, and a second electrode of the driver transistor 3322 is connected to a first electrode (a pixel electrode) of the light-emitting element 3324. A second electrode of the light-emitting element 3324 corresponds to a common electrode 3328. The common electrode 3328 is electrically connected to a common potential line formed over the same substrate as the common electrode 3328.

As the switching transistor 3321 and the driving transistor 3322, any of the transistors described in the above embodiments can be used as appropriate. In this manner, a highly reliable organic EL display panel can be provided.

The potential of the second electrode (the common electrode 3328) of the light-emitting element 3324 is set to be a low power supply potential. Note that the low power supply potential is lower than a high power supply potential supplied to the power supply line 3327. For example, the low power supply potential can be GND, 0V, or the like. The high power supply potential and the low power supply potential are set to be higher than or equal to the forward threshold voltage of the light-emitting element 3324, and the difference between the potentials is applied to the light-emitting element 3324, whereby current is supplied to the light-emitting element 3324, leading to light emission. The forward voltage of the light-emitting element 3324 indicates a voltage at which a desired luminance is obtained, and includes at least a forward threshold voltage.

Note that gate capacitance of the driver transistor 3322 may be used as a substitute for the capacitor 3323, so that the capacitor 3323 can be omitted. The gate capacitance of the driver transistor 3322 may be formed between the channel formation region and the gate electrode layer.

Next, a signal input to the driving transistor 3322 is described. In the case of a voltage-input voltage driving method, a video signal for sufficiently turning on or off the driver transistor 3322 is input to the driver transistor 3322. In order for the driver transistor 3322 to operate in a linear region, voltage higher than the voltage of the power supply line 3327 is applied to the gate electrode layer of the driver transistor 3322. Note that voltage higher than or equal to voltage which is the sum of power supply line voltage and the threshold voltage $V_{th}$ of the driver transistor 3322 is applied to the signal line 3325.

In the case of performing analog grayscale driving, a voltage greater than or equal to a voltage that is the sum of the forward voltage of the light-emitting element 3324 and the threshold voltage Vth of the driver transistor 3322 is applied to the gate electrode layer of the driver transistor 3322. A video signal by which the driver transistor 3322 is operated in a saturation region is input, so that current is supplied to the light-emitting element 3324. In order for the driver transistor 3322 to operate in a saturation region, the potential of the power supply line 3327 is set higher than the gate potential of the driver transistor 3322. Since the video signal is an analog signal, current in accordance with the video signal flows in the light-emitting element 3324, and the analog grayscale method can be performed.

Note that the configuration of the pixel circuit of the present invention is not limited to that shown in FIG. 33C. For example, a switch, a resistor, a capacitor, a sensor, a transistor, a logic circuit, or the like may be added to the pixel circuit illustrated in FIG. 33C.

In the case where the transistor shown in the above embodiments is used for the circuit shown in FIGS. 33A to 33C, the source electrode (the first electrode) is electrically connected to the low potential side and the drain electrode (the second electrode) is electrically connected to the high potential side. Furthermore, the potential of the first gate electrode may be controlled by a control circuit or the like and the potential described above as an example, e.g., a potential lower than the potential applied to the source electrode, may be input to the second gate electrode through a wiring that is not illustrated.

At least part of this embodiment can be implemented in combination with any of the embodiments described in this specification as appropriate.

Embodiment 13

The semiconductor device of one embodiment of the present invention can be used for display devices, personal computers, image reproducing devices provided with recording media (typically, devices which reproduce the content of recording media such as digital versatile discs (DVDs) and have displays for displaying the reproduced images), or the like. Other examples of electronic devices that can be equipped with the semiconductor device of one embodiment of the present invention are mobile phones, game machines including portable game consoles, portable data terminals, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. FIGS. 34A to 34F illustrate specific examples of these electronic devices.

Figure 34A:
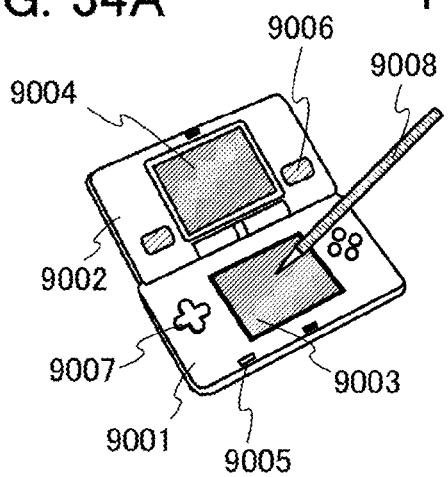
FIGS. 34A to 34F each illustrate an electronic device of an embodiment.

FIG. 34A illustrates a portable game console including a housing 9001, a housing 9002, a display portion 9003, a display portion 9004, a microphone 9005, a speaker 9006, an operation key 9007, a stylus 9008, and the like. Although the portable game console in FIG. 34A has the two display portions 9003 and 9004, the number of display portions included in a portable game machine is not limited to this.

Figure 34B:
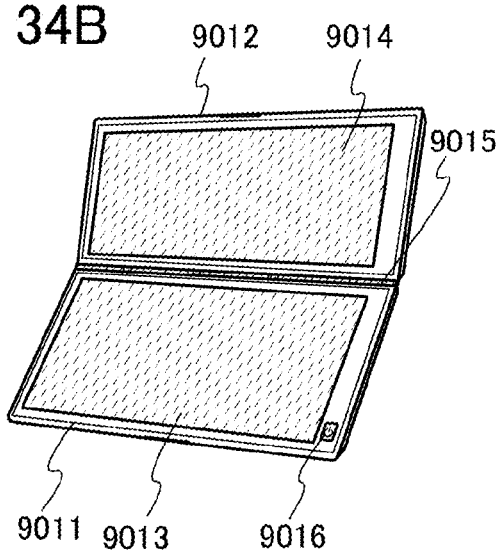

FIG. 34B illustrates a portable data terminal including a first housing 9011, a second housing 9012, a first display portion 9013, a second display portion 9014, a joint 9015, an operation key 9016, and the like. The first display portion 9013 is provided in the first housing 9011, and the second display portion 9014 is provided in the second housing 9012. The first housing 9011 and the second housing 9012 are connected to each other with the joint 9015, and the angle between the first housing 9011 and the second housing 9012 can be changed with the joint 9015. An image on the first display portion 9013 may be switched depending on the angle at the joint 9015 between the first housing 9011 and the second housing 9012. A display device with a position input function may be used as at least one of the first display portion 9013 and the second display portion 9014. Note that the position input function can be added by provision of a touch panel in a display device. Alternatively, the position input function can be added by provision of a photoelectric conversion element called a photosensor in a pixel portion of a display device.

Figure 34C:
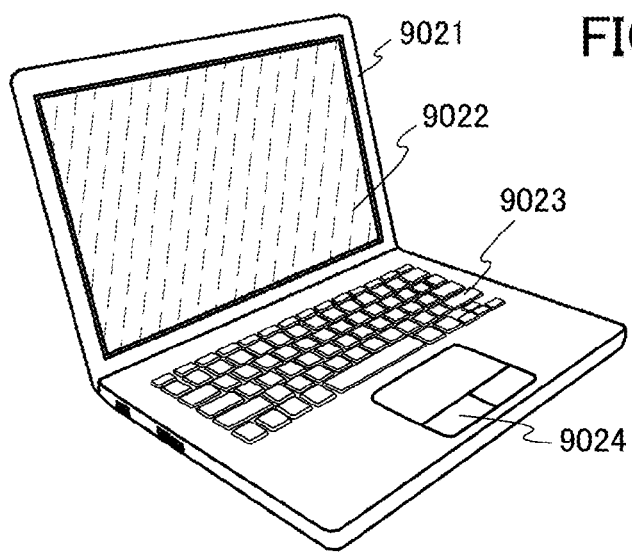

FIG. 34C illustrates a laptop personal computer, which includes a housing 9021, a display portion 9022, a keyboard 9023, a pointing device 9024, and the like.

Figure 34D:
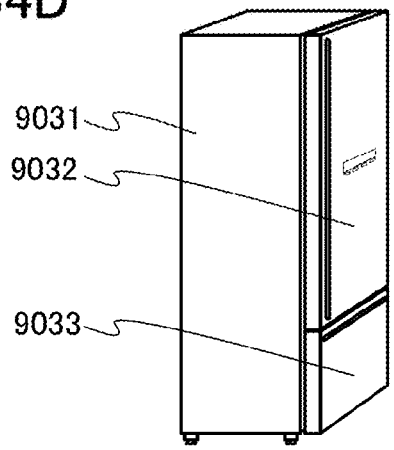

FIG. 34D illustrates an electric refrigerator-freezer including a housing 9031, a refrigerator door 9032, a freezer door 9033, and the like.

Figure 34E:
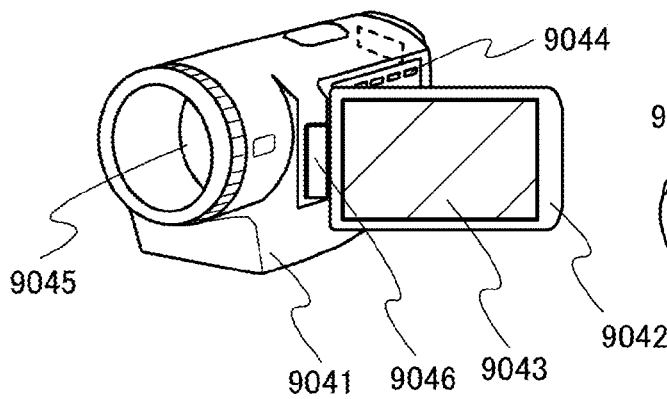

FIG. 34E illustrates a video camera including a first housing 9041, a second housing 9042, a display portion 9043, operation keys 9044, a lens 9045, a joint 9046, and the like. The operation keys 9044 and the lens 9045 are provided for the first housing 9041, and the display portion 9043 is provided for the second housing 9042. The first housing 9041 and the second housing 9042 are connected to each other with the joint 9046, and the angle between the first housing 9041 and the second housing 9042 can be changed with the joint 9046. Images displayed on the display portion 9043 may be switched in accordance with the angle at the joint 9046 between the first housing 9041 and the second housing 9042.

Figure 34F:
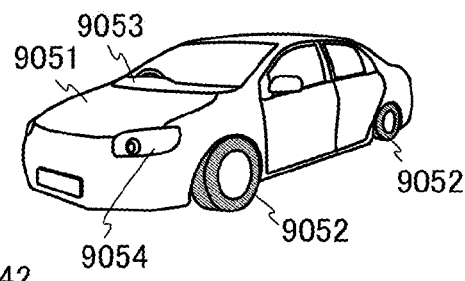

FIG. 34F illustrates an ordinary vehicle including a car body 9051, wheels 9052, a dashboard 9053, lights 9054, and the like.

At least part of this embodiment can be implemented in combination with any of the embodiments described in this specification as appropriate.

Note that a content (or may be part of the content) described in one embodiment may be applied to, combined with, or replaced by a different content (or may be part of the different content) described in the embodiment and/or a content (or may be part of the content) described in one or a plurality of different embodiments.

Note that in each embodiment, a content described in the embodiment is a content described with reference to a variety of diagrams or a content described with a text described in this specification.

Note that by combining a diagram (or may be part of the diagram) illustrated in one embodiment with another part of the diagram, a different diagram (or may be part of the different diagram) illustrated in the embodiment, and/or a diagram (or may be part of the diagram) illustrated in one or a plurality of different embodiments, much more diagrams can be formed.

Note that contents that are not specified in any drawing or text in the specification can be excluded from one embodiment of the invention. Alternatively, when the range of a value that is defined by the maximum and minimum values is described, part of the range is appropriately narrowed or part of the range is removed, whereby one embodiment of the invention excluding part of the range can be constituted. In this manner, it is possible to specify the technical scope of one embodiment of the present invention so that a conventional technology is excluded, for example.

As a specific example, a diagram of a circuit including a first transistor to a fifth transistor is illustrated. In that case, it can be specified that the circuit does not include a sixth transistor in the invention. It can be specified that the circuit does not include a capacitor in the invention. It can be specified that the circuit does not include a sixth transistor with a particular connection structure in the invention. It can be specified that the circuit does not include a capacitor with a particular connection structure in the invention. For example, it can be specified that a sixth transistor whose gate is connected to a gate of the third transistor is not included in the invention. For example, it can be specified that a capacitor whose first electrode is connected to the gate of the third transistor is not included in the invention.

As another specific example, the description of a value, "a voltage is preferably higher than or equal to 3 V and lower than or equal to 10 V" is given. In that case, for example, it can be specified that the case where the voltage is higher than or equal to −2 V and lower than or equal to 1 V is excluded from one embodiment of the invention. For example, it can be specified that the case where the voltage is higher than or equal to 13 V is excluded from one embodiment of the invention. Note that, for example, it can be specified that the voltage is higher than or equal to 5 V and lower than or equal to 8 V in the invention. For example, it can be specified that the voltage is approximately 9 V in the invention. For example, it can be specified that the voltage is higher than or equal to 3 V and lower than or equal to 10 V but is not 9 V in the invention. Note that even when the description "a value is preferably in a certain range" or "a value preferably satisfies a certain condition" is given, the value is not limited to the description. In other words, a description of a value that includes a term "preferable", "preferably", or the like does not necessarily limit the value.

As another specific example, the description "a voltage is preferably 10 V" is given. In that case, for example, it can be specified that the case where the voltage is higher than or equal to −2 V and lower than or equal to 1 V is excluded from one embodiment of the invention. For example, it can be specified that the case where the voltage is higher than or equal to 13 V is excluded from one embodiment of the invention.

As another specific example, the description "a film is an insulating film" is given to describe a property of a material. In that case, for example, it can be specified that the case where the insulating film is an organic insulating film is excluded from one embodiment of the invention. For example, it can be specified that the case where the insulating film is an inorganic insulating film is excluded from one embodiment of the invention. For example, it can be specified that the case where the insulating film is a conductive film is excluded from one embodiment of the invention. For example, it can be specified that the case where the insulating film is a semiconductor film is excluded from one embodiment of the invention.

As another specific example, the description of a stacked-layer structure, "a film is provided between an A film and a B film" is given. In that case, for example, it can be specified that the case where the film is a layered film of four or more layers is excluded from the invention. For example, it can be specified that the case where a conductive film is provided between the A film and the film is excluded from the invention.

Note that various people can implement one embodiment of the invention described in this specification and the like. However, different people may be involved in the implementation of the embodiment of the invention. For example, in the case of a transmission/reception system, the following case is possible: Company A manufactures and sells transmitting devices, and Company B manufactures and sells receiving devices. As another example, in the case of a light-emitting device including a transistor and a light-emitting element, the following case is possible: Company A manufactures and sells semiconductor devices including transistors, and Company B purchases the semiconductor devices, provides light-emitting elements for the semiconductor devices, and completes light-emitting devices.

In such a case, one embodiment of the invention can be constituted so that a patent infringement can be claimed against each of Company A and Company B. In other words, one embodiment of the invention can be constituted so that only Company A implements the embodiment, and another embodiment of the invention can be constituted so that only Company B implements the embodiment. One embodiment of the invention with which a patent infringement suit can be filed against Company A or Company B is clear and can be regarded as being disclosed in this specification or the like. For example, in the case of a transmission/reception system, even when this specification or the like does not include a description of the case where a transmitting device is used alone or the case where a receiving device is used alone, one embodiment of the invention can be constituted by only the transmitting device and another embodiment of the invention can be constituted by only the receiving device. Those embodiments of the invention are clear and can be regarded as being disclosed in this specification or the like. Another example is as follows: in the case of a light-emitting device including a transistor and a light-emitting element, even when this specification or the like does not include a description of the case where a semiconductor device including the transistor is used alone or the case where a light-emitting device including the light-emitting element is used alone, one embodiment of the invention can be constituted by only the semiconductor device including the transistor and another embodiment of the invention can be constituted by only the light-emitting device including the light-emitting element. Those embodiments of the invention are clear and can be regarded as being disclosed in this specification or the like.

Note that in this specification and the like, it may be possible for those skilled in the art to constitute one embodiment of the invention even when portions to which all the terminals of an active element (e.g., a transistor or a diode), a passive element (e.g., a capacitor or a resistor), and the like are connected are not specified. In other words, one embodiment of the invention is clear even when connection portions are not specified. Further, in the case where a connection portion is disclosed in this specification and the like, it can be determined that one embodiment of the invention in which a connection portion is not specified is disclosed in this specification and the like, in some cases. In particular, in the case where the number of portions to which the terminal is connected may be more than one, it is not necessary to specify the portions to which the terminal is connected. Therefore, it may be possible to constitute one embodiment of the invention by specifying only portions to which some of terminals of an active element (e.g., a transistor or a diode), a passive element (e.g., a capacitor or a resistor), and the like are connected.

Note that in this specification and the like, it may be possible for those skilled in the art to specify the invention when at least the connection portion of a circuit is specified. Alternatively, it may be possible for those skilled in the art to specify the invention when at least a function of a circuit is specified. In other words, when a function of a circuit is specified, one embodiment of the present invention is clear. Moreover, it can be determined that one embodiment of the present invention whose function is specified is disclosed in this specification and the like. Therefore, when a connection portion of a circuit is specified, the circuit is disclosed as one embodiment of the invention even when a function is not specified, and one embodiment of the invention can be constituted. Alternatively, when a function of a circuit is specified, the circuit is disclosed as one embodiment of the invention even when a connection portion is not specified, and one embodiment of the invention can be constituted.

Note that in this specification and the like, part of a diagram or text described in one embodiment can be taken out to constitute one embodiment of the invention. Thus, in the case where a diagram or text related to a certain portion is described, the contents taken out from part of the diagram or the text are also disclosed as one embodiment of the invention, and one embodiment of the invention can be constituted. The embodiment of the present invention is clear. Therefore, for example, in a diagram or text in which one or more active elements (e.g., transistors or diodes), wirings, passive elements (e.g., capacitors or resistors), conductive layers, insulating layers, semiconductor layers, organic materials, inorganic materials, components, devices, operating methods, manufacturing methods, or the like are described, part of the diagram or the text is taken out, and one embodiment of the invention can be constituted. For example, from a circuit diagram in which N circuit elements (e.g., transistors or capacitors; N is an integer) are provided, it is possible to take out M circuit elements (e.g., transistors or capacitors; M is an integer, where M<N) and constitute one embodiment of the invention. For another example, it is possible to take out M layers (M is an integer, where M<N) from a cross-sectional view in which N layers (N is an integer) are provided and constitute one embodiment of the invention. For another example, it is possible to take out M elements (M is an integer, where M<N) from a flow chart in which N elements (N is an integer) are provided and constitute one embodiment of the invention. For another example, it is possible to take out some given elements from a sentence "A includes B, C, D, E, or F" and constitute one embodiment of the invention, for example, "A includes B and E", "A includes E and F", "A includes C, E, and F", or "A includes B, C, D, and E".

Note that in the case where at least one specific example is described in a diagram or text described in one embodiment in this specification and the like, it will be readily appreciated by those skilled in the art that a broader concept of the specific example can be derived. Therefore, in the diagram or the text described in one embodiment, in the case where at least one specific example is described, a broader concept of the specific example is disclosed as one embodiment of the invention, and one embodiment of the invention can be constituted. The embodiment of the present invention is clear.

Note that in this specification and the like, what is illustrated in at least a diagram (which may be part of the diagram) is disclosed as one embodiment of the invention, and one embodiment of the invention can be constituted. Therefore, when certain contents are described in a diagram, the contents are disclosed as one embodiment of the invention even when the contents are not described with text, and one embodiment of the invention can be constituted. In a similar manner, part of a diagram, which is taken out from the diagram, is disclosed as one embodiment of the invention, and one embodiment of the invention can be constituted. The embodiment of the present invention is clear.

This application is based on Japanese Patent Application serial no. 2014-054763 filed with Japan Patent Office on Mar. 18, 2014, the entire contents of which are hereby incorporated by reference.

What is claimed is:

1. A semiconductor device comprising:
an insulator including a projection;
an island-shaped semiconductor over the insulator including the projection;
a first electrode and a second electrode;
a first insulator;
a second insulator; and
a third electrode,
wherein the first electrode and the second electrode are on and in contact with the island-shaped semiconductor,
wherein the first insulator is over the island-shaped semiconductor, the first electrode, and the second electrode,
wherein the first insulator comprises an opening or a groove overlapping with the island-shaped semiconductor,
wherein the second insulator covers an inner wall of the opening or the groove, and an exposed portion of the island-shaped semiconductor,
wherein a cross-section view of the semiconductor device taken along a direction defined by a straight line joining the first and the second electrodes shows that the third electrode overlaps with and fills the opening or the groove, the second insulator being interposed between the third electrode and each of the island-shaped semiconductor, the first electrode, and the second electrode,
wherein the first insulator covers and faces both of a side surface and a top surface of a peripheral edge of the first electrode,
wherein the island-shaped semiconductor is in contact with the projection,
wherein the first insulator is in contact with a side surface of the projection,
wherein an entire bottom surface of the island-shaped semiconductor overlaps a top surface of the projection, and
wherein the side surface of the projection and a side surface of the island-shaped semiconductor are aligned.

2. The semiconductor device according to claim 1, wherein the island-shaped semiconductor is an oxide semiconductor.

3. The semiconductor device according to claim 1, wherein the second insulator covers a top surface region of the first insulator.

4. The semiconductor device according to claim 1, wherein a top surface of the third electrode is planarized.

5. The semiconductor device according to claim 1, wherein the first insulator is on and in direct contact with the first electrode.

6. A method for manufacturing a semiconductor device, the method comprising:
forming a patterned semiconductor over an insulator including a projection;
forming a first electrode and a second electrode on and in contact with the patterned semiconductor;
forming a first insulator over the patterned semiconductor, the first electrode, and the second electrode;
forming an opening or a groove in the first insulator, the opening or the groove overlapping with the patterned semiconductor;
forming a second insulator covering an inner wall of the opening or the groove and an exposed portion of the patterned semiconductor; and
forming a third electrode in the opening or the groove, the second insulator being interposed between the third electrode and each of the patterned semiconductor, the first electrode, and the second electrode, and
a cross-section view of the semiconductor device taken along a direction defined by a straight line joining the first and the second electrodes shows that the third electrode overlaps with the opening or the groove,
wherein the first insulator covers and faces both of a side surface and a top surface of a peripheral edge of the first electrode,
wherein the patterned semiconductor is in contact with the projection,
wherein the first insulator is in contact with a side surface of the projection,
wherein an entire bottom surface of the patterned semiconductor overlaps a top surface of the projection, and
wherein the side surface of the projection and a side surface of the patterned semiconductor are aligned.

7. The method for manufacturing a semiconductor device according to claim 6, the method comprising:
a first step of forming a semiconductor;
a second step of performing a first process on the semiconductor so as to form the patterned semiconductor, the patterned semiconductor being an island-shaped semiconductor;
a third step of forming a first conductor over the island-shaped semiconductor;
a fourth step of performing a second process on the first conductor so as to form a conductor having a first pattern;
a fifth step of forming the first insulator over the conductor having the first pattern;
a sixth step of forming the opening or the groove in the first insulator;
a seventh step of performing a third process on the conductor having the first pattern in the opening or the groove so as to form the first electrode and the second electrode and to expose the island-shaped semiconductor;

an eighth step of forming the second insulator over the first insulator, the inner wall of the opening or the groove, and the exposed portion of the island-shaped semiconductor;
a ninth step of forming a second conductor over the second insulator; and
a tenth step of performing a fourth process on the second conductor so as to form the third electrode.

8. The method for manufacturing a semiconductor device according to claim 6, the method comprising:
a first step of forming a semiconductor;
a second step of performing a first process on the semiconductor so as to form the patterned semiconductor, the patterned semiconductor being an island-shaped semiconductor;
a third step of forming a first conductor over the island-shaped semiconductor;
a fourth step of forming the first insulator over the first conductor;
a fifth step of performing a second process on the first insulator so that the first insulator has a desired pattern, and performing a third process on the first conductor so as to form the first electrode and the second electrode and to expose the island-shaped semiconductor;
a sixth step of forming the second insulator over the first insulator, the inner wall of the opening or the groove, and the exposed portion of the island-shaped semiconductor;
a seventh step of forming a second conductor over the second insulator; and
an eighth step of performing a fourth process on the second conductor so as to form the third electrode,
wherein the opening or the groove is formed by the second process and the third process.

9. The method for manufacturing a semiconductor device according to claim 6, the method comprising:
a first step of forming a semiconductor;
a second step of forming a first conductor on and in contact with the semiconductor;
a third step of performing a first process on the semiconductor and the first conductor so as to form a semiconductor and a conductor each having a first pattern, whereby the patterned semiconductor is formed;
a fourth step of forming the first insulator over the semiconductor and the conductor each having the first pattern;
a fifth step of forming the opening or the groove in the first insulator;
a sixth step of performing a second process on the conductor having the first pattern in the opening or the groove so as to form the first electrode and the second electrode and to expose a portion of the patterned semiconductor;
a seventh step of forming the second insulator over the first insulator, the inner wall of the opening or the groove, and the exposed portion of the patterned semiconductor;
an eighth step of forming a second conductor over the second insulator; and
a ninth step of performing a third process on the second conductor so as to form the third electrode.

10. The method for manufacturing a semiconductor device according to claim 6, the method comprising:
a first step of forming a semiconductor;
a second step of forming a first conductor on and in contact with the semiconductor;
a third step of forming the first insulator over the first conductor;
a fourth step of performing a first process on the first insulator, on the first conductor, and on the semiconductor so that the first insulator, the first conductor, and the semiconductor have a desired pattern, whereby forming the patterned semiconductor;
a fifth step of performing a second process on the first insulator and on the first conductor so as to form the first electrode and the second electrode and to expose a portion of the patterned semiconductor;
a sixth step of forming the second insulator over the first insulator, the inner wall of the opening or the groove, and the exposed portion of the patterned semiconductor;
a seventh step of forming a second conductor over the second insulator; and
an eighth step of performing a third process on the second conductor so as to form the third electrode,
wherein the opening or the groove is formed by the second process.

11. The method for manufacturing a semiconductor device according to claim 6, wherein the first insulator is an insulator having planarity.

12. The method for manufacturing a semiconductor device according to claim 6, wherein the first insulator includes a low-dielectric constant material.

13. The method for manufacturing a semiconductor device according to claim 7, wherein the second conductor is processed using CMP treatment.

14. The method for manufacturing a semiconductor device according to claim 8, wherein the second conductor is processed using CMP treatment.

15. The method for manufacturing a semiconductor device according to claim 9, wherein the second conductor is processed using CMP treatment.

16. The method for manufacturing a semiconductor device according to claim 6, wherein the patterned semiconductor is an oxide semiconductor.

17. The method for manufacturing a semiconductor device according to claim 6, wherein the second insulator covers a top surface region of the first insulator.

18. The method for manufacturing a semiconductor device according to claim 6, wherein a top surface of the third electrode is planarized.

19. The method for manufacturing a semiconductor device according to claim 6, wherein the first insulator is formed on and in direct contact with the patterned semiconductor, the first electrode, and the second electrode.

20. A semiconductor device comprising:
an insulator including a projection;
an island-shaped semiconductor over the insulator including the projection;
a first electrode and a second electrode;
a first insulator;
a second insulator; and
a third electrode,
wherein the first electrode and the second electrode are on and in contact with the island-shaped semiconductor,
wherein the first insulator is over the island-shaped semiconductor, the first electrode, and the second electrode,
wherein the first insulator comprises an opening or a groove overlapping with the island-shaped semiconductor,
wherein the second insulator is over the first insulator, an inner wall of the opening or the groove, and an exposed portion of the island-shaped semiconductor, wherein a cross-section view of the semiconductor device taken along a direction defined by a straight line joining the first and the second electrodes shows that the third electrode overlaps with and fills the opening or the groove, the second insulator being interposed between the third electrode and each of the island-shaped semiconductor, the first electrode, and the second electrode, wherein the first insulator covers and faces both of a side surface and a top surface of a peripheral edge of the first electrode, wherein the island-shaped semiconductor is in contact with the projection, wherein the first insulator is in contact with a side surface of the projection, wherein an entire bottom surface of the island-shaped semiconductor overlaps a top surface of the projection, wherein the side surface of the projection and a side surface of the island-shaped semiconductor are aligned, and wherein the side surface of the island-shaped semiconductor and the side surface of the peripheral edge of the first electrode are aligned.

21. The semiconductor device according to claim 20, wherein a top surface of the first insulator is at a constant height.

22. The semiconductor device according to claim 20, wherein the island-shaped semiconductor is an oxide semiconductor.

23. The semiconductor device according to claim 20, wherein the second insulator covers a top surface region of the first insulator.

24. The semiconductor device according to claim 20, wherein a top surface of the third electrode is planarized.

25. The semiconductor device according to claim 20, wherein the first insulator is on and in direct contact with the first electrode.

26. A method for manufacturing a semiconductor device, the method comprising:
    a first step of forming a semiconductor over an insulator including a projection;
    a second step of forming a first conductor on and in contact with the semiconductor;
    a third step of performing a first process on the semiconductor and the first conductor so as to form a semiconductor and a conductor each having a first pattern, whereby a patterned semiconductor is formed;
    a fourth step of forming a first insulator over the semiconductor and the conductor each having the first pattern, the first insulator having planarity;
    a fifth step of forming an opening or a groove in the first insulator;
    a sixth step of performing a second process on the conductor having the first pattern in the opening or the groove so as to form a first electrode and a second electrode and to expose a portion of the patterned semiconductor;
    a seventh step of forming a second insulator covering an inner wall of the opening or the groove, and the exposed portion of the patterned semiconductor;
    an eighth step of forming a second conductor over the second insulator; and
    a ninth step of performing a third process on the second conductor so as to form a third electrode, the third process being a chemical mechanical polishing process, wherein a cross-section view of the semiconductor device taken along a direction defined by a straight line joining the first and the second electrodes shows that the third electrode overlaps with the opening or the groove, and wherein the first insulator covers and faces both of a side surface and a top surface of a peripheral edge of the first electrode, wherein the patterned semiconductor is in contact with the projection, wherein the first insulator is in contact with a side surface of the projection, wherein an entire bottom surface of the patterned semiconductor overlaps a top surface of the projection, and wherein the side surface of the projection and a side surface of the patterned semiconductor are aligned.

27. The method for manufacturing a semiconductor device according to claim 26, wherein the patterned semiconductor is an oxide semiconductor.

28. The method for manufacturing a semiconductor device according to claim 26, wherein the second insulator covers a top surface region of the first insulator.

29. The method for manufacturing a semiconductor device according to claim 26, wherein a top surface of the third electrode is planarized.

30. The method for manufacturing a semiconductor device according to claim 26, wherein the first insulator is formed on and in direct contact with the semiconductor and the conductor.

* * * * *